United States Patent
Huang et al.

(10) Patent No.: US 11,920,042 B2
(45) Date of Patent: Mar. 5, 2024

(54) BILATERAL AMINES FOR DEFECT PASSIVATION AND SURFACE PROTECTION IN PEROVSKITE SOLAR CELLS

(71) Applicant: THE UNIVERSITY OF NORTH CAROLINA AT CHAPEL HILL, Chapel Hill, NC (US)

(72) Inventors: Jinsong Huang, Chapel Hill, NC (US); Guang Yang, Chapel Hill, NC (US); Wuqiang Wu, Chapel Hill, NC (US)

(73) Assignee: THE UNIVERSITY OF NORTH CAROLINA AT CHAPEL HILL, Chapel Hill, NC (US)

( * ) Notice: Subject to any disclaimer, the term of this patent is extended or adjusted under 35 U.S.C. 154(b) by 401 days.

(21) Appl. No.: 17/422,842

(22) PCT Filed: Jan. 14, 2020

(86) PCT No.: PCT/US2020/013563
§ 371 (c)(1),
(2) Date: Jul. 14, 2021

(87) PCT Pub. No.: WO2020/209916
PCT Pub. Date: Oct. 15, 2020

(65) Prior Publication Data
US 2022/0025195 A1   Jan. 27, 2022

Related U.S. Application Data

(60) Provisional application No. 62/792,157, filed on Jan. 14, 2019.

(51) Int. Cl.
C09D 11/033   (2014.01)
C03C 17/34   (2006.01)
(Continued)

(52) U.S. Cl.
CPC ........ *C09D 11/033* (2013.01); *C03C 17/3447* (2013.01); *C03C 17/42* (2013.01); *H10K 30/88* (2023.02)

(58) Field of Classification Search
CPC ..... C09D 11/033; C09D 11/03; C09D 11/037; C03C 17/3447; C03C 17/42; H10K 30/88;
(Continued)

(56) References Cited

U.S. PATENT DOCUMENTS 9,966,195 B1   5/2018   Bag et al.

FOREIGN PATENT DOCUMENTS

CN   106972101 A   7/2017
KR   10-1899428 B1   9/2018

OTHER PUBLICATIONS

Bai, Y. et al., "Enhancing stability and efficiency of perovskite solar cells with crosslinkable silane-functionalized and doped fullerene," Nature Commununications, 7:12806, (2016).
(Continued)

*Primary Examiner* — Mark Kopec
*Assistant Examiner* — Jaison P Thomas
(74) *Attorney, Agent, or Firm* — Alston & Bird LLP

(57) ABSTRACT

Described herein is an ink solution, comprising: i. a composition having the formula $ABX_3$; ii. a compound having the formula $NH_2$—$R_1$—$NH_2$; and iii. a solvent. Methods for producing polycrystalline perovskite films using the ink solutions described herein in a fast blading process and the use of the films in photoactive and photovoltaic applications are additionally described.

27 Claims, 33 Drawing Sheets

(51) Int. Cl.
    C03C 17/42    (2006.01)
    H10K 30/88    (2023.01)
(58) Field of Classification Search
    CPC .... H10K 30/211; H10K 85/50; Y02E 10/549;
                                H01L 31/032; H01L 31/18
    See application file for complete search history.

(56) References Cited

OTHER PUBLICATIONS

Baikie, T. et al., "Synthesis and crystal chemistry of the hybrid perovskite (CH3NH3)PbI3 for solid-state sensitised solar cell applications," J. Mater. Chem., A1:5628-5641, (2013).
Bernechea, M. et al., "Solution-processed, solid-state solar cells based on environmentally friendly AgBiS2 nanocrystals," 1-22, (2016).
Bi, D. et al., "High-Performance Perovskite Solar Cells with Enhanced Environmental Stability Based on Amphiphile-Modified CH3NH3PbI3," Adv. Mater., 28:2910-21915, (2016).
Bi, D. et al., "Polymer-templated nucleation and crystal growth of perovskite films for solar cells with efficiency greater than 21%," Nature Energy, 1:16142, (2016).
Cao, Y. et al., "Direct contact of selective charge extraction layers enables high-efficiency molecular photovoltaics," Joule, 2:1108-1117, (2018).
Chen, H. et al., "A solvent- and vacuum-free route to large-area perovskite films for efficient solar modules," Nature, 550:92-95, (2017).
Christians, J. et al., "Tailored interfaces of unencapsulated perovskite solar cells for >1,000 hour operational stability," Nature Energy, 3:68-74, (2018).
Curtis, N., "Macrocyclic coordination compounds formed by condensation of metal-amine complexes with aliphatic carbonyl compounds," Coord. Chem. Rev., 3:3-47, (1968).
Deng, Y. et al., "Scalable fabrication of efficient organolead trihalide perovskite solar cells with doctor-bladed active layers," Energy & Environ. Sci., 8:1544-1550, (2015).
Deng, Y. et al., "Surfactant-controlled ink drying enables high-speed deposition of perovskite films for efficient photovoltaic modules," Nature Energy, 3:560-566, (2018).
Fei, C.B. et al., "Highly efficient and stable perovskite solar cells based on monolithically grained CH3NH3PbI3 Film," Adv. Energy Mater., 7:1602017, (2017).
Freitag, M. et al., "Dye-sensitized solar cells for efficient power generation under ambient lighting," Nat. Photonics, 11:372, (2017).
Green, M.A., et al., "Solar cell efficiency tables (version 50)," Progress in Photovoltaics: Research and Applications, 25:668-676, (2017).
Hou, Y. et al., "A generic interface to reduce the efficiency-stability-cost gap of perovskite solar cells," Science, 358:1192-1197, (2017).
Huang, F.Z. et al., "Effect of the microstructure of the functional layers on the efficiency of perovskite solar cells," Adv. Mater., 29:1601715, (2017).
Jiang, H. et al., "Bifunctional hydroxylamine hydrochloride incorporated perovskite films for efficient and stable planar perovskite solar cells," ACS Appl. Energy Mater., 1:900-909, (2018).
Kim, J.H. et al., "An Aromatic Diamine Molecule as the A-Site Solute for Highly Durable and Efficient Perovskite Solar Cells," Small Methods, 1800361:1-6, (2018).
Leijtens, T. et al., "Stability of metal halide perovskite solar cells," Adv. Energy Mater, 5:1500963, (2015).
Li, X. et al., "Improved performance and stability of perovskite solar cells by crystal crosslinking with alkylphosphonic acid ω-ammonium chlorides," Nature Chemistry, 7:703, (2015).
Li, Z. et al., "Scalable fabrication of perovskite solar cells," Nat Rev. Mater, 3:18017, (2018).
Liang, P.W. et al., "Additive enhanced crystallization of solution-processed perovskite for highly efficient planar-heterojunction solar cells," Adv. Mater., 26:3748-3754, (2014).
Liu, T. et al., "Stable Formamidinium-Based Perovskite Solar Cells via In Situ Grain Encapsulation," Adv. Energy Mat., 8:1800232, (2018).
Liu, X. et al., "Exploring Inorganic Binary Alkaline Halide to Passivate Defects in Low-Temperature-Processed Planar-Structure Hybrid Perovskite Solar Cells," Adv. Energy Mater., 8:1800138, (2018).
Lu, J.F. et al., "Diammonium and monoammonium mixed-organic-cation perovskites for high performance solar cells with improved stability," Adv. Energy Mater., 7:1700444, (2017).
Mayer et al., "Current and future cost of photovoltaics. Long-term scenarios for market development, system prices and LCOE of utility-scale PV systems," Fraunhofer ISE, 1-82, (2015).
Quan, L.N. et al., "Ligand-stabilized reduced-dimensionality perovskites," J. Am. Chem. Soc., 138:2649-2655, (2016).
Rolston, N. et al., "Mechanical integrity of solution-processed perovskite solar cells," Extreme Mechanics Letters, 9:353-358, (2016).
Rong, Y. et al., "Challenges for commercializing perovskite solar cells," Science, 361:eaat8235, (2018).
Rothmann, M.U. et al., "Structural and Chemical Changes to CH3NH3PbI3 Induced by Electron and Gallium Ion Beams," Adv. Mater., 1800629, (2018).
Schmela et al., "Global Market Outlook for Solar Power 2018-2022," SolarPower Europe, 81 pages, (2018). [Retrieved from the Internet Dec. 29, 2020: <URL: https://www.solarpowereurope.org/wp-content/uploads/2018/09/Global-Market-Outlook-2018-2022.pdf>].
Seo, J.Y. et al., "Ionic liquid control crystal growth to enhance planar perovskite solar cells efficiency," Adv. Energy Mater., 6:1600767, (2016).
Shao, Y. et al., "Origin and elimination of photocurrent hysteresis by fullerene passivation in CH3NH3PBI3 planar heterojunction solar cells," Nature Commununications, 5:5784, (2014).
Singh, T. et al., "Stabilizing the efficiency beyond 20% with a mixed cation perovskite solar cell fabricated in ambient air under controlled humidity," Adv. Energy Mater., 8:1700677, (2018).
Stolterfoht, M. et al., "Approaching the fill factor Shockley Queiser limit in stable, dopant-free triple cation perovskite solar cells," Energy & Environmental Science, 10:1530-1539, (2017).
Suksrichavalit, T. et al., "Copper complexes of pyridine derivatives with superoxide scavenging and antimicrobial activities," Eur. J. Med. Chem., 44:3259-3264, (2009).
Tan, H. et al., "Efficient and stable solution-processed planar perovskite solar cells via contact passivation," Science, 355:722-726, (2017).
Tang, S. et al., "Composition engineering in doctor-blading of perovskite solar cells," Adv. Energy Mater., 7:1700302, (2017).
Wang, F. et al., "Phenylalkylamine Passivation of Organolead Halide Perovskites Enabling High-Efficiency and Air-Stable Photovoltaic Cells," Adv. Mater., 28:9986-9992, (2016).
Wang, Q. et al., "Thin Insulating Tunneling Contacts for Efficient and Water-Resistant Perovskite Solar Cells," Adv. Mater., 28:6734-6739, (2016).
Wang, Z. et al., Efficient ambient-air-stable solar cells with 2D-3D heterostructured butylammonium-caesium-formamidinium lead halide perovskites, Nature Energy, 2:17135, (2017).
Wu, W.-Q. et al., "Molecular doping enabled scalable blading of efficient hole-transport-layer-free perovskite solar cells," Nature Commun., 9:1625, (2018).
Wu, W.-Q. et al., "Optimizing semiconductor thin films with smooth surfaces and well-interconnected networks for high-performance perovskite solar cells," J. Mater. Chem., A4:12463-12470, (2016).
Wu, W.-Q. et al., "Solvent-mediated intragranular-coarsening of CH3NH3PbI3 thin films toward high-performance perovskite photovoltaics," ACS Appl. Mater. Interfaces, 9:31959-31967, (2017).
Wu, W-Q. et al., "Bilateral alkylamine for suppressing charge recombination and improving stability in blade-coated perovskite solar cells," Science Advances, 5(3):1-9, (Mar. 8, 2019).
Wu, Y.Z. et al., "Thermally Stable MAPbI3 Perovskite Solar Cells with Efficiency of 19.19% and Area over 1 cm2 achieved by Additive Engineering," Adv. Mater., 29:1701073, (2017).

(56) References Cited

OTHER PUBLICATIONS

Yang, M. et al., "Perovskite ink with wide processing window for scalable high-efficiency solar cells," Nat. Energy, 2(17038):1-9, (2017).

Yang, W.S. et al., "Iodide management in formamidinium-lead-halide-based perovskite layers for efficient solar cells," Science, 356:1376-1379, (2017).

Yuan, Y. et al., "Anomalous photovoltaic effect in organic-inorganic hybrid perovskite solar cells," Science. Advances, 3:e1602164, (2017).

Zhang, T. et al., "Bication lead iodide 2D perovskite component to stabilize inorganic α-CsPbI3 perovskite phase for high-efficiency solar cells," Sci. Adv., 3:e1700841, (2017).

Zheng, X. et al., "Defect passivation in hybrid perovskite solar cells using quaternary ammonium halide anions and cations," Nature Energy, 2:17102, (2017).

Zong, Y. et al., "Continuous grain-boundary functionalization for high-efficiency perovskite solar cells with exceptional stability," Chem, 4:1404-1415, (2018).

Zuo, L. et al., "Polymer-modified halide perovskite films for efficient and stable planar heterojunction solar cells," Science Advances, 3:e1700106, (2017).

WIPO Application No. PCT/US2020/013563, PCT International Search Report dated Nov. 17, 2020.

WIPO Application No. PCT/US2020/013563, PCT Written Opinion of the International Searching Authority dated Nov. 17, 2020.

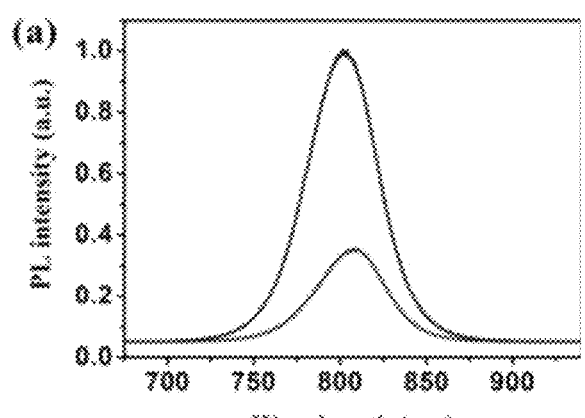 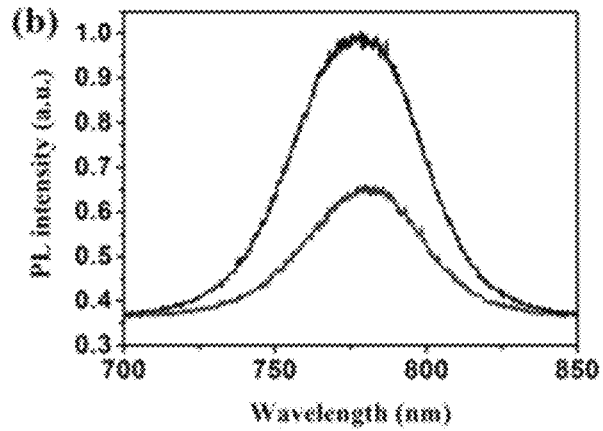
Fig. 17A  Fig. 17B
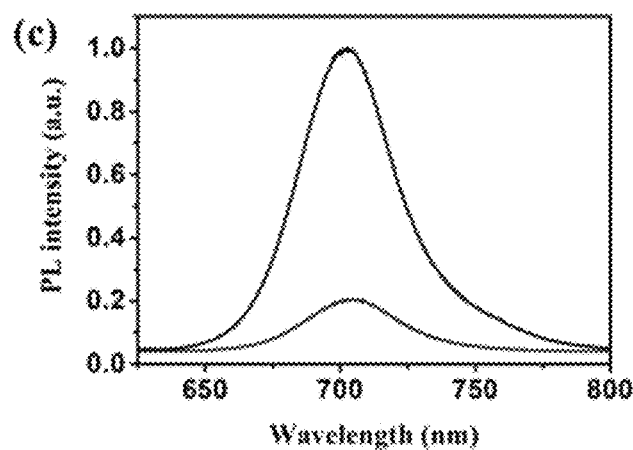
Fig. 17C (a)

(b)

BILATERAL AMINES FOR DEFECT PASSIVATION AND SURFACE PROTECTION IN PEROVSKITE SOLAR CELLS

CROSS-REFERENCE TO RELATED APPLICATIONS

This application is a 35 U.S.C. § 371 national stage of International Application No. PCT/US2020/013563, filed Jan. 14, 2020, which claims the benefit of priority to U.S. Provisional Application No. 62/792,157, filed Jan. 14, 2019, which are herein incorporated by reference in their entirety for all purposes.

GOVERNMENT INTEREST

This invention was made with government support under Grant Nos. N00014-17-1-2619 and N00014-17-1-2727 awarded by Office of Naval Research, Grant No. A9550-16-1-0299 awarded by the Air Force Office of Scientific Research, and Grant No. DE-EE0008749 awarded by The Department of Energy. The Government has certain rights in the invention.

FIELD OF THE INVENTION

The presently disclosed subject matter relates generally to perovskite ink solutions comprising a bilateral amine additive. The ink solutions can be used in the fabrication of polycrystalline films for use in photovoltaic and photoactive devices.

BACKGROUND

Perovskite solar cells have shown rapidly improved power conversion efficiency (PCE) and stability in recent years (Christians, J. A. et al. *Nature Energy* 3, 68 (2018); Hou, Y. et al. *Science* 358, 1192-1197 (2017); Tan, H. et al. *Science* 355, 722-726 (2017)). The certified PCEs for small devices already rival those of other thin film photovoltaic technologies (Green, M. A. et al. *Progress in Photovoltaics: Research and Applications* 25, 668-676 (2017)). However, one challenge before commercialization is transferring these technologies into the marketplace using high throughput film deposition techniques for module fabrication (Li, Z. et al. *Nature Reviews Materials* 3, 18017 (2018); Rong, Y. et al. *Science* 361, eaat8235 (2018); Chen, H. et al. *Nature* 550, 92 (2017)). A "high electrification" future in 2050 would demand an annual photovoltaics (PV) installation of 1780 GW, while the global installation in 2017 is only 99.1 GW (Mayer, J. N., et al. *Fraunhofer ISE*, 1-82 (2015); Schmela, M. SolarPower Europe (2018)). It requires a rapid expansion of PV manufacturing, which may be fulfilled by perovskite PV due to its low cost and rapid solution processing. One gigawatt of power needs over 6.7 million square meters of solar panels with 18% efficiency. These thin films of half a micrometer (μm) thick need to be deposited at a fast speed to be economically competitive. Therefore, fast and safe deposition of perovskite films is critically important. Deposition at ambient conditions is preferred, because it allows easy integration into mature industrial processes and reduces safety issues when flammable solvents are involved. However, from a material growth kinetics point of view, rapid crystallization at low temperature generally results in perovskite films with low crystallinity and high defect density, which reduce both the efficiency and stability of perovskite solar cells. Therefore, there exists a need in the art to reconcile the conflict between fast-deposition induced low crystallinity and the desire for well-passivated grains with high crystallinity for high efficiency and stability.

The subject matter described herein addresses this problem.

BRIEF SUMMARY

In one aspect, the presently disclosed subject matter is directed to an ink solution, comprising:
i. a composition of Formula (I)

$$ABX_3 \qquad (I)$$

wherein A is a cation selected from the group consisting of methylammonium (MA), tetramethylammonium (TMA), formamidinium (FA), cesium (Cs), rubidium (Rb), potassium (K), sodium (NA), butylammonium (BAH), phenethylammonium (PEA), phenylammonium (PHA), guanidinium (GU), and a combination thereof, B is at least one divalent metal; and
X is at least one halide;

ii. a compound of Formula (II)

$$NH_2-R_1-NH_2 \qquad (II)$$

wherein $R_1$ is selected from the group consisting of linear or branched $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, and graphene, wherein one or more carbon atoms in said $C_3$-$C_{50}$ alkyl or $C_1$-$C_{20}$ alkyl is optionally substituted with O, P, S, or NH;

wherein said $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, or graphene is optionally substituted with one or more substituents, each independently selected from the group consisting of hydroxy, halo, haloalkoxy, alkoxy, haloalkyl, hydroxyalkyl, oxo, cyano, nitro, thiol, carboxyl, sulfonyl, sulfinyl, thiocyanate, —S(O)OH, —S(O)$_2$OH, sulfonamido, —CH$_2$OP(O)(OH)$_2$, —OP(O)(OH)$_2$, —R$_2$R$_3$P(O)$_4$, and —NR$_4$R$_5$, wherein, R$_2$, R$_3$, R$_4$ and R$_5$ are each independently hydrogen or $C_1$-$C_6$ alkyl; and iii. a solvent.

In another aspect, the presently disclosed subject matter is directed to a method for producing a polycrystalline perovskite film using the ink solutions described herein.

In another aspect, the presently disclosed subject matter is directed to a polycrystalline perovskite film comprising a composition having the formula $ABX_3$ and a compound having the formula $NH_2$—$R_1$—$NH_2$.

In another aspect, the presently disclosed subject matter is directed to a solar cell, solar panel, light emitting diode, photodetector, x-ray detector, field effect transistor, memristor, or synapse comprising the polycrystalline perovskite films fabricated by the methods described herein.

BRIEF DESCRIPTION OF THE DRAWINGS

FIG. 17A shows steady PL measurement of perovskite films with different compositions. PL intensities of perovskite films deposited on glass substrates: 1.51 eV perovskite. Note: the bottom curve represents the pristine perovskite film and the top curve represents the perovskite film incorporated with DAP amine additive.

FIG. 17B shows steady PL measurement of perovskite films with different compositions. PL intensities of perovskite films deposited on glass substrates: 1.55 eV perovskite. Note: the bottom curve represents the pristine perovskite film and the top curve represents the perovskite film incorporated with DAP amine additive.

FIG. 17C shows steady PL measurement of perovskite films with different compositions. PL intensities of perovskite films deposited on glass substrates: 1.82 eV perovskite. Note: the bottom curve represents the pristine perovskite film and the top curve represents the perovskite film incorporated with DAP amine additive.

DETAILED DESCRIPTION

Figure 1A:
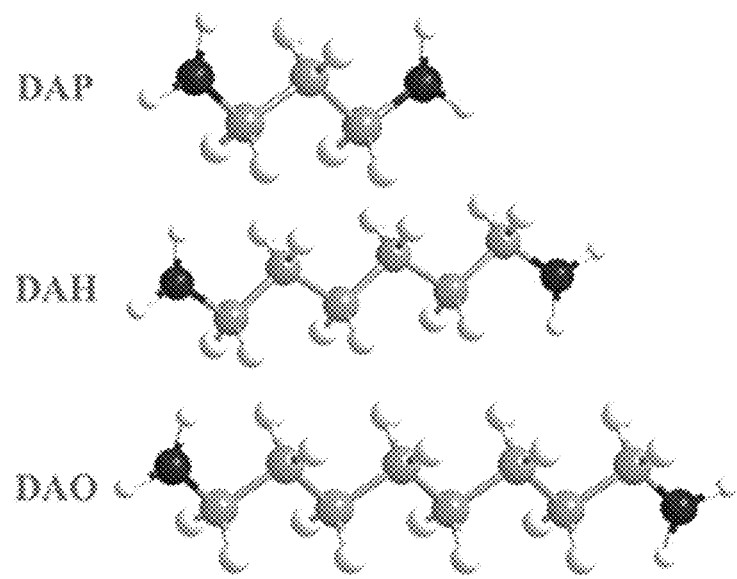
FIG. 1A shows the chemical structures of several bilateral alkylamine (BAA) additives, including 1,3-diaminopropane (DAP), 1,6-diaminohexane (DAH) and 1,8-diaminooctane (DAO).
Figure 1B:
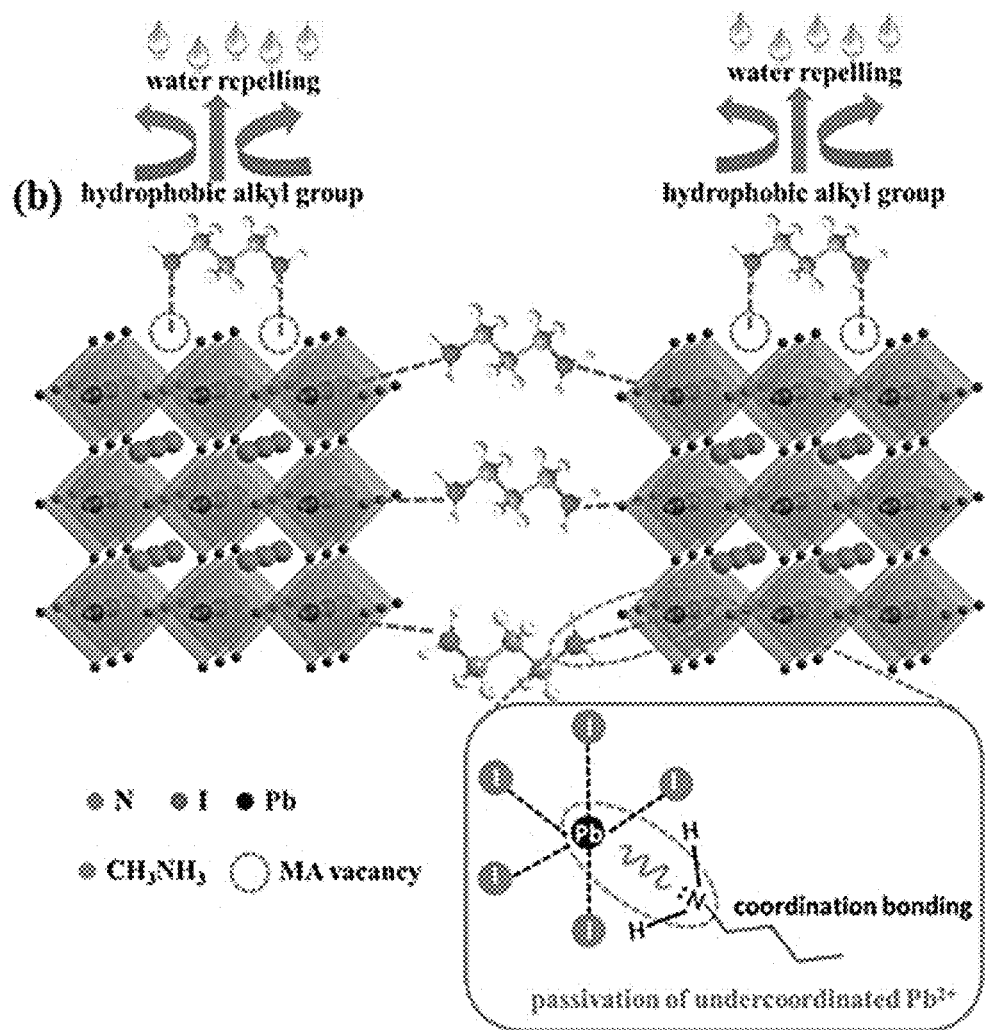
FIG. 1B shows the defect passivation and water repellence induced by BAA incorporation.

The subject matter described herein relates to new approaches for the formulation of perovskite ink solutions in the fabrication of polycrystalline perovskite films. Halide perovskites, such as methylammonium lead halides (i.e., (CH$_3$NH$_3$)PbX$_3$), where CH$_3$NH$_3$ corresponds with the methylammonium cation and X is a halogen, are a class of photoactive materials with solar energy applications with device efficiencies exceeding 20%. This class of materials is distinguished by their ABX$_3$ perovskite crystal structure, wherein A is commonly an organic or alkali cation; B is often tin or lead; and X is a halide or mixture of halides, such as fluoride, chloride, iodide, or bromide.

One advantage of these materials is that they can be produced and processed at or near room temperature from solution. The ambient-temperature processing and production techniques for these photoactive materials are relatively inexpensive, which is beneficial for their large-scale industrial fabrication. Early efforts to bring this emerging technology from the laboratory to the market have witnessed impressive progress, such as the one-step doctor-blading technique combined with composition/surfactant/dopant engineering strategies to achieve a uniform and large-scale perovskite film coating, improve device performance and simplify device architecture.[5-7] A certified efficiency of 15% for a 57 cm$^2$ module was achieved by fast blading at an unprecedented speed of 180 m hr$^{-1}$.[6] However, commercialization of perovskite-based photovoltaic technology requires further advancement in both efficiency and long-term stability with low-cost materials and ease of printability.

High-quality perovskite films are critical to realize highly efficient and stable PSCs.[8-10] However, polycrystalline perovskite films inevitably contain a high density of crystallographic defects, such as uncoordinated ions and dangling bonds at surfaces and grain boundaries, which can result in charge recombination via nonradiative channels, and thus impair device performance.[11-13] Organic-inorganic hybrid perovskites also exhibit instability under high moisture, heat, or light due to their soft nature. In an effort to overcome these problems, additional functional layers have been introduced on top of perovskite layers to either passivate the surface defects or improve the ambient stability of the perovskite films.[11, 16-19] However, it is more desirable to directly formulate the perovskite inks to avoid an additional step in the scalable fabrication of PSCs. Ink formulation engineering has been established in spin-coated devices to viably modulate crystal growth, passivate defects, and form a protection barrier for improved efficiency and stability via several types of additives, such as small organic molecules,[20, 21] ammonium salts,[22-24] long-chain polymers[25-27] and ionic liquids.[28] However, multifunctional additive molecules that are judiciously designed for blade-coated perovskite films are still lacking; the reported molecules are found to not function as well because of a different film formation mechanism inherent in the scalable blading process. Therefore, there exists a dilemma in the utilization of certain additives to produce smooth bladed perovskite films, as the additives often promote the formation of small grains and thus increase the area of grain boundaries.

As described herein, enhancing a perovskite ink formulation with a small amount of a bilateral amine additive, i.e. molecules with a structure of "NH$_2$—R—NH$_2$", not only helps in constructing compact perovskite films with a uniform size distribution and fewer pinholes, but also works to passivate the perovskite grain surface. The bilateral amines feature hydrophilic amino tails at both ends and a core comprising a hydrophilic alkyl carbon chain or aryl group. The bilateral amines are commercially available, liquids at room temperature, and soluble in many solvents, including water. It is demonstrated that the bilateral amines passivate crystallographic defects at the perovskite grain surface through the formation of coordination bonds between undercoordinated B$^{2+}$ ions in ABX$_3$ and —NH$_2$ tails. The —NH$_2$ tails additionally occupy A-site vacancies at the ABX$_3$ grain surfaces. The bilateral amines anchor onto the perovskite grain surface with their two —NH$_2$ tails, thereby exposing the linking hydrophobic carbon chain and forming a moisture-repelling barrier on the ABX$_3$ grains. Other bilateral amine additives have been studied in the past for perovskite-based applications (Lee et al. *J. Phys. Chem. Lett.* 2017, 8, 1784-1792). However, these molecules featured a short alkyl chain core. It has been discovered that the length of the alkyl chain in the bilateral amine compounds plays a significant factor in the ability of the molecules to effectively enhance the stability and efficiency of the perovskite films. Unlike in the art, the bilateral alkylamine additives disclosed herein comprise at least a three-carbon long chain and are therefore more effective at bridging the defective sites in the perovskite crystal structure and forming a hydrophobic moisture barrier on the perovskite film surface. In certain embodiments, the passivation molecules are substituted with various heteroatoms or functional groups for further improved film conductivity and passivation. The bilateral amine-incorporated strategy disclosed herein results in significantly enhanced efficiency and stability of perovskite solar cells without adding complexity to the scalable device fabrication process.

The presently disclosed subject matter will now be described more fully hereinafter. However, many modifications and other embodiments of the presently disclosed subject matter set forth herein will come to mind to one skilled in the art to which the presently disclosed subject matter pertains having the benefit of the teachings presented in the foregoing descriptions. Therefore, it is to be understood that the presently disclosed subject matter is not to be limited to the specific embodiments disclosed and that modifications and other embodiments are intended to be included within the scope of the appended claims. In other words, the subject matter described herein covers all alternatives, modifications, and equivalents. Unless otherwise defined, all technical and scientific terms used herein have the same meaning as commonly understood by one of ordinary skill in this field. All publications, patent applications, patents, and other references mentioned herein are incorporated by reference in their entirety. In the event that one or more of the incorporated literature, patents, and similar materials differs from or contradicts this application, including but not limited to defined terms, term usage, described techniques, or the like, this application controls.

I. Definitions

A dash ("—") that is not between two letters or symbols is used to indicate a point of attachment for a substituent. For example, —C(O)NH$_2$ is attached through the carbon atom. A dash at the front or end of a chemical group is a matter of convenience; chemical groups may be depicted with or without one or more dashes without losing their ordinary meaning. A wavy line or a dashed line drawn through or perpendicular across the end of a line in a structure indicates a specified point of attachment of a group. Unless chemically or structurally required, no directionality or stereochemistry is indicated or implied by the order in which a chemical group is written or named.

The prefix "$C_u$-$C_v$" indicates that the following group has from u to v carbon atoms. For example, "$C_1$-$C_6$ alkyl" indicates that the alkyl group has from 1 to 6 carbon atoms.

"Alkyl" refers to an unbranched or branched saturated hydrocarbon chain. As used herein, alkyl has 1 to 20 carbon atoms (i.e., $C_1$-$C_{20}$ alkyl), 1 to 12 carbon atoms (i.e., $C_1$-$C_{12}$ alkyl), 1 to 8 carbon atoms (i.e., $C_1$-$C_8$ alkyl), 1 to 6 carbon atoms (i.e., $C_1$-$C_6$ alkyl), 1 to 4 carbon atoms (i.e., $C_1$-$C_4$ alkyl), or 1 to 3 carbon atoms (i.e., $C_1$-$C_3$ alkyl). Examples of alkyl groups include, e.g., methyl, ethyl, propyl, isopropyl, n-butyl, sec-butyl, iso-butyl, tert-butyl, pentyl, 2-pentyl, isopentyl, neopentyl, hexyl, 2-hexyl, 3-hexyl and 3-methylpentyl. When an alkyl residue having a specific number of carbons is named by chemical name or identified by molecular formula, all positional isomers having that number of carbons may be encompassed; thus, for example, "butyl" includes n-butyl (i.e., —(CH$_2$)$_3$CH$_3$), sec-butyl (i.e., —CH(CH$_3$)CH$_2$CH$_3$), isobutyl (i.e., —CH$_2$CH(CH$_3$)$_2$) and tert-butyl (i.e., —C(CH$_3$)$_3$); and "propyl" includes n-propyl (i.e., —(CH$_2$)$_2$CH$_3$) and isopropyl (i.e., —CH(CH$_3$)$_2$).

"Alkenyl" refers to an alkyl group containing at least one carbon-carbon double bond and having from 2 to 20 carbon atoms (i.e., $C_2$-$C_{20}$ alkenyl), 2 to 8 carbon atoms (i.e., $C_2$-$C_8$ alkenyl), 2 to 6 carbon atoms (i.e., $C_2$-$C_6$ alkenyl) or 2 to 4 carbon atoms (i.e., $C_2$-$C_4$ alkenyl). Examples of alkenyl groups include, e.g., ethenyl, propenyl, butadienyl (including 1,2-butadienyl and 1,3-butadienyl).

"Alkynyl" refers to an alkyl group containing at least one carbon-carbon triple bond and having from 2 to 20 carbon atoms (i.e., $C_2$-$C_{20}$ alkynyl), 2 to 8 carbon atoms (i.e., $C_2$-$C_8$ alkynyl), 2 to 6 carbon atoms (i.e., $C_2$-$C_6$ alkynyl) or 2 to 4 carbon atoms (i.e., $C_2$-$C_4$ alkynyl). The term "alkynyl" also includes those groups having one triple bond and one double bond.

"Alkoxy" refers to the group "alkyl-O—". Examples of alkoxy groups include, e.g., methoxy, ethoxy, n-propoxy, iso-propoxy, n-butoxy, tert-butoxy, sec-butoxy, n-pentoxy, n-hexoxy and 1,2-dimethylbutoxy.

"Alkylthio" refers to the group "alkyl-S—". "Alkylsulfinyl" refers to the group "alkyl-S(O)—". "Alkylsulfonyl" refers to the group "alkyl-S(O)$_2$—". "Alkylsulfonylalkyl" refers to -alkyl-S(O)$_2$-alkyl.

"Acyl" refers to a group —C(O)R$^y$, wherein R$^y$ is hydrogen, alkyl, alkenyl, alkynyl, cycloalkyl, heterocyclyl, aryl, heteroalkyl or heteroaryl; each of which may be optionally substituted, as defined herein. Examples of acyl include, e.g., formyl, acetyl, cyclohexylcarbonyl, cyclohexylmethylcarbonyl and benzoyl.

"Amido" refers to both a "C-amido" group which refers to the group —C(O)NR$^y$R$^z$ and an "N-amido" group which refers to the group —NR$^y$C(O)R$^z$, wherein R$^y$ and R$^z$ are independently hydrogen, alkyl, alkenyl, alkynyl, cycloalkyl, heterocyclyl, aryl, heteroalkyl or heteroaryl.

"Amino" refers to the group —NR$^y$R$^z$ wherein R$^y$ and R$^z$ are independently hydrogen, alkyl, alkenyl, alkynyl, cycloalkyl, heterocyclyl, aryl, heteroalkyl or heteroaryl; each of which may be optionally substituted, as defined herein.

"Amidino" refers to —C(NR$^y$)(NR$^{z2}$), wherein R$^y$ and R$^z$ are independently hydrogen, alkyl, alkenyl, alkynyl, cycloalkyl, heterocyclyl, aryl, heteroalkyl or heteroaryl; each of which may be optionally substituted, as defined herein.

"Aryl" refers to an aromatic carbocyclic group having a single ring (e.g., monocyclic) or multiple rings (e.g., bicyclic or tricyclic) including fused systems. As used herein, aryl has 6 to 20 ring carbon atoms (i.e., $C_6$-$C_{20}$ aryl), 6 to 12 carbon ring atoms (i.e., $C_6$-$C_2$ aryl), or 6 to 10 carbon ring atoms (i.e., $C_6$-$C_{10}$ aryl). Examples of aryl groups include, e.g., phenyl, naphthyl, fluorenyl and anthryl.

As used herein, the term "graphene" refers to a polycyclic aromatic molecule with carbon atoms covalently bonded to each other. The covalently bonded carbon atoms can form a six-member ring as a repeating unit, and may also include at least one of a five-member ring and a seven-member ring. Multiple graphene layers are referred to in the art as graphite. Thus, graphene may be a single layer, or also may comprise a multiple layers of graphene that are stacked on other layers of graphene. Generally, graphene will have a maximum thickness of about 100 nanometers (nm), specifically about 10 nm to about 90 nm, more specifically about 20 nm to about 80 nm. As used herein, "graphene" encompasses both graphene and graphite.

"Cycloalkyl" refers to a saturated or partially unsaturated cyclic alkyl group having a single ring or multiple rings including fused, bridged and spiro ring systems. The term "cycloalkyl" includes cycloalkenyl groups (i.e., the cyclic group having at least one double bond) and carbocyclic fused ring systems having at least one sp$^3$ carbon atom (i.e., at least one non-aromatic ring).

"Oxo" refers to the (C=O) group. A carbon may be substituted with oxo, meaning it has the structure —C=O.

"Cyano" refers to the group —CN.

"Nitro" refers to the group —NO.

"Thiol" refers to the group —SR, where R is hydrogen, alkyl, alkenyl, alkynyl, cycloalkyl, heterocyclyl, aryl, heteroalkyl or heteroaryl; each of which may be optionally substituted, as defined herein.

"Carboxyl" refers to the group —COOR, where wherein R is alkyl, alkenyl, alkynyl, cycloalkyl, heterocyclyl, aryl, heteroalkyl or heteroaryl; each of which may be optionally substituted, as defined herein.

"Thiocyanate" refers to the group —SCN.

"Halogen" or "halo" refers to atoms occupying group VIIA of the periodic table, such as fluoro (fluorine), chloro (chlorine), bromo (bromine) or iodo (iodine).

"Haloalkyl" refers to an unbranched or branched alkyl group as defined above, wherein one or more (e.g., 1 to 6, or 1 to 3) hydrogen atoms are replaced by a halogen. For example, halo-$C_1$-$C_3$ alkyl refers to an alkyl group of 1 to 3 carbons wherein at least one hydrogen atom is replaced by a halogen. Where a residue is substituted with more than one halogen, it may be referred to by using a prefix corresponding to the number of halogen moieties attached. Dihaloalkyl and trihaloalkyl refer to alkyl substituted with two ("di") or three ("tri") halo groups, which may be, but are not necessarily, the same halogen. Examples of haloalkyl include, e.g., trifluoromethyl, difluoromethyl, fluoromethyl, trichloromethyl, 2,2,2-trifluoroethyl, 1,2-difluoroethyl, 3-bromo-2-fluoropropyl, 1,2-dibromoethyl and the like.

"Heteroaryl" refers to an aromatic group having a single ring, multiple rings or multiple fused rings, with one or more ring heteroatoms independently selected from nitrogen, oxygen, and sulfur. As used herein, heteroaryl includes 1 to 20 ring carbon atoms (i.e., $C_1$-$C_{20}$ heteroaryl), 3 to 12 ring carbon atoms (i.e., $C_3$-$C_{12}$ heteroaryl), or 3 to 8 carbon ring atoms (i.e., $C_3$-$C_8$ heteroaryl), and 1 to 5 ring heteroatoms, 1 to 4 ring heteroatoms, 1 to 3 ring heteroatoms, 1 to 2 ring heteroatoms, or 1 ring heteroatom independently selected from nitrogen, oxygen and sulfur. In certain instances, heteroaryl includes 9-10 membered ring systems (i.e., 9-10 membered heteroaryl), 5-10 membered ring systems (i.e., 5-10 membered heteroaryl), 5-7 membered ring systems (i.e., 5-7 membered heteroaryl), 5-6 membered ring systems (i.e., 5-6 membered heteroaryl), or 4-6 membered ring systems (i.e., 4-6 membered heteroaryl), each independently having 1 to 4 ring heteroatoms, 1 to 3 ring heteroatoms, 1 to 2 ring heteroatoms, or 1 ring heteroatom independently selected from nitrogen, oxygen and sulfur. Heteroaryl does not encompass or overlap with aryl as defined above.

"Heterocyclyl" refers to a saturated or partially unsaturated cyclic alkyl group, with one or more ring heteroatoms independently selected from nitrogen, oxygen and sulfur. The term "heterocyclyl" includes heterocycloalkenyl groups (i.e., the heterocyclyl group having at least one double bond), bridged-heterocyclyl groups, fused-heterocyclyl groups and spiro-heterocyclyl groups.

"Haloalkoxy" refers to an alkoxy group as defined above, wherein one or more (e.g., 1 to 6, or 1 to 3) hydrogen atoms are replaced by a halogen.

"Hydroxy" refers to an —OH group.

"Hydroxyalkyl" refers to an alkyl group as defined above, wherein one or more (e.g., 1 to 6, or 1 to 3) hydrogen atoms are replaced by a hydroxy group.

"Sulfonyl" refers to the group —S(O)$_2$R$^y$, where R$^y$ is hydrogen, alkyl, alkenyl, alkynyl, aryl; each of which may be optionally substituted, as defined herein. Examples of sulfonyl are methylsulfonyl, ethylsulfonyl, and phenylsulfonyl.

"Sulfinyl" refers to the group —S(O)R$^y$, where R$^y$ is hydrogen, alkyl, alkenyl, alkynyl, cycloalkyl, heterocyclyl, aryl, heteroalkyl or heteroaryl; each of which may be optionally substituted, as defined herein. Examples of sulfinyl are methylsulfinyl, ethylsulfinyl, phenylsulfinyl and toluenesulfinyl.

"Sulfonamido" refers to the groups —SO$_2$NR$^y$R$^z$ and —NR$^y$SO$_2$R$^z$, where R$^y$ and R$^z$ are each independently hydrogen, alkyl, alkenyl, alkynyl, cycloalkyl, heterocyclyl, aryl, heteroalkyl or heteroaryl; each of which may be optionally substituted, as defined herein.

The terms "optional" or "optionally" means that the subsequently described event or circumstance may or may not occur and that the description includes instances where said event or circumstance occurs and instances in which it does not. Also, the term "optionally substituted" refers to any one or more (e.g., 1 to 5, 1 to 4, or 1 to 3) hydrogen atoms on the designated atom or group may or may not be replaced by a moiety other than hydrogen.

The term "substituted" used herein means any of the above groups (i.e., alkyl, alkenyl, alkynyl, alkylene, alkoxy, haloalkyl, haloalkoxy, cycloalkyl, aryl, heterocyclyl, heteroaryl, and/or heteroalkyl) wherein at least one (e.g., 1 to 5, 1 to 4, or 1 to 3) hydrogen atom is replaced by a bond to a non-hydrogen atom such as, but not limited to alkyl, alkenyl, alkynyl, alkoxy, alkylthio, acyl, amido, amino, amidino, aryl, aralkyl, azido, carbamoyl, carboxyl, carboxyl ester, cyano, cycloalkyl, cycloalkylalkyl, guanidino, halo, haloalkyl, haloalkoxy, hydroxyalkyl, heteroalkyl, heteroaryl, heteroarylalkyl, heterocyclyl, heterocyclylalkyl, —NHNH$_2$, =NNH$_2$, imino, imido, hydroxy, oxo, oxime, nitro, sulfonyl, sulfinyl, alkylsulfonyl, alkylsulfinyl, thiocyanate, —S(O)OH, —S(O)$_2$OH, sulfonamido, thiol, thioxo, N-oxide or —Si(R$^y$)$_3$, wherein each R$^y$ is independently hydrogen, alkyl, alkenyl, alkynyl, heteroalkyl, cycloalkyl, aryl, heteroaryl or heterocyclyl.

In certain embodiments, "substituted" includes any of the above alkyl, alkenyl, alkynyl, cycloalkyl, heterocyclyl, aryl or heteroaryl groups in which one or more (e.g., 1 to 5, 1 to 4, or 1 to 3) hydrogen atoms are independently replaced with deuterium, halo, cyano, nitro, azido, oxo, alkyl, alkenyl, alkynyl, haloalkyl, cycloalkyl, heterocyclyl, aryl, heteroaryl, —NR$^g$R$^h$, —NR$^g$C(=O)R$^h$, —NR$^g$C(=O)NR$^g$R$^h$, —NR$^g$C(=O)OR$^h$, —NRS(=O)$_{1-2}$R$^h$, —C(=O)R$^g$, —C(=O)OR$^g$, —OC(=O)OR$^g$, —OC(=O)R$^g$, —C(=O)NR$^g$R$^h$, —OC(=O)NR$^g$R$^h$, —OR$^9$, —SR$^g$, —S(=O)R$^g$, —S(=O)$_2$R$^g$, —OS(=O)$_{1-2}$R$^g$, —S(=O)$_{1-2}$OR$^g$, —NR$^g$S(=O)$_{1-2}$NR$^g$R$^h$, —NSO$_2$R$^9$, =NOR$^9$, —S(=O)$_{1-2}$NR$^g$R$^h$, —SF$_5$, —SCF$_3$, or —OCF$_3$. In certain embodiments, "substituted" also means any of the above groups in which one or more (e.g., 1 to 5, 1 to 4, or 1 to 3) hydrogen atoms are replaced with —C(=O)R$^g$, —C(=O)OR$^9$, —C(=O)NR$^g$R$^h$, —CH$_2$SO$_2$R$^9$, or —CH$_2$SO$_2$NR$^g$R$^h$. In the foregoing, R$^g$ and R$^h$ are the same or different and independently hydrogen, alkyl, alkenyl, alkynyl, alkoxy, thioalkyl, aryl, aralkyl, cycloalkyl, cycloalkylalkyl, haloalkyl, heterocyclyl, heterocyclylalkyl, heteroaryl, and/or heteroarylalkyl. In certain embodiments, "substituted" also means any of the above groups in which one or more (e.g., 1 to 5, 1 to 4, or 1 to 3) hydrogen atoms are replaced by a bond to an amino, cyano, hydroxyl, imino, nitro, oxo, thioxo, halo, alkyl, alkoxy, alkylamino, thioalkyl, aryl, aralkyl, cycloalkyl, cycloalkylalkyl, haloalkyl, heterocyclyl, N-heterocyclyl, heterocyclylalkyl, heteroaryl, and/or heteroarylalkyl, or two of R$^g$ and R$^h$ and R$^i$ are taken together with the atoms to which they are attached to form a heterocyclyl ring optionally substituted with oxo, halo, amino, hydroxyl, or alkoxy.

In certain embodiments, as used herein, the phrase "one or more" refers to one to five. In certain embodiments, as used herein, the phrase "one or more" refers to one to four. In certain embodiments, as used herein, the phrase "one or more" refers to one to three.

As used herein, "and/or" refers to and encompasses any and all possible combinations of one or more of the associated listed items, as well as the lack of combinations when interpreted in the alternative ("or").

As used herein, the term "about," when referring to a measurable value such as an amount of a compound or agent of the current subject matter, dose, time, temperature, and the like, is meant to encompass variations of ±20%, ±10%, +5%, +1%, ±0.5%, or even ±0.1% of the specified amount.

The terms "approximately," "about," "essentially," and "substantially" as used herein represent an amount close to the stated amount that still performs a desired function or achieves a desired result. For example, in some embodiments, as the context may dictate, the terms "approximately", "about", and "substantially" may refer to an amount that is within less than or equal to 10% of the stated amount. The term "generally" as used herein represents a value, amount, or characteristic that predominantly includes or tends toward a particular value, amount, or characteristic.

As used herein, conditional language used herein, such as, among others, "can," "could," "might," "may," "e.g.," and the like, unless specifically stated otherwise or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

As used herein, "contacting" refers to allowing the ink solution to contact the substrate.

As defined herein, "compact" refers to a substantially void-free, densely-packed film.

As defined herein, "pin-hole free" refers to a film that is contiguous and wherein the diameter of any pores within the film are smaller than the thickness of the film. In particular, a substantially pinhole free film is one having a substantially uniform thickness not deviating from film mean thickness by more than +/−0.10%.

As defined herein, "uniform" structure refers to a film characterized by a non-deviating thickness.

As used herein, "smooth" refers to a film that has a uniform surface that is free of perceptible indentations or ridges.

As used herein, "moisture resistant" refers to a film that is hydrophobic in nature and essentially insoluble in water.

As used herein, "stable" refers to a film that can retain its crystalline, phase-pure composition after exposure to ambient air for an extended period of time.

As used herein, the term "thermally stable" refers to a perovskite solar cell that can retain almost all of its Power Conversion Efficiency after being heated to a temperature of at least 70° C. for an extended period of time. In one embodiment, the perovskite solar cells demonstrate thermal stability when heated at a temperature of 85° C. for 24 hours.

As used herein, "PM" refers to passivation molecule.

As used herein, "bilateral amine additive" refers to a compound having two amine (—NH$_2$) groups. The compound is added to a perovskite ink solution to enhance one or more properties of the perovskite film (i.e. passivation of grain boundaries, suppression of charge recombination).

As used herein, "PSC" refers to perovskite solar cell.

II. Polycrystalline Perovskite Films

In one aspect, the subject matter described herein is directed to polycrystalline perovskite films. In certain embodiments, the polycrystalline perovskite film comprises:
i. a composition of Formula (I)

$$ABX_3 \tag{I}$$

wherein A is a cation selected from the group consisting of methylammonium (MA), tetramethylammonium (TMA), formamidinium (FA), cesium (Cs), rubidium (Rb), potassium (K), sodium (NA), butylammonium (BAH), phenethylammonium (PEA), phenylammonium (PHA), guanidinium (GU), and a combination thereof, B is at least one divalent metal; and X is at least one halide; and ii. a compound of Formula (II)

$$NH_2-R_1-NH_2 \tag{II}$$

wherein $R_1$ is selected from the group consisting of linear or branched $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, and graphene, wherein one or more carbon atoms in said $C_3$-$C_{50}$ alkyl or $C_1$-$C_{20}$ alkyl is optionally substituted with O, P, S, or NH;

wherein said $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, or graphene is optionally substituted with one or more substituents, each independently selected from the group consisting of hydroxy, halo, haloalkoxy, alkoxy, haloalkyl, hydroxyalkyl, oxo, cyano, nitro, thiol, carboxyl, sulfonyl, sulfinyl, thiocyanate, —S(O)OH, —S(O)$_2$OH, sulfonamido, —CH$_2$OP(O)(OH)$_2$, —OP(O)(OH)$_2$, —R$_2$R$_3$P(O)$_4$, and —NR$_4$R$_5$, wherein, $R_2$, $R_3$, $R_4$ and $R_5$ are each independently hydrogen or $C_1$-$C_6$ alkyl.

a. Compositions of Formula I (ABX$_3$)

In certain embodiments, A may comprise an ammonium, an organic cation of the general formula [NR$_4$] where the R groups can be the same or different groups. Suitable R groups include, but are not limited to: methyl, ethyl, propyl, butyl, pentyl group or isomer thereof, any alkane, alkene, or alkyne $C_xH_y$, where x=1-20, y=1-42, cyclic, branched or straight-chain; alkyl halides, $C_xH_yX_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., pyridine, pyrrole, pyrrolidine, piperidine, tetrahydroquinoline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (e.g., acetic acid, propanoic acid); and ester or amide derivatives thereof, any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —OC$_x$H$_y$, where x=0-20, y=1-42. In certain embodiments, A is methylammonium, (CH$_3$NH$_3$). In certain embodiments, A is methylammonium. In certain embodiments, A is tetramethylammonium, ((CH$_3$)$_4$N$^+$).

In certain embodiments, A is butylammonium, which may be represented by (CH$_3$(CH$_2$)$_3$NH$_3^+$) for n-butylammonium, by ((CH$_3$)$_3$CNH$_3^+$) for t-butylammonium, or by (CH$_3$)$_2$CHCH$_2$NH$_3^+$) for iso-butylammonium. In certain embodiments, A is phenethylammonium, which may be represented by C$_6$H$_5$(CH$_2$)$_2$NH$_3^+$ or by C$_6$H$_5$CH(CH$_3$)NH$_3^+$. In certain embodiments, A comprises phenylammonium, C$_6$H$_5$NH$_3^+$.

In certain embodiments, A may comprise a formamidinium, an organic cation of the general formula [R$_2$NCHNR$_2$]$^+$ where the R groups can be the same or different groups. Suitable R groups include, but are not limited to: hydrogen, methyl, ethyl, propyl, butyl, pentyl or an isomer thereof; any alkane, alkene, or alkyne C$_x$H$_y$, where x=1-20, y=1-42, cyclic, branched or straight-chain; alkyl halides, C$_x$H$_y$X$_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., imidazole, benzimidazole, dihydropyrimidine, (azolidinylidenemethyl)pyrrolidine, triazole); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —OC$_x$H$_y$, where x=0-20, y=1-42. In certain embodiments A is a formamidinium ion represented by (H$_2$N=CH—NH$_2^+$).

In certain embodiments, A may comprise a guanidinium, an organic cation of the general formula [(R$_2$N)$_2$C=NR$_2$]$^+$ where the R groups can be the same or different groups. Suitable R groups include, but are not limited to: hydrogen, methyl, ethyl, propyl, butyl, pentyl group or isomer thereof; any alkane, alkene, or alkyne C$_x$H$_y$, where x=1-20, y=1-42, cyclic, branched or straight-chain; alkyl halides, C$_x$H$_y$X$_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., octahydropyrimido[1,2-a]pyrimidine, pyrimido[1,2-a]pyrimidine, hexahydroimidazo[1,2-a]imidazole, hexahydropyrimidin-2-imine); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, OC$_x$H$_y$, where x=0-20, y=1-42. In certain embodiments, A is a guanidinium ion of the type (H$_2$N=C—(NH$_2$)$_2$''').

In certain embodiments, A may comprise an alkali metal cation, such as Li$^+$, Na$^+$, K$^+$, Rb$^+$, or Cs$^+$.

In embodiments, the perovskite crystal structure composition may be doped (e.g., by partial substitution of the cation A and/or the metal B) with a doping element, which may be, for example, an alkali metal (e.g., Li$^+$, Na$^+$, K$^+$, Rb$^+$, or Cs$^+$), an alkaline earth metal (e.g., Mg$^{+2}$, Ca$^{+2}$, Sr$^{+2}$, Ba$^{+2}$) or other divalent metal, such as provided below for B, but different from B (e.g., Sn$^{+2}$, Pb$^{2+}$, Zn$^{+2}$, Cd$^{+2}$, Ge$^{+2}$, Ni$^{+2}$, Pt$^{+2}$, Pd$^{+2}$, Hg$^{+2}$, Si$^{+2}$, Ti$^{+2}$), or a Group 15 element, such as Sb, Bi, As, or P, or other metals, such as silver, copper, gallium, indium, thallium, molybdenum, or gold, typically in an amount of up to or less than about 1, 5, 10, 20, 25, 30, 35, 40, 45, 50, 55, 60, 65, 70, 75, 80, 85, 90, 95, 99, or 100 mol % of A or B. A may comprise a mixture of cations. B may comprise a mixture of cations.

The variable B comprises at least one divalent (B$^{+2}$) metal atom. The divalent metal (B) can be, for example, one or more divalent elements from Group 14 of the Periodic Table (e.g., divalent lead, tin, or germanium), one or more divalent transition metal elements from Groups 3-12 of the Periodic Table (e.g., divalent titanium, vanadium, chromium, manganese, iron, cobalt, nickel, copper, zinc, palladium, platinum, and cadmium), and/or one or more divalent alkaline earth elements (e.g., divalent magnesium, calcium, strontium, and barium). In certain embodiments, the at least one divalent metal is selected from the group consisting of lead, tin, cadmium, germanium, zinc, nickel, platinum, palladium, mercury, titanium, silicon, and a combination thereof.

The variable X is independently selected from one or a combination of halide atoms, wherein the halide atom (X) may be, for example, fluoride (F$^-$), chloride (Cl$^-$), bromide (Br$^-$), and/or iodide (I$^-$). In certain embodiments, the at least one halide is selected from the group consisting of I, Br, and a combination thereof. In certain embodiments, X is selected from the group consisting of SCN$^-$, BF$_4^-$, F$^-$, Cl$^-$, Br$^-$, I$^-$, and a combination thereof.

In certain embodiments, the crystalline perovskite composition of Formula (I) is selected from the group consisting of cesium lead iodide (CsPbI$_3$), methylammonium tin iodide (CH$_3$NH$_3$SnI$_3$), cesium tin iodide (CsSnI$_3$), methylammonium lead iodide (CH$_3$NH$_3$PbI$_3$), cesium lead bromide (CsPbBr$_3$), methylammonium tin bromide (CH$_3$NH$_3$SnBr$_3$), cesium tin bromide (CsSnBr$_3$), methylammonium lead bromide, (CH$_3$NH$_3$PbBr$_3$), formamidinium tin bromide (CHNH$_2$NH$_2$SnBr$_3$), formamidinium lead bromide (CHNH$_2$NH$_2$PbBr$_3$), formamidinium tin iodide (CHNH$_2$NH$_2$SnI$_3$), and formamidinium lead iodide (CHNH$_2$NH$_2$PbI$_3$). In certain embodiments, the crystalline perovskite composition of Formula (I) is selected from the group consisting of methylammonium lead iodide (CH$_3$NH$_3$PbI$_3$), cesium formamidinium methylammonium lead iodide (Cs$_{0.05}$FA$_{0.70}$MA$_{0.25}$PbI$_3$), cesium formamidinium lead iodide bromide (Cs$_{0.2}$FA$_{0.8}$Pb(I$_{0.6}$Br$_{0.4}$)$_3$), or cesium methylammonium lead iodide bromide (Cs$_{0.1}$MA$_{0.9}$Pb(I$_{0.9}$Br$_{0.1}$)$_3$). In a preferred embodiment, the crystalline perovskite composition of Formula (I) is methylammonium lead iodide (CH$_3$NH$_3$PbI$_3$).

b. Compounds of Formula II (NH$_2$—R$_1$—NH$_2$)

In certain embodiments, R$_1$ is selected from the group consisting of linear or branched C$_3$-C$_{50}$ alkyl, C$_6$-C$_{12}$ aryl, C$_1$-C$_{20}$ alkyl-C$_6$-C$_{12}$ aryl-C$_1$-C$_{20}$ alkyl, C$_6$-C$_{12}$ aryl-C$_1$-C$_{10}$ alkyl-C$_6$-C$_{12}$ aryl, and graphene, wherein one or more carbon atoms in said C$_3$-C$_{50}$ alkyl or C$_1$-C$_{20}$ alkyl is optionally substituted with O, P, S, or NH; wherein said C$_3$-C$_{50}$ alkyl, C$_6$-C$_{12}$ aryl, C$_1$-C$_{20}$ alkyl-C$_6$-C$_{12}$ aryl-C$_1$-C$_{20}$ alkyl, C$_6$-C$_{12}$ aryl-C$_1$-C$_{10}$ alkyl-C$_6$-C$_{12}$ aryl, or graphene is optionally substituted one two, or three times with a substituent, each independently selected from the group consisting of hydroxy, halo, haloalkoxy, alkoxy, haloalkyl, hydroxyalkyl, oxo, cyano, nitro, thiol, carboxy, sulfonyl, sulfinyl, thiocyanate, —S(O)OH, —S(O)$_2$OH, sulfonamido, —CH$_2$OP(O)

(OH)$_2$, —OP(O)(OH)$_2$, —R$_2$R$_3$P(O)$_4$, and —NR$_4$R$_5$, wherein, R$_2$, R$_3$, R$_4$ and R$_5$ are each independently hydrogen or C$_1$-C$_6$ alkyl.

In certain embodiments, R$_1$ is optionally substituted C$_3$-C$_{30}$ alkyl, C$_3$-C$_{20}$ alkyl, C$_3$-C$_{15}$ alkyl, C$_3$-C$_{10}$ alkyl, or C$_3$-C$_5$ alkyl, wherein one or more carbon atoms on said C$_3$-C$_{50}$ alkyl is optionally substituted with O. In certain embodiments, R$_1$ is a linear alkyl selected from the group consisting of propyl, butyl, pentyl, hexyl, heptyl, octyl, nonyl, decyl, and undecanyl, wherein one or more carbon atoms in said alkyl is optionally substituted with O.

In certain embodiments, R$_1$ is selected from the group consisting of propyl, hexyl, or octyl.

In certain embodiments, R$_1$ is pentyl, wherein one carbon atom in the pentyl chain is substituted with oxygen.

In certain embodiments, R$_1$ is undecanyl, wherein three carbon atoms in the undecanyl chain are substituted with oxygen.

In certain embodiments, the compound of Formula II is selected from the group consisting of

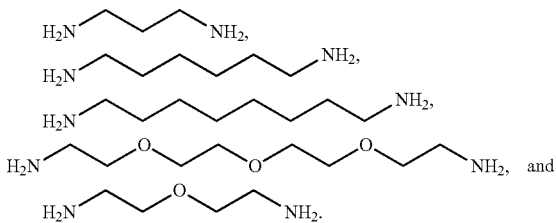

In a preferred embodiment, the compound of Formula II is

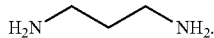

In certain embodiments of the perovskite film, the compound of Formula I is selected from the group consisting of MAPbI$_3$, Cs$_{0.05}$FA$_{0.70}$Ma$_{0.25}$PbI$_3$, Cs$_{0.2}$FA$_{0.8}$Pb(I$_{0.6}$Br$_{0.4}$)$_3$, and Cs$_{0.1}$MA$_{0.9}$Pb(I$_{0.9}$Br$_{0.1}$)$_3$, and the compound of Formula II selected from the group consisting of

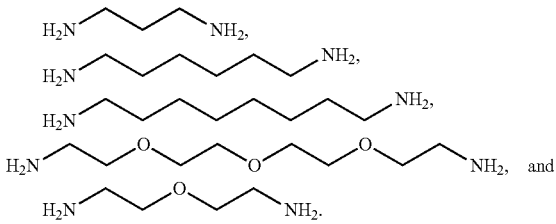

In certain embodiments of the perovskite film, the composition of Formula I is MAPbI$_3$ and the compound of Formula II

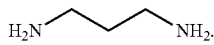

In certain embodiments, R$_1$ is C$_6$-C$_{12}$ aryl. In certain embodiments, R$_1$ is aminonaphthalene, wherein the compound of Formula II is naphthalene-1,8-diamine. In certain embodiments, R$_1$ is benzene, optionally substituted two times with —NH$_2$, having the structure 1,2,4,5-benzenetetramine.

In certain embodiments, R$_1$ is graphene. In certain embodiments, the graphene is further substituted with amine to form amine-functionalized graphene as the compound of Formula II, as in FIG. 1E.

In certain embodiments, R$_1$ is C$_6$-C$_{12}$ aryl-C$_1$-C$_{10}$ alkyl-C$_6$-C$_{12}$ aryl. In certain embodiments, each C$_6$-C$_{12}$ aryl in C$_6$-C$_{12}$ aryl-C$_1$-C$_{10}$ alkyl-C$_6$-C$_{12}$ aryl is phenyl and the C$_1$-C$_{10}$ alkyl chain is ethyl. In certain embodiments, one carbon in the ethyl chain is substituted for NH and the other carbon is oxo-substituted. In this embodiments, the compound of Formula II is 4,4-diaminobenzanilide.

In certain embodiments, R$_1$ is C$_1$-C$_{20}$ alkyl-C$_6$-C$_{12}$ aryl-C$_1$-C$_{20}$ alkyl. In certain embodiments, the aryl is phenyl and each alkyl chain is methyl or ethyl. In certain embodiments, the phenyl group is further substituted with hydroxy, halo, haloalkoxy, alkoxy, or haloalkyl.

In certain embodiments, R$_1$ is optionally substituted C$_3$-C$_{10}$ alkyl, phenyl, C$_2$-C$_{10}$ alkyl-C$_6$-C$_{12}$ aryl-C$_2$-C$_{10}$ alkyl, C$_3$-C$_{10}$ alkyl-C$_6$-C$_{12}$ aryl-C$_3$-C$_{10}$ alkyl, or C$_6$-C$_{12}$ aryl-C$_3$-C$_{10}$ alkyl-C$_6$-C$_{12}$ aryl.

The polycrystalline perovskite films are prepared with an ink solution comprising about 0.001 wt % and about 0.30 wt % of the compound of Formula II. In a preferred embodiment, the polycrystalline perovskite films are prepared with an ink solution comprising about 0.025 wt % of the compound of Formula II. In certain embodiments of the perovskite film, the compound of Formula II comprises between about 0.001 wt % to about 15 wt %, about 0.01 wt % to about 10 wt %, about 0.08 wt % to about 7 wt %, about 0.01 wt % to about 5 wt %, about 0.15 wt % to about 3 wt %, about 0.3 wt % to about 2 wt %, about 0.1 wt % to about 0.9 wt %, or about 1.0 wt % to about 5 wt % of the film. In certain embodiments, the compound of Formula II comprises about 0.01 wt %, 0.015 wt %, 0.02 wt %, 0.025 wt %, 0.030 wt %, 0.035 wt %, 0.04 wt %, 0.05 wt %, 0.1 wt %, 0.2 wt %, 0.3 wt %, 0.4 wt %, 0.5 wt %, 0.6 wt %, 0.7 wt %, 0.8 wt %, 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, or 15 wt % of the film. The polycrystalline perovskite films comprise a composition of Formula I (ABX$_3$) and an amount of a compound of Formula II provided by an ink solution comprising about 0.001 wt % and about 0.30 wt % of the compound of Formula II. In certain embodiments, the polycrystalline perovskite films are prepared with an ink solution comprising a composition of Formula I (ABX$_3$) and about 0.001 wt % and about 0.30 wt % of a compound of Formula II. In a preferred embodiment, the polycrystalline perovskite films are prepared with an ink solution comprising a composition of Formula I (ABX$_3$) and about 0.025 wt % of a compound of Formula II.

The polycrystalline perovskite films described herein have an average grain size of about 10 nm to about 1 mm. In a preferred embodiment, the polycrystalline perovskite films have an average grain size of about 100 nm to about 300 nm. In certain embodiments, the crystalline perovskite films have an average grain size of about, at least, or above 0.01 μm, 10 μm, 20 μm, 30 μm, 40 μm, 50 μm, 60 μm, 70 μm, 80 μm, 90 μm, 100 μm, 120 μm, 150 μm, 180 μm, 200 μm, 220 μm, 250 μm, 280 μm, 300 μm, 350 μm, 400 μm, 450 μm, 500 μm, 550 μm, 600 μm, 650 μm, 700 μm, 800 μm, 850 μm, 900 μm, 1000 μm, or an average grain size within a range bounded by any two of the foregoing exemplary values. In a preferred embodiment, the polycrystalline perovskite films have an average grain size of about It is generally known in the art that large grain sizes are suitable for films in photoactive or photovoltaic applications.

In certain embodiments, the polycrystalline perovskite films described herein have a film thickness in the range of about 10 nm to about 1 cm. In certain embodiments, the polycrystalline perovskite films have a thickness of about 400 nm to about 600 nm. In a preferred embodiment, the polycrystalline perovskite films have a thickness of about 500 nm. In certain embodiments, the polycrystalline perovskite films have a thickness in the range of about 80 nm to about 300 nm. In certain embodiments, the polycrystalline perovskite films have a thickness in the range of about 0.1 mm to about 50 mm. In certain embodiments, the polycrystalline perovskite films have a thickness in the range of about 100 nm to about 1000 nm. In certain embodiments, the perovskite films have a film thickness of about, at least, above, up to, or less than, for example, 200 nm, 300 nm, 400 nm, 500 nm, 600 nm, 700 nm, 800 nm, 900 nm, 1000 nm (1 µm), 2 µm, 3 µm, 4 µm, 5 m, 6 µm, 7 µm, 8 µm, 9 µm, or 10 m.

In certain embodiments, the polycrystalline perovskite films as described herein are smooth. In certain embodiments, the polycrystalline perovskite films have a root mean square surface roughness of about 23.0 nm, 23.1 nm, 23.2 nm, 23.3 nm, 23.4 nm, 23.5 nm, 23.6 nm, 23.7 nm, 23.8 nm, 23.9 nm, 24.0 nm, 24.1 nm, 24.2 nm, 24.3 nm, 24.4 nm, 24.5 nm, 24.6 nm, 24.7 nm, 24.8 nm, 24.9 nm, 25.0 nm, 25.1 nm, 25.2 nm, 25.3 nm, 25.4 nm, 25.6 nm, 25.7 nm, 25.8 nm, 25.9 nm, or 26.0 nm as measured by Atomic Force Microscopy (AFM) scanning.

In certain embodiments, the polycrystalline perovskite films as described herein are uniform and compact.

In certain embodiments, the polycrystalline perovskite films as described herein are water moisture-resistant.

In certain embodiments, the polycrystalline perovskite films as described herein are pinhole-free.

In certain embodiments, the polycrystalline perovskite films as described herein are stable (i.e. the polycrystalline perovskite films retain their crystalline, phase-pure composition after exposure to ambient air (50+/−5 RH % at room temperature). In certain embodiments, the polycrystalline perovskite films are stable for at least 5 hours, 10 hours, 15 hours, 20 hours, 35 hours, 50 hours, 75 hours, 95 hours, 100 hours, 120 hours, 125 hours, 150 hours, 175 hours, or 200 hours.

In certain embodiments of the polycrystalline perovskite films as described herein, the compound of Formula II resides at grain boundaries of the composition of Formula I.

Based on Lewis acid-base chemistry, the ionic nature of the perovskite lattice can facilitate molecular passivation through coordinate binding. In certain embodiments of the polycrystalline perovskite film, the compound of Formula II binds to the compound of Formula I through coordinate binding.

III. Ink Solutions

In another aspect, the subject matter described herein is directed to an ink solution. In certain embodiments, the ink solution comprises:
i. a composition of Formula (I)

$$ABX_3 \qquad (I)$$

wherein A is a cation selected from the group consisting of methylammonium (MA), tetramethylammonium (TMA), formamidinium (FA), cesium (Cs), rubidium (Rb), potassium (K), sodium (NA), butylammonium (BAH), phenethylammonium (PEA), phenylammonium (PHA), guanidinium (GU), and a combination thereof, B is at least one divalent metal; and
X is at least one halide;
ii. a compound of Formula (II)

$$NH_2-R_1-NH_2 \qquad (II)$$

wherein $R_1$ is selected from the group consisting of linear or branched $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, and graphene, wherein one or more carbon atoms in said $C_3$-$C_{50}$ alkyl or $C_1$-$C_{20}$ alkyl is optionally substituted with O, P, S, or NH;

wherein said $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, or graphene is optionally substituted with one or more substituents, each independently selected from the group consisting of hydroxy, halo, haloalkoxy, alkoxy, haloalkyl, hydroxyalkyl, oxo, cyano, nitro, thiol, carboxyl, sulfonyl, sulfinyl, thiocyanate, —S(O)OH, —S(O)$_2$OH, sulfonamido, —CH$_2$OP(O)(OH)$_2$, —OP(O)(OH)$_2$, —R$_2$R$_3$P(O)$_4$, and —NR$_4$R$_5$, wherein, $R_2$, $R_3$, $R_4$ and $R_5$ are each independently hydrogen or $C_1$-$C_6$ alkyl; and ii. a solvent.

Non-limiting examples of solvents include, but are not limited to, dimethylformamide, dimethylsulfoxide (DMSO), methanol, ethanol, propanol, butanol, tetrahydrofuran, formamide, pyridine, pyrrolidine, chlorobenzene, dichlorobenzene, dichloromethane, chloroform, and combinations thereof. In certain embodiments, the solvent is selected from the group consisting of dimethyl sulfoxide, dimethylformamide, dichloromethane, tetrahydrofuran, γ-butyrolactone, 2-methoxyethanol, and acetonitrile. In a preferred embodiment, the solvent is dimethylformamide.

In certain embodiments of the ink solution, the at least one divalent metal is selected from the group consisting of lead, tin, cadmium, germanium, zinc, nickel, platinum, palladium, mercury, titanium, silicon, and a combination thereof. In certain embodiments, the at least one divalent metal is lead.

In certain embodiments of the ink solution, the at least one halide is selected from the group consisting of I, Br, and a combination thereof. In certain embodiments, the at least one halide is I. In certain embodiments of the ink solution, the at least one halide is I and Br, wherein the molar ratio of I to Br is about 0.6:0.4 or about 0.9:0.1.

In certain embodiments of the ink solution, A is selected from the group consisting of MA, FA, Cs, and a combination thereof. In a preferred embodiment, A is MA. In certain embodiments, A is Cs, FA, and MA, wherein the molar ratio of Cs to FA to MA is about 0.05:0.70:0.25. In certain embodiments, A is Cs and FA, wherein the molar ratio of Cs to FA is about 0.2:0.8. In certain embodiments, A is Cs and MA, wherein the molar ratio of Cs to MA is about 0.1:0.9.

In certain embodiments of the ink solution, the composition of Formula (I) is selected from the group consisting of MAPbI$_3$, Cs$_{0.05}$FA$_{0.70}$Ma$_{0.25}$PbI$_3$, Cs$_{0.2}$FA$_{0.8}$Pb(I$_{0.6}$Br$_{0.4}$)$_3$, and Cs$_{0.1}$MA$_{0.9}$Pb(I$_{0.9}$Br$_{0.1}$)$_3$.

In certain embodiments of the ink solution, $R_1$ is linear $C_3$-$C_{20}$ alkyl, wherein one or more carbon atoms in said $C_3$-$C_{20}$ alkyl are optionally substituted with O.

In certain embodiments of the ink solution, $R_1$ is optionally substituted $C_3$-$C_{30}$ alkyl, $C_3$-$C_{20}$ alkyl, $C_3$-$C_{15}$ alkyl, $C_3$-$C_{10}$ alkyl, or $C_3$-$C_5$ alkyl, wherein one or more carbon atoms on said $C_3$-$C_{50}$ alkyl is optionally substituted with O.

In certain embodiments of the ink solution, $R_1$ is selected from the group consisting of propyl, hexyl, or octyl.

In certain embodiments of the ink solution, $R_1$ is pentyl, wherein one carbon atom in the pentyl chain is substituted with oxygen.

In certain embodiments of the ink solution, $R_1$ is undecanyl, wherein three carbon atoms in the undecanyl chain are substituted with oxygen.

In certain embodiments of the ink solution, $R_1$ is a linear alkyl selected from the group consisting of propyl, butyl, pentyl, hexyl, heptyl, octyl, nonyl, decyl, and undecanyl, wherein one or more carbon atoms in said alkyl is optionally substituted with O.

In certain embodiments of the ink solution, the compound of Formula II is selected from the group consisting of

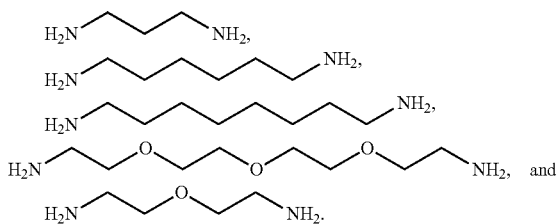

In certain embodiments of the ink solution, the compound of Formula II comprises between about 0.001 wt % and about 0.5 wt %, about 0.001 wt % and about 0.3 wt %, about 0.005 wt % and about 0.3%, about 0.010 and about 0.2%, or about 0.001 and about 0.05% of the ink solution. In certain embodiments, the compound of Formula II comprises about 0.01, 0.015, 0.02, 0.025, 0.030, 0.035, 0.04, or 0.05 wt % of the ink solution. In a preferred embodiment, the compound of Formula II comprises about 0.025 wt % of the ink solution.

In a preferred embodiment of the ink solution, the composition of Formula I is MAPbI$_3$, the compound of Formula II is

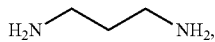

the solvent is dimethylformamide, and the compound of Formula II comprises about 0.025 wt % of the ink solution.

In certain embodiments of the ink solution, the composition of Formula I is $Cs_{0.05}FA_{0.70}MA_{0.25}PbI_3$, the compound of Formula II is

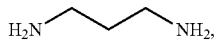

the solvent is dimethylformamide, and the compound of Formula II comprises about 0.025 wt % of the ink solution.

In certain embodiments of the ink solution, the composition of Formula I is $Cs_{0.2}FA_{0.8}Pb(I_{0.6}Br_{0.4})_3$, the compound of Formula II is

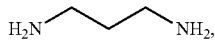

the solvent is dimethylformamide, and the compound of Formula II comprises about 0.025 wt % of the ink solution.

In certain embodiments, the ink solution comprises a compound of formula $BX'_2$, wherein B is a least one divalent metal and X' is a monovalent anion; a compound of formula AX, wherein A is at least one monovalent cation selected from the group consisting of methylammonium, tetramethylammonium, formamidinium, guanidinium, cesium, rubidium, potassium, sodium, butylammonium, phenethylammonium, and phenylammonium; X is a halide; and a solvent.

In certain embodiments, the ink solution comprises a compound of formula $BX'_2$, wherein the at least one divalent metal (B) is selected from the group consisting of lead, tin, cadmium, germanium, zinc, nickel, platinum, palladium, mercury, titanium, and silicon. In certain embodiments, the ink solution comprises a compound of formula $BX'_2$, wherein the at least one divalent metal (B) is lead.

In the compound of formula $BX'_2$, the monovalent anion X' can be any anionic species, including halide species X. In certain embodiments, the monovalent anion (X') is a halide. Some examples of anionic species X', other than halide species, include formate, acetate, propionate, carbonate, nitrate, sulfate, thiosulfate, oxalate, triflate, cyanate, thiocyanate, acetylacetonate, and 2-ethylhexanoate. Some examples of compounds of formula $BX'_2$ include the following: lead(II) fluoride, $(PbF_2)$; lead(II) chloride, $(PbCl_2)$; lead(II) bromide, $(PbBr_2)$; lead(II) iodide, $(PbI_2)$; lead(II) acetate, $(Pb(CH_3CO_2)_2)$; lead(II) carbonate, $(PbCO_3)$; lead (II) nitrate, $(Pb(NO_3)_2)$; lead(II) sulfate, $(PbSO_4)$; lead(II) oxalate, $(PbC_2O_4)$; lead(II) triflate, $(C_2F_6O_6PbS_2)$; lead(II) thiocyanate, $(Pb(SCN)_2)$, lead(II) acetylacetonate, $(Pb(C_5H_7O_2)_2)$; lead(II) 2-ethylhexanoate, $(C_{16}H_{30}O_4Pb)$; tin (II) fluoride, $(SF_2)$, tin(II) chloride, $(S_nCl_2)$; tin(II) bromide, $(SnBr_2)$; tin(II) iodide, $(S_nI_2)$; tin(II) acetate, $(Sn(CH_3CO_2)_2)$; tin(II) carbonate, $(SnCO_3)$; tin(II) nitrate, $(Sn(NO_3)_2)$; tin(II) sulfate, $(SnSO_4)$; tin(II) oxalate, $(SnC_2O_4)$; tin(II) triflate, $(C_2F_6O_6SnS_2)$; tin(II) thiocyanate, $(Sn(SCN)_2)$; tin(II) acetylacetonate, $(Sn(C_5H_7O_2)_2)$; tin(II) 2-ethylhexanoate, $(C_{16}H_{30}O_4Sn)$; germanium(II) chloride, $(GeCl_2)$; germanium(II) bromide, $(GeBr_2)$; germanium (II) iodide, $(GeI_2)$; titanium(II) chloride, $(TiCl_2)$; titanium(II) bromide, $(TiBr_2)$; titanium(II) iodide, $(TiI_2)$; titanium(II) acetate, $(Ti(CH_3CO_2)_2)$; magnesium fluoride, $(MgF_2)$; magnesium chloride, $(MgCl_2)$; magnesium bromide, $(MgBr_2)$; magnesium iodide, $(MgI_2)$; magnesium acetate, $(Mg(CH_3CO_2)_2)$; magnesium sulfate, $(MgSO_4)$; calcium fluoride, $(CaF_2)$; calcium chloride, $(CaCl_2)$; calcium bromide, $(CaBr_2)$; calcium iodide, $(CaI_2)$; calcium acetate, $(Ca(CH_3CO_2)_2)$; calcium sulfate $(CaSO_4)$, cadmium (II) chloride $(CdCl_2)$; cadmium (II) bromide $(CdBr_2)$; cadmium (II) iodide $(CdI_2)$; zinc (II) chloride $(ZnCl_2)$; zinc (II) bromide $(ZnBr_2)$; zinc (II) iodide $(ZnI_2)$; platinum (II) chloride $(PtCl_2)$; platinum (II) bromide $(PtBr_2)$; platinum (II) iodide $(PtI_2)$; nickel (II) chloride $(NiCl_2)$; Nickel (II) bromide $(NiBr_2)$; nickel (II) iodide $(NiI_2)$; palladium (II) chloride $(PdCl_2)$; palladium (II) bromide $(PdBr_2)$; palladium (II) iodide $(PdI_2)$; mercury (II) chloride $(HgCl_2)$; mercury (II) bromide $(HgBr_2)$; and mercury (II) iodide $(HgI_2)$.

In certain embodiments, the formula $BX'_2$ is selected from the group consisting of $PbI_2$, $PbBr_2$, and $PbCl_2$. In certain embodiments, the compound of the formula $BX'_2$ is $PbI_2$.

In the formula AX, the cation species A is at least one monovalent cation selected from the group consisting of methylammonium, tetramethylammonium, formamidinium, guanidinium, cesium, rubidium, potassium, sodium, butylammonium, phenethylammonium, and phenylammonium; and X is a halide. Several nonlimiting examples of compounds of Formula AX include methylammonium fluoride, methylammonium chloride, methylammonium bromide, methylammonium iodide, tetramethylammonium fluoride, tetramethylammonium chloride, tetramethylammonium bromide, tetramethylammonium iodide, formamidinium chloride, formamidinium bromide, formamidinium iodide, guanidinium fluoride, guanidinium chloride, guanidinium bromide, guanidinium iodide, cesium iodide, cesium bromide, cesium chloride, butylammonium iodide, butylammonium bromide, butylammonium chloride, phenethylammonium iodide, phenethylammonium bromide, phenethylammonium chloride, phenylammonium iodide, phenylammonium bromide, and phenylammonium chloride. In certain embodiments, the compound of formula AX is selected from the group consisting of methylammonium iodide, methylammonium bromide, methylammonium chloride, formamidinium iodide, formamidinium bromide, formamidinium chloride, cesium iodide, cesium bromide, cesium chloride, butylammonium iodide, butylammonium bromide, butylammonium chloride, phenethylammonium iodide, phenethylammonium bromide, phenethylammonium chloride, phenylammonium iodide, phenylammonium bromide, and phenylammonium chloride. In certain embodiments, the compound of formula AX is selected from the group consisting of methylammonium iodide, cesium iodide, formamidinium iodide, butylammonium iodide, phenethylammonium iodide, methylammonium bromide, cesium bromide, formamidinium bromide, butylammonium bromide, and phenethylammonium iodide. In certain embodiments, the compound of formula AX is methylammonium iodide.

In certain embodiments, $BX'_2$ is $PbI_2$ and AX is methylammonium iodide.

In the ink solution, $BX'_2$ and AX in the precursor are generally present in a molar ratio of M:X of about 1:3. In the case where X' is a halide (X), which corresponds with $BX'_2$ being $BX_2$, then a B:X molar ratio of about 1:3 can be provided by a 1:1 molar ratio of $BX_2$:AX. In the case where X' is non-halide (e.g., acetate), then a B:X molar ratio of about 1:3 can be provided by a 1:3 molar ratio of BX'2:AX.

In certain embodiments, the relative amount of $ABX_3$ to $BX'_2$ and AX is about 100:0, 99:1, 95:1, 90:1, 85:1, 80:1. 75:1, 70:1, 65:1, or 60:1.

In certain embodiments, the ink solution may also contain additives. Non-limiting examples of additives include L-α-Phosphatidylcholine, methylammonium chloride, and methylammonium hypophosphite. These additives may be added to the precursor solution in molar percentages ranging from 0.01 wt % to about 1.5 wt % relative to the $ABX_3$ composition. In certain embodiments, the molar percentage is about 0.025%, 0.8%, 1.0%, 0.05 wt %, or 0.15 wt % relative to the $ABX_3$ composition.

i. Methods

In certain embodiments, the subject matter disclosed herein is directed to a method for producing a polycrystalline perovskite film using the ink solutions described above. In certain embodiments, the method comprises: contacting the ink solution using a fast coating process onto a substrate to form a film, wherein the fast coating process is selected from the group consisting of blade coating, slot die coating, shear coating, gravure coating, brush coating, syringe coating, and screen printing. In a preferred embodiment, the fast coating process is blade coating.

Utilizing a fast coating process is advantageous because of increased scalability for perovskite device roll-to-roll production, simplicity, and cost effectiveness. Furthermore, fast coating processes also provide advantages due to high-throughput deposition, high material usage, and application onto flexible substrates. In particular, perovskite films and devices fabricated using a fast coating process, such as blade coating, can have advantageously long carrier diffusion lengths (e.g., up to 3 m thick) due to the dramatically higher carrier mobility in the blade-coated films. Such doctor-blade deposition can be utilized for large area perovskite cells fabricated with high volume roll-to-roll production.

In certain embodiments, a device is used in the fast coating process for contacting the ink solution onto the substrate. In the blade coating process, a "blade coater" may be used. As used herein, "blade coater" is synonymous with "doctor blade." In certain embodiments, doctor blade coating techniques are used to facilitate formation of the polycrystalline perovskite film during the fabrication process.

In certain embodiments, the method for producing a polycrystalline perovskite film using the fast coating process can take place at a temperature between about 25° C. to about 250° C. In certain embodiments, the process takes place at about room temperature (about 25° C.).

In certain embodiments of the fast coating process, the substrate is moving and the device is stationary. In certain embodiments, the device is a doctor blade. In certain aspects, the substrate is moving at a rate of about 2 mm/s relative to the device. In certain aspects, the substrate is moving at a rate of about 20 mm/s relative to the device. In certain aspects, the substrate is moving at a rate of about 40 mm/s relative to the device. In certain aspects, the substrate is moving at a rate of about 99 mm/s relative to the device. In certain aspects, the substrate is stationary and the device moves relative to the substrate. In certain aspects, the device is moving at a rate of about 2 mm/s relative to the substrate. In certain aspects, the device is moving at a rate of about 20 mm/s relative to the substrate. In certain aspects, the device is moving at a rate of about 40 mm/s relative to the substrate. In certain aspects, the device is moving at a rate of about 99 mm/s relative to the substrate.

In certain embodiments, the fast coating process described herein takes place at about 2 to about 15,000 mm/s. In certain embodiments, the fast coating process described herein takes place at about 2 to about 10,000 mm/s. In certain embodiments, the fast coating process described herein takes place at about 2 to about 99 mm/s. In certain embodiments, the fast coating process takes place at least or at about 2 mm/s, 15 mm/s, 20 mm/s, 40 mm/s, 60 mm/s, 80 mm/s, 99 mm/s, 150 mm/s, 275 mm/s, 500 mm/s, 700 mm/s, 800 mm/s, 900 mm/s, 1000 mm/s, 2000 mm/s, 3000 mm/s, 4000 mm/s, 5000 mm/s, 6000 mm/s, 7000 mm/s, 8000 mm/s, 9000 mm/s, or about 10,000 mm/s.

In certain embodiments, the distance between the devices used in the fast coating process for contacting the ink solution onto the substrate is between about 10 μm and 1 cm. In certain embodiments, the distance between the device and the substrate is between about 150 and about 350 μm. In certain embodiments, the distance between the device and the substrate is between about 200 and about 300 μm. In certain embodiments, the distance between the device and the substrate is about 200 μm, 225 μm, about 250 μm, about 275 μm, or about 300 μm. In a preferred embodiment, the distance between the device and the substrate is about 100 μm.

In certain embodiments, the methods described herein to produce polycrystalline perovskite films further comprise knife-assisted drying. Knife drying comprises applying a high velocity, low pressure gas to the ink solution to form a perovskite film on the substrate. An advantage of knife drying in the polycrystalline perovskite film production process is that it helps produce uniform and smooth films. As used herein, an "air knife," "$N_2$ knife," or "air doctor" may be used to describe the device that performs knife-assisted drying in the perovskite film production process. The knife may have a gas manifold with a plurality of nozzles that direct a high velocity stream of air or other gas at the perovskite ink on the substrate. The gas used in the knife-assisted drying process may be air, nitrogen, argon, helium, oxygen, neon, hydrogen, and a combination thereof.

In certain embodiments, the knife-assisted drying takes place at a temperature of about 25° C. to about 250° C. In certain embodiments, the knife-assisted drying takes place at room temperature (about 25° C.). In certain embodiments, the knife-assisted drying takes place at a temperature of about 50° C. to about 100° C.

In certain embodiments, the knife-assisted drying takes place at a pressure in a range of about 0 to 500 psi. In certain embodiments, the knife-assisted drying takes place at a pressure in a range of about 5 to 400 psi, about 20 to 300 psi, about 50 to 200 psi, about 100 to 150 psi, about 5 to 25 psi, about 5 to 20 psi, about 10 to 20 psi, about 10 to 19 psi, about 12 to 18 psi, about 12-16 psi, or about 13-16 psi. In certain embodiments, the knife-assisted drying takes place at about 14 psi, about 15, psi, about 16 psi, at about 17 psi, at about 18 psi, or at about 19 psi.

In certain embodiments, the knife is angled against the device used in the fast coating process and the substrate to create a unidirectional air flow over the as-coated film for enhanced blowing uniformity. In certain embodiments, the knife is angled 0°, 5°, 10°, 15°, 20°, 25°, 30°, 35° 40°, 45° 50°, 55° 60°, 65°, 70°, 75° 80°, 90°, 100°, 120°, 150°, 155°, 170°, or 180° against the device or the substrate.

In certain embodiments, after fast coating, the film created from the ink solution (while on the substrate) may undergo annealing. The film is annealed at a temperature of at least or above 30° C. In certain embodiments, annealing employs a temperature of about, at least, above, up to, or less than 40° C., 50° C., 60° C., 70° C., 80° C., 90° C., 100° C., 110° C., 120° C., 130° C., 140° C., 150° C., 160° C., 170° C., 180° C., 190° C., or 200° C., or a temperature within a range bounded by any two of the foregoing values. In various embodiments, annealing may take place in a range of, for example, 30-200° C., 50-150° C., 30-180° C., 30-150° C., 30-140° C., 30-130° C., 30-120° C., 30-110° C., or 30-100° C. In a preferred embodiment, the annealing temperature is 70° C.

Annealing may take place for a period of time, for example, in a range of about 0 seconds to 400 minutes, about 5 seconds to 30 seconds, about 5 minutes to about 10 minutes, about 10 minutes to 20 minutes, or about 20 minutes to 30 minutes. Annealing can take place for a period of time, for example, of at least 5 seconds, 10 seconds, 20 seconds, 30 seconds, 1, minute, 5 minutes, 10 minutes, 20 minutes, 30 minutes, 60 minutes, 90 minutes, 120 minutes, 180 minutes, 240 minutes, or 360 minutes.

In certain embodiments, the methods described herein produce polycrystalline perovskite films having a film thickness in a range of about 10 nm to about 1 cm, about 300 nm to about 1000 nm, about 80 nm to about 300 nm, about 0.1 mm to about 50 mm, about 100 nm to about 1000 nm, or about 400 nm to about 600 nm. In certain embodiments, the methods described herein produce polycrystalline perovskite films having a film thickness in a range of about, at least, above, up to, or less than, for example, 200 nm, 300 nm, 400 nm, 500 nm, 600 nm, 700 nm, 800 nm, 900 nm, 1000 nm (1 m), 2 µm, 3 µm, 4 µm, 5 µm, 6 µm, 7 µm, 8 µm, 9 µm, or 10 m. In a preferred embodiment, the methods described herein produce polycrystalline perovskite films having a film thickness of about 500 nm.

The methods described herein produce polycrystalline perovskite films having an average grain size of about 10 nm to about 1 mm. In a preferred embodiment, the methods described herein produce polycrystalline perovskite films having an average grain size of about 100 nm to about 300 nm. In certain embodiments, the average grain size of the polycrystalline perovskite films produced by the methods described herein is about 90 nm, 100 nm, 125 nm, 150 nm, 175 nm, 200 nm, 225 nm, 250 nm, 275 nm, 300 nm, or 325 nm.

In certain embodiments, the methods described herein produce polycrystalline perovskite films that are compact, pin-hole free, and uniform. In certain embodiments, the methods described herein produce polycrystalline perovskite films having a root mean square surface roughness of about 23.0 nm, 23.1 nm, 23.2 nm, 23.3 nm, 23.4 nm, 23.5 nm, 23.6 nm, 23.7 nm, 23.8 nm, 23.9 nm, 24.0 nm, 24.1 nm, 24.2 nm, 24.3 nm, 24.4 nm, 24.5 nm, 24.6 nm, 24.7 nm, 24.8 nm, 24.9 nm, 25.0 nm, 25.1 nm, 25.2 nm, 25.3 nm, 25.4 nm, 25.6 nm, 25.7 nm, 25.8 nm, 25.9 nm, or 26.0 nm as measured by Atomic Force Microscopy (AFM) scanning.

ii. Devices

The polycrystalline perovskite films described herein are useful in a variety of photoactive and photovoltaic applications. The perovskite films can be integrated into, for example, photoluminescent devices, photoelectrochemical devices, thermoelectric devices, and photocatalytic devices. Some non-limiting examples in which the polycrystalline perovskite films can be applied include solar cells, solar panels, solar modules, light-emitting diodes, lasers, photodetectors, x-ray detectors, batteries, hybrid PV batteries, field effect transistors, memristors, or synapses.

In certain embodiments, the subject matter described herein is directed to a perovskite solar cell. In certain embodiments, the perovskite solar cell comprises a conductive substrate; a first transport layer disposed on said substrate; a perovskite film as described herein, which is disposed on said first transport layer; a second transport layer disposed on said film; and a conductive electrode disposed on said second transport layer.

The conductive substrate and the conductive electrode comprise the anode and cathode (or vice versa) in the solar cell. In certain embodiments, the cathode and anode each comprise at least one of lithium, sodium, potassium, rubidium, cesium, francium, beryllium, magnesium, calcium, strontium, barium, radium, boron, aluminum, gallium, indium, thallium, tin, lead, flerovium, bismuth, antimony, tellurium, polonium, scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, copernicium, samarium, neodymium, ytterbium, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, carbon nanowire, carbon nanosheet, carbon nanorod, carbon nanotube, graphite, indium tin oxide (ITO), fluorine-doped tin oxide (FTO), aluminum doped zinc oxide (AZO), antimony-tin mixed oxide (ATO), network of metal/alloy nanowire, or a combination of two or more of the above materials. In certain embodiments, the anode is ITO. In certain embodiments, the cathode is copper.

The transport layers in the solar cell are each a hole transport layer or an electron transport layer.

In certain embodiments, the charge transport layer between the perovskite film and the cathode comprises at least one of poly(3,4-ethylene dioxithiophene) (PEDOT) doped with poly(styrene sulfon icacid) (PSS), Spiro-OMeTAD, m-spiro-OMeTAD, po-spiro-OMeTAD, dopants in spiro-OMeTAD, 4,4'-biskptrichlorosilylpropylphenyl)pheny laminoThiphenyl (TPD-Si2), poly(3-hexyl-2,5-thienylene vinylene) (P3HTV), C60, carbon, carbon nanotube, graphene quantum dot, graphene oxide, copper phthalocyanine (CuPc), Polythiophene, poly(3,4-(1hydroxymethyl)ethylenedioxythiophene (PHMEDOT), n-dodecylbenzenesulfonic acid/hydrochloric acid doped poly(aniline) nanotubes (a-PANIN)s, poly(styrene sulfonic acid)-graft-poly(aniline) (PSSA-g-PANI), poly(9. 9-dioctylfluorene)-co-N-(4-(1-methylpropyl)phenyl) diphenylamine (PFT), 4,4'-bis(p-trichlorosilylpropylphenyl) phenylaminobiphenyl (TSPP), 5,5'-bis(p-trichlorosilylpropylphenyl) phenylamino-2,20 bithiophene (TSPT), N-propyltriethoxysilane, 3,3,3-trifluo ropropyltrichlorosilane or 3-aminopropyltriethoxysilane, Poly(bis(4-phenyl)(2,4,6-trimethylphenyl)amine) (PTAA), (Poly[[(2,4-dimethylphenyl)imino]-1,4-phenylene(9,9-dioctyl-9H-fluorene-2,7-diyl)-1,4phenylene], (PF8-TAA)), (Poly [[(2,4-dimethylphenyl)imino]-1,4-phenylene (6,12-dihydro-6,6,12,12tetraoctylindeno[1,2-b]fluorene-2,8-diyl)-1,4-phenylene]) (PIF8-TAA), poly[[4,8-bis[(2-ethylhexyl)oxy]benzo[1,2-b:4,5-b]dithiophene-2,6-diyl][3-fluoro-2-[(2-ethylhexyl)carbonyl]thieno[3,4-b]thiophenediyl]] (PTB7), poly[N-90-heptadecanyl-2,7-carbazole-alt-5,5-(40,70-di-2-thienyl-20,10,30-benzothiadiazole)] (PCDTBT), Poly[2,5-bis(2-decyldodecyl)pyrrolo[3,4-c]pyrrole-1,4(2H,5H)-dione-(E)-1,2-di(2,20-bithiophen-5-yl) ethene] (PDPPDBTE), 4,8-dithien-2-yl-benzo[1,2-d;4,5-d']bistriazole-alt-benzo[1,2-b:4,5b']dithiophenes (pBBTa-BDTs), pBBTa-BDT1, pBBTa-BDT2 polymers, poly(3-hexylthiophene) (P3HT), poly(4,4'-bis(N-carbazolyl)-1,1'-biphenyl) (PPN), triarylamine (TAA) and/or thiophene moieties, Paracyclophane, Triptycene, and Bimesitylene, Thiophene and Furan-based hole transport materials, Dendrimer-like and star-type hole transport materials, VO, VOX, MoC, WO, ReO, NiOx, AgOx, CuO, Cu2O, V2O5, CuI, CuS, CuInS2, colloidal quantum dots, lead sulphide (PbS), CuSCN, Cu22ZnSnS4, Au nanoparticles and their derivatives. Thiophene derivatives, Triptycene derivatives, Triazine derivatives, Porphyrin derivatives, Triphenylamine derivatives, Tetrathiafulvalene derivatives, Carbazole derivatives and Phthalocyanine derivatives. As used herein, when a material is referred to a "derivate" or as "derivatives," such as Triphenylamine derivatives, the material contains Triphenylamine in its backbone structure. In certain embodiments, the charge transport layer between the perovskite film and the cathode is Poly(bis(4-phenyl)(2,4,6-trimethylphenyl)amine) (PTAA).

In certain embodiments, the charge transport layer between perovskite film and the anode comprises at least one of LiF, CsP, LiCoO, CsCO, TiOx, TiO, nanorods (NRs), ZnO, ZnO nanorods (NRs), ZnO nanoparticles (NPs), ZnO, Al—O, CaO, bathocuproine (BCP), copper phthalocyanine (CuPc), pentacene, pyronin B, pentadecafluorooctyl phenyl-C60-butyrate (F-PCBM), C60, C60/LiF, ZnO NRS/PCBM, ZnO/cross-linked fullerene derivative (C-PCBSD), single walled carbon nanotubes (SWCNT), poly(ethylene glycol) (PEG), poly(dimethylsi loxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluo rene bearing quaternary ammonium groups in the side chains (WPF-6-oxy-F), fluorene alternating and random copolymer bearing cationic groups in the alkyl side chains (PFNBr DBT15), fluorene alternating and random copolymer bearing cationic groups in the alkyl side chains (PFPNBr), poly (ethylene oxide) (PEO), and fullerene derivatives. In certain embodiments, the charge transport layer between perovskite film and the anode comprises two layers—a first layer of C60 on the perovskite film and a second layer of bathocuproine (BCP) on top of the C60 layer.

In certain embodiments of the solar cell devices described herein, the conductive substrate is ITO; the first transport layer is PTAA; the second transport layer comprises a first layer of C60 and a second layer of BCP, wherein the first layer of C60 is disposed on the film and the second layer of BCP is disposed on the first layer of C60; and the conductive electrode is copper.

In certain embodiments, the solar cells employing the perovskite films as described herein exhibit an open circuit voltage ($V_{oc}$) of about 1.16 V. In certain embodiments, the solar cells exhibit an open circuit voltage ($V_{oc}$) of about 1.14 V, 1.15 V, 1.17 V, 1.18 V, or 1.19 V.

The Power Conversion Efficiency (PCE) of the solar cells as described herein ranges from about 18% to about 24%. In certain embodiments, the PCE is at least 18%, 19%, 20%, 21%, 22%, or 23%. In one embodiment, the solar cells as described herein achieve a PCE of 21.5% under AM 1.5 G illumination.

The solar cells as described herein demonstrate an extended recombination lifetime. In embodiments, the solar cells employing the perovskite films as described herein exhibit recombination lifetimes significantly longer than perovskite films without the passivation molecules of Formula II. In certain embodiments, the solar cells having the perovskite films as presently described exhibit a recombination lifetime that is about 1.5 times, 2 times, 2.25 times, 2.5 times, or 3 times longer than that of a solar cell featuring a perovskite film without the passivation molecule of Formula II. In certain embodiments, the solar cells as disclosed herein exhibit a recombination of about 0.95 µs.

The solar cells as described herein are thermally stable. In one embodiment, the DAP-incorporated MAPbI$_3$ perovskite solar cell nearly retains its Power Conversion Efficiency after being heated at 85° C. under a nitrogen atmosphere for 24 hours.

In certain embodiments, the solar cells as described herein retain at least 80%, 81%, 82%, 83%, 84%, 85%, 86%, 87%, 88%, 89%, 90%, 91%, 92%, 93%, 94%, 95%, 96%, 97%, 98%, 99%, or 100% of their Power Conversion Efficiency after 500 hours under 1 continuous sun illumination. In certain embodiments, the solar cells as described herein retain at least 80%, 81%, 82%, 83%, 84%, 85%, 86%, 87%, 88%, 89%, 90%, 91%, 92%, 93%, 94%, 95%, 96%, 97%, 98%, 99%, or 100% of their Power Conversion Efficiency after storage for 1000 hours at ambient conditions (50+/−RH % room temperature).

The subject matter described herein is directed to the following embodiments:
1. An ink solution, comprising:
   i. a composition of Formula (I)

wherein A is a cation selected from the group consisting of methylammonium (MA), tetramethylammonium (TMA), formamidinium (FA), cesium (Cs), rubidium (Rb), potassium (K), sodium (NA), butylammonium (BAH), phenethylammonium (PEA), phenylammonium (PHA), guanidinium (GU), and a combination thereof,
B is at least one divalent metal; and
X is at least one halide;
ii. a compound of Formula (II)

$$NH_2-R_1-NH_2 \quad (II)$$

wherein $R_1$ is selected from the group consisting of linear or branched $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, and graphene, wherein one or more carbon atoms in said $C_3$-$C_{50}$ alkyl or $C_1$-$C_{20}$ alkyl is optionally substituted with O, P, S, or NH;

wherein said $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, or graphene is optionally substituted with one or more substituents, each independently selected from the group consisting of hydroxy, halo, haloalkoxy, alkoxy, haloalkyl, hydroxyalkyl, oxo, cyano, nitro, thiol, carboxyl, sulfonyl, sulfinyl, thiocyanate, —S(O)OH, —S(O)$_2$OH, sulfonamido, —CH$_2$OP(O)(OH)$_2$, —OP(O)(OH)$_2$, —R$_2$R$_3$P(O)$_4$, and —NR$_4$R$_5$, wherein, $R_2$, $R_3$, $R_4$ and $R_5$ are each independently hydrogen or $C_1$-$C_6$ alkyl; and iii. a solvent.

2. The ink solution of embodiment 1, wherein said solvent is selected from the group consisting of dimethyl sulfoxide, dimethylformamide, dichloromethane, tetrahydrofuran, γ-butyrolactone, 2-methoxyethanol, and acetonitrile.

3. The ink solution of embodiment 1 or 2, wherein said solvent is dimethylformamide.

4. The ink solution of any one of embodiments 1-3, wherein said at least one divalent metal is selected from the group consisting of lead, tin, cadmium, germanium, zinc, nickel, platinum, palladium, mercury, titanium, silicon, and a combination thereof.

5. The ink solution of any one of embodiments 1-4, wherein said at least one divalent metal is lead.

6. The ink solution of any one of embodiments 1-5, wherein said at least one halide is selected from the group consisting of I, Br, and a combination thereof.

7. The ink solution of any one of embodiments 1-6, wherein said at least one halide is I.

8. The ink solution of any one of embodiments 1-7, wherein said at least one halide is I and Br, wherein the molar ratio of I to Br is about 0.6:0.4 or about 0.9:0.1.

9. The ink solution of any one of embodiments 1-8, wherein A is selected from the group consisting of methylammonium, formamidinium, cesium, and a combination thereof.

10. The ink solution of any one of embodiments 1-9, wherein A is methylammonium.

11. The ink solution of any one of embodiments 1-9, wherein A is cesium, formamidinium, and methylammonium, wherein the molar ratio of cesium to formamidinium to methylammonium is about 0.05:0.70:0.25.

12. The ink solution of any one of embodiments 1-9, wherein A is cesium and formamidinium, wherein the molar ratio of cesium to formamidinium is about 0.2:0.8.

13. The ink solution of any one of embodiments 1-9, wherein A is cesium and methylammonium, wherein the molar ratio of cesium to methylammonium is about 0.1:0.9.

14. The ink solution of any one of embodiments 1-3, wherein the composition of Formula (I) is selected from the group consisting of cesium lead bromide (CsPbBr$_3$), methylammonium lead bromide (MAPbBr$_3$), formamidinium lead bromide (FAPbBr$_3$), methylammonium lead iodide (MAPbI$_3$), cesium formamidinium methylammonium lead iodide (Cs$_{0.05}$FA$_{0.70}$MA$_{0.25}$PbI$_3$), cesium formamidinium lead iodide bromide (Cs$_{0.2}$FA$_{0.8}$Pb(I$_{0.6}$Br$_{0.4}$)$_3$), and cesium methylammonium lead iodide bromide (Cs$_{0.1}$MA$_{0.9}$Pb(I$_{0.9}$Br$_{0.1}$)$_3$).

15. The ink solution of any one of embodiments 1-14, wherein $R_1$ is linear $C_3$-$C_{20}$ alkyl, wherein one or more carbon atoms in said $C_3$-$C_{20}$ alkyl is optionally substituted with O.

16. The ink solution of any one of embodiments 1-15, wherein $R_1$ is a linear alkyl selected from the group consisting of propyl, butyl, pentyl, hexyl, heptyl, octyl, nonyl, decyl, and undecanyl, wherein one or more carbon atoms in said alkyl is optionally substituted with O.

17. The ink solution of any one of embodiments 1-14, wherein said compound of Formula I is selected from the group consisting of H$_2$N~~~~NH$_2$,
H$_2$N~~~~~~NH$_2$,
H$_2$N~~~~~~~~NH$_2$,
H$_2$N~~O~~O~~O~~NH$_2$, and
H$_2$N~~O~~NH$_2$.

18. The ink solution of any one of embodiments 1-17, wherein said compound of Formula II comprises between about 0.001 wt % and about 0.30 wt % of the ink solution.

19. The ink solution of any one of embodiments 1-18, wherein said compound of Formula II comprises about 0.025 wt % of the ink solution.

20. The ink solution of any one of embodiments 1-19, wherein said composition of Formula I is MAPbI$_3$, said compound of Formula II is

H$_2$N~~~~NH$_2$, said solvent is dimethylformamide, and said compound of Formula II comprises about 0.025 wt % of said ink solution.

21. The ink solution of any one of embodiments 1-20, further comprising:
a compound of BX'$_2$ wherein B is a least one divalent metal and X' is a monovalent anion; and
a compound of Formula AX, wherein A is at least one monovalent cation selected from the group consisting of methylammonium, tetramethylammonium, formamidinium, guanidinium, cesium, rubidium, potassium, sodium, butylammonium, phenethylammonium, and phenylammonium; and X is selected from the group consisting of halide, acetate (CH$_3$CO$_2^+$), and thiocyanate (SCN$^-$).

22. The ink solution of embodiment 21, wherein the relative amount of ABX$_3$ to BX'$_2$ and AX is about 99:1.

23. The ink solution of embodiment 21 or 22, wherein said compound of the Formula BX'$_2$ is selected from the group consisting of PbI$_2$, PbBr$_2$, PbCl$_2$, and Pb(CH$_3$CO$_2$)$_2$.

24. The ink solution of any one of embodiments 21-23, wherein the compound of Formula AX is selected from the group consisting of methylammonium iodide, cesium iodide, formamidinium iodide, butylammonium iodide, phenethylammonium iodide, methylammonium bromide, cesium bromide, formamidinium bromide, butylammonium bromide, and phenethylammonium iodide.

25. The ink solution of any one of embodiments 21-24, wherein said compound of Formula BX'$_2$ is PbI$_2$ and said compound of Formula AX methylammonium iodide (MAI).

26. A method for producing a polycrystalline perovskite film using the ink solution of any one of embodiments 1-25, said method comprising:
    contacting said ink solution of any one of embodiments 1-25 using a fast coating process onto a substrate to form a film, wherein said fast coating process is selected from the group consisting of blade coating, slot die coating, shear coating, gravure coating, brush coating, syringe coating, and screen printing.

27. The method of embodiment 26, wherein said fast coating process is blade coating.

28. The method of embodiment 26 or 27, further comprising annealing said film, wherein a uniform, compact film having grain sizes of about 100 nm to about 300 nm is prepared.

29. The method of any one of embodiments 26-28, wherein the root mean square surface roughness of the film produced is about 24.9 nm as measured by Atomic Force Microscopy (AFM) scanning.

30. A polycrystalline perovskite film comprising:
    i. a composition of Formula (I)

$$ABX_3 \quad (I)$$

wherein A is a cation selected from the group consisting of methylammonium (MA), tetramethylammonium (TMA), formamidinium (FA), cesium (Cs), rubidium (Rb), potassium (K), sodium (NA), butylammonium (BAH), phenethylammonium (PEA), phenylammonium (PHA), guanidinium (GU), and a combination thereof,
    B is at least one divalent metal; and
    X is at least one halide; and
    ii. a compound of Formula (II)

$$NH_2-R_1-NH_2 \quad (II)$$

wherein $R_1$ is selected from the group consisting of linear or branched $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, and graphene, wherein one or more carbon atoms in said $C_3$-$C_{50}$ alkyl or $C_1$-$C_{20}$ alkyl is optionally substituted with O, P, S, or NH;
        wherein said $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, or graphene is optionally substituted with one or more substituents, each independently selected from the group consisting of hydroxy, halo, haloalkoxy, alkoxy, haloalkyl, hydroxyalkyl, oxo, cyano, nitro, thiol, carboxyl, sulfonyl, sulfinyl, thiocyanate, —S(O)OH, —S(O)$_2$OH, sulfonamido, —CH$_2$OP(O)(OH)$_2$, —OP(O)(OH)$_2$, —R$_2$R$_3$P(O)$_4$, and —NR$_4$R$_5$, wherein R$_2$, R$_3$, R$_4$ and R$_5$ are each independently hydrogen or $C_1$-$C_6$ alkyl.

31. The polycrystalline perovskite film of embodiment 30, wherein said at least one divalent metal is selected from the group consisting of lead, tin, cadmium, germanium, zinc, nickel, platinum, palladium, mercury, titanium, silicon, and a combination thereof.

32. The polycrystalline perovskite film of embodiment 30 or 31, wherein said at least one divalent metal is lead.

33. The polycrystalline perovskite film of any one of embodiments 30-32, wherein said at least one halide is selected from the group consisting of I, Br, and a combination thereof.

34. The polycrystalline perovskite film of any one of embodiments 30-33, wherein said composition of Formula I is selected from the group consisting of cesium lead iodide (CsPbI$_3$), methylammonium lead iodide (MAPbI$_3$), cesium lead bromide (CsPbBr$_3$), methylammonium lead bromide (MAPbBr$_3$), formamidinium lead bromide (FAPbBr$_3$), cesium formamidinium methylammonium lead iodide (Cs$_{0.05}$FA$_{0.70}$MA$_{0.25}$PbI$_3$), cesium formamidinium lead iodide bromide (Cs$_{0.2}$FA$_{0.8}$Pb(I$_{0.6}$Br$_{0.4}$)$_3$), cesium methylammonium lead iodide bromide (Cs$_{0.1}$MA$_{0.9}$Pb(I$_{0.9}$Br$_{0.1}$)$_3$), and formamidinium lead iodide FAPbI$_3$.

35. The polycrystalline perovskite film of any one of embodiments 30-34, wherein $R_1$ is linear $C_3$-$C_{20}$ alkyl, wherein one or more carbon atoms in said $C_3$-$C_{20}$ alkyl is optionally substituted with O.

36. The polycrystalline perovskite film of any one of embodiments 30-35, wherein $R_1$ is a linear alkyl selected from the group consisting of propyl, butyl, pentyl, hexyl, heptyl, octyl, nonyl, decyl, and undecanyl, wherein one or more carbon atoms in said alkyl is optionally substituted with O.

37. The polycrystalline perovskite film of any one of embodiments 30-34, wherein said compound of Formula II is selected from the group consisting of

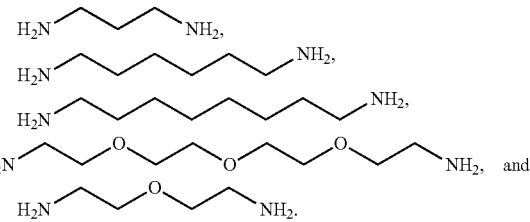

38. The polycrystalline perovskite film of any one of embodiments 30-37, wherein said composition of Formula I is selected from the group consisting of MAPbI$_3$, Cs$_{0.05}$FA$_{0.70}$MA$_{0.25}$PbI$_3$, Cs$_{0.2}$FA$_{0.8}$Pb(I$_{0.6}$Br$_{0.4}$)$_3$, and Cs$_{0.1}$MA$_{0.9}$Pb(I$_{0.9}$Br$_{0.1}$)$_3$, and said compound of Formula II selected from the group consisting of

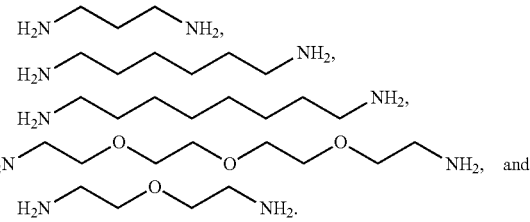

39. The polycrystalline perovskite film of any one of embodiments 30-38, wherein said composition of Formula I is MAPbI$_3$ and said compound of Formula II is

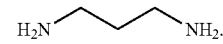

40. The polycrystalline perovskite film of any one of embodiments 30-39, wherein said compound of Formula II comprises between about 0.01 wt % and about 5 wt % of said film.

41. The polycrystalline perovskite film of any one of embodiments 30-40, wherein said compound of Formula II comprises between about 0.1 wt % and about 0.9 wt % of said film.

42. The polycrystalline perovskite film of any one of embodiments 30-41, having grain sizes of about 100 nm to about 300 nm.

43. The polycrystalline perovskite film of any one of embodiments 30-42, wherein said film is smooth.

44. The polycrystalline perovskite film of any one of embodiments 30-43, wherein said film has a root mean square surface roughness of about 24.9 nm as measured by Atomic Force Microscopy (AFM) scanning.

45. The polycrystalline perovskite film of any one of embodiments 30-44, wherein said film is uniform and compact.

46. The polycrystalline perovskite film of any one of embodiments 30-45, wherein said film has a thickness of about 400 to about 600 nm.

47. The polycrystalline perovskite film of any one of embodiments 30-46, wherein said film is moisture-resistant.

48. The polycrystalline perovskite film of any one of embodiments 30-47, wherein said film is pinhole-free.

49. The polycrystalline perovskite film of any one of embodiments 30-48, wherein said film is stable.

50. The polycrystalline perovskite film of any one of embodiments 30-49, wherein said compound of Formula II resides at grain boundaries of said composition of Formula I.

51. A solar cell, solar panel, light emitting diode, photodetector, x-ray detector, field effect transistor, memristor, or synapse comprising the polycrystalline perovskite film of any one of embodiments 30-50.

52. A solar cell, comprising:
 a conductive substrate;
 a first transport layer disposed on said conductive substrate;
 the polycrystalline perovskite film of any one of embodiments 30-50 disposed on said first transport layer;
 a second transport layer disposed on said film; and
 a conductive electrode disposed on said second transport layer.

53. The solar cell of embodiment 52, wherein said conductive substrate is ITO; said first transport layer is PTAA; said second transport layer comprises a first layer of C60 and a second layer of BCP, wherein said first layer of C60 is disposed on said film and said second layer of BCP is disposed on said first layer of C60; and said conductive electrode is copper.

54. The solar cell of embodiment 52 or 53, wherein said solar cell exhibits an open circuit voltage ($V_{oc}$) of about 1.16 V.

55. The solar cell of any one of embodiments 52-54, wherein said solar cell exhibits a Power Conversion Efficiency (PCE) of at least 20%.

56. The solar cell of any one of embodiments 52-55, wherein said solar cell exhibits a Power Conversion Efficiency (PCE) of at least 21%.

57. The solar cell of any one of embodiments 52-56, wherein said solar cell exhibits a Power Conversion Efficiency (PCE) of at least 22%.

58. The solar cell of any one of embodiments 52-57, wherein said solar cell exhibits a Power Conversion Efficiency (PCE) of at least 23%.

59. The solar cell of any one of embodiments 52-58, wherein said solar cell exhibits an extended recombination lifetime.

60. The solar cell of any one of embodiments 52-59, wherein said solar cell is thermally stable.

61. The solar cell of any one of embodiments 52-60, wherein said solar cell retains at least 90% of its Power Conversion Efficiency for 500 hours after 1 continuous sun illumination.

The following examples are offered by way of illustration and not by way of limitation.

EXAMPLES

Methods

Materials. Unless stated otherwise, all materials and solvents were purchased from Sigma-Aldrich. Lead iodide ($PbI_2$, 99.999%) was purchased from Alfa Aesar. Methylammonium iodide (MAI) was purchased from GreatCell Solar. All chemicals were used as received without further purification.

Device fabrication The ITO glass substrates were cleaned using an ultrasonicator in deionized water, acetone, and isopropanol bath for 30 min successively, and subjected to UV-ozone (UVO) treatment for 15 min. A poly(triaryl amine) (PTAA) layer was deposited on the ITO glass by blade-coating the PTAA/toluene solution (5 mg mL$^{-1}$) at a speed of 15 mm s$^{-1}$, then annealing at 70° C. for 10 min. The gap between the blade coater and the substrate was controlled at 100 μm. 5 μL of solution was used for coating a 1.5 cm×1.5 cm ITO substrate. The perovskite layer blade-coating was adjusted from a previous method.[7] the 1.1 M $MAPbI_3$ perovskite ink was prepared by dissolving 1.1 M $PbI_2$, 1.1 M MAI in 1 mL DMF. Other perovskite inks with different compositions, $Cs_{0.05}FA_{0.70}MA_{0.25}PbI_3$ (CFM, with a bandgap of 1.51 eV) and $Cs_{0.2}FA_{0.8}Pb(I_{0.6}Br_{0.4})_3$ (CFPbIBr, with a bandgap of 1.82 eV), were prepared for comparison. Before use, small amounts of additives, i.e. methylammonium hypophosphite (MHP, 0.15 wt %) and L-aphosphatidylcholine (LP, 0.05 wt %), were added to achieve uniform perovskite film coating with good surface coverage.[6] A series of bilateral alkylamino additives, 1,3-diaminopropane (DAP), 1,6-diaminohexane (DAH) and 1,8-diaminooctane (DAO), were dissolved in DMF separately, then added to the as-prepared perovskite ink at an optimized concentration of 0.025 wt %. 5-10 μL of precursor ink was dripped onto the ITO substrate, which was set on a hot plate at 150° C., then swiped linearly by a film applicator at a speed of 7.5 mm s$^{-1}$. After coating, the perovskite films were annealed at 100° C. for 10 min. The bladed coating of all PTAA layers and perovskite films was conducted in an $N_2$-purged glovebox (below 1.0 ppm $O_2$ and $H_2O$). Finally, 25 nm of $C_{60}$ (Nano-C), 8 nm of bathocuproine (BCP), and 80 nm of Cu electrode were sequentially deposited by thermal evaporation to form a complete PSC device.

Device Fabrication for Knife-Assisted Drying Method

Prepatterned ITO/glass substrates were washed with detergent, deionized water, isopropanol, and acetone sequentially and dried in an oven at 60° C. overnight. A PTAA/toluene solution was blade-coated on a UV-ozone-treated ITO/glass substrate at 20 mm/s with a 200-μm coating gap. Then, the perovskite layer was blade-coated with an air knife blowing at room temperature. The solution composition was ~1.0 M $MAPbI_3$ (or 1.3 M $Cs_{0.1}MA_{0.9}Pb(I_{0.9}Br_{0.1})_3$) in a solvent mixture composed of ACN (60%, v/v)/2-ME (40%, v/v) for coating at 99 mm/s for best-performing devices. The molar ratio of DMSO to $MAPbI_3$ was ~20%. 1-α-Phosphatidylcholine, methylammonium chloride, and methylammonium hypophosphite were added into the solution as additives at molar percentages of ~0.025, ~0.8, and ~1.0% to $MAPbI_3$, respectively. Note that the additives are not required for high-speed room-temperature perovskite film coating here but can improve device efficiency. The blade coater gap was 200 to 300 μm. The air knife worked below 20 psi. The as-coated solid film was annealed at 70° C. for several minutes and then at 100° C. for 5 to 20 min. Then, the perovskite film was thermally evaporated with $C_{60}$ (30 nm) and BCP (6 nm). Laser scrubbing was then performed twice before and after electrode deposition to complete the module fabrication. For the modules sent for certification, polydimethylsiloxane antireflection coatings were applied.

Device characterization Scanning electron microscopy (SEM) images were taken by a Quanta 200 FEG environmental scanning electron microscope. X-ray diffraction (XRD) patterns were obtained with a Bruker D8 Discover Diffractometer with Cu Kα radiation (1.5406 Å). The J-V measurement of the devices (voltage scanning rate 0.1 V s$^{-1}$) and the steady photocurrent under maximum power output bias (0.98 V) were recorded with a Keithley 2400 sourcemeter under simulated AM 1.5G irradiation produced by a Xenon lamp based solar simulator (Oriel Sol3A, Class AAA Solar Simulator). The light intensity was calibrated by a silicon reference cell equipped with a Schott visible color KG5 glass filter (Newport 91150V). A non-reflective shadow mask was used to define a 0.08 cm$^2$ active area of the PSCs. External quantum efficiency (EQE) spectra were obtained by a Newport QE measurement kit by focusing a monochromatic light beam with wavelength from 300 nm to 900 nm onto the devices. Photoluminescence (PL) spectra were measured with a Horiba iHR320 Imaging Spectrometer at room temperature. A 532 nm green laser (Laserglow Technologies) with an intensity of 100 mW cm$^{-2}$ was used as the excitation source. Time-resolved photoluminescence (TRPL) data were obtained using a DeltaPro TCSPC Filter Fluorometer with a pulsed laser source at 406 nm (Horiba NanoLED 402-LH; pulse width below 200 ps, 20 pJ per pulse, approximately 1 mm$^2$ spot size), and the signal was recorded using time-correlated single photon counting (TCSPC). Atomic force microscopy (AFM) measurements were conducted on an Asylum Research MFP3D Atomic Force Microscope. Transient photovoltage (TPV) decay was measured under different light intensities and recorded by a 1 GHz Agilent digital oscilloscope. The FTIR spectra (4000 to 500 cm$^1$) were recorded on a PerkinElmer FTIR spectrometer with powders scratched from several pieces of samples.

Example 1: Bilateral Amine Passivation Molecules

Figure 1C:
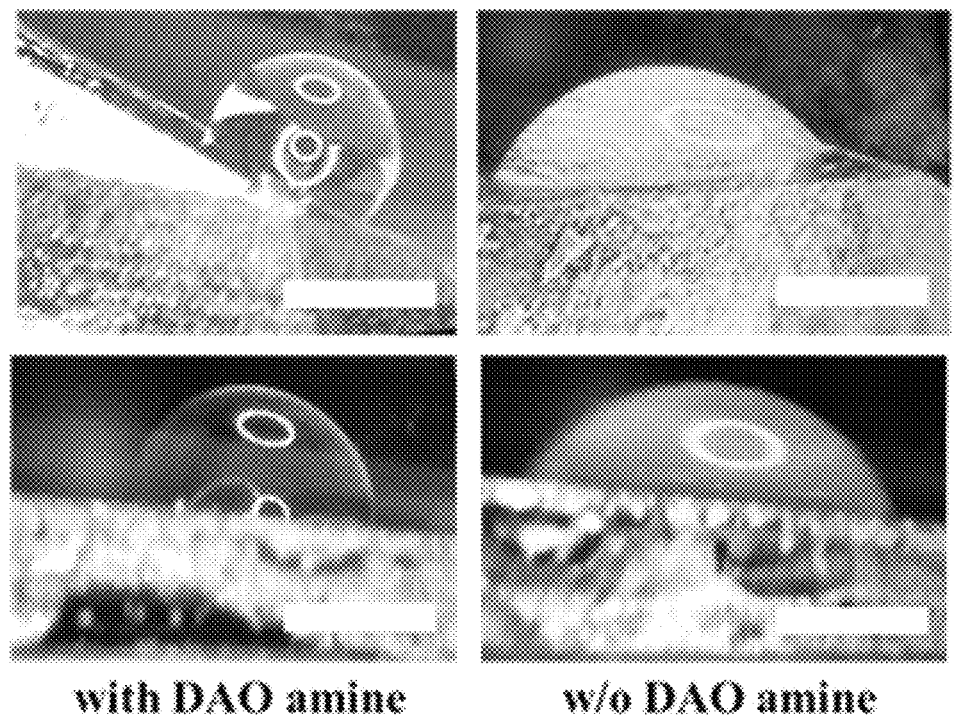
FIG. 1C shows a contact angle measurement of a water droplet on $MAPbI_3$ single crystals (top row) and $MAPbI_3$ thin films (bottom row) with or without incorporated BAA additive. The scale bar for each image is 5 cm.

Several bilateral alkylamino (BAA) compounds were first investigated, featuring three-, six- or eight-carbon chains with —NH$_2$ tails at both ends, i.e., 1,3-diaminopropane (DAP), 1,6-diaminohexane (DAH) and 1,8-diaminooctane (DAO). The chemical structures of the different BAA additives are shown in FIG. 1A. The additives were selected with the objective of passivating crystallographic defects at the perovskite grain surface by forming coordination bonds between under-coordinated Pb$^{2+}$ ions and —NH$_2$ tails, as shown schematically in FIG. 1B. In addition, the —NH$_2$ tails can occupy A-site vacancies at the MAPbI$_3$ grain surfaces. The bilateral amine compounds tend to anchor onto the perovskite grain surface with both —NH$_2$ tails, thereby exposing the linking hydrophobic carbon chain and forming a moisture-repelling barrier on MAPbI$_3$ grains. This is evidenced by the increased contact angle of water droplets on the BAA-modified perovskite films, as shown in FIG. 1C (left column). The BAA-modified perovskite films are water insoluble, despite both DAP and the perovskite materials, themselves, being water soluble. This physical change is indicative of strong bonding of both —NH$_2$ groups to the perovskite. In contrast, control perovskite films quickly dissolved, coloring the water droplets yellow (FIG. 1 C, right column). BAAs starting with at least three carbon atoms were selected so that the NH$_2$ groups would have sufficient length to bridge the two defective sites and form a hydrophobic moisture barrier on the film surface.

Figure 24:
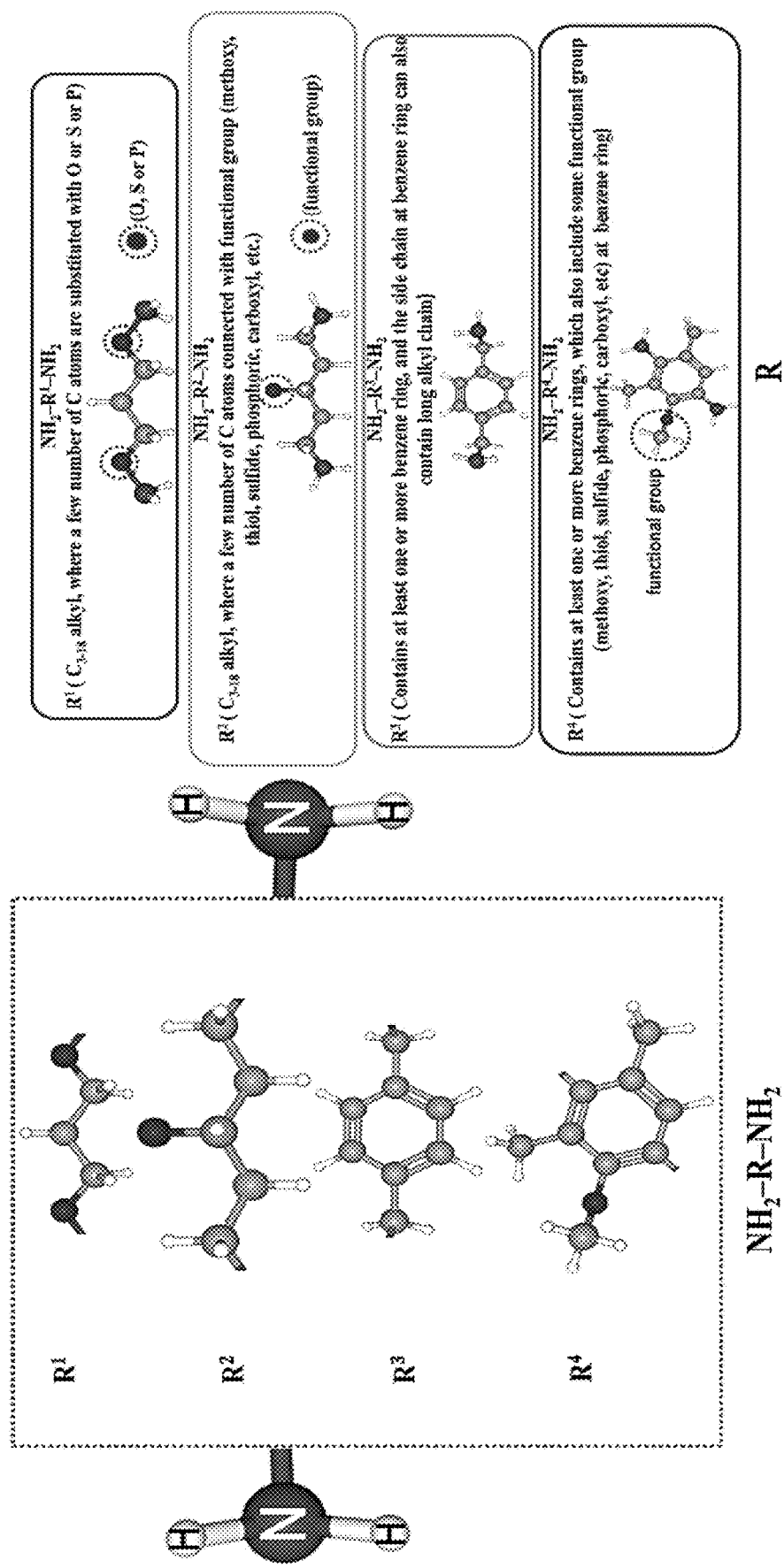
FIG. 24 shows chemical structures of substituted passivation molecules with a structure of "NH$_2$—R—NH$_2$."

The concept of the bilateral amine is not limited to bilateral amines having a linear carbon chain core. In one aspect, an exceptionally long carbon chain may impair charge transport properties when the additive anchors itself onto the perovskite surface, creating gaps between adjacent grains or at interfaces with other functional layers. As such, other types of bilateral amines can be employed, comprising benzene rings, fused aryl rings, or amine-functionalized 2D conductive graphene sheets (FIG. 1E). The conjugation offered by benzene may provide greater conductivity due to the delocalization of its molecular electron orbitals. This would allow for effective passivation of the perovskite's surface defects by the —NH$_2$ groups, without sacrificing the charge transport properties from grains-to-grains and at corresponding interfaces. Several other potential bilateral amine structures are provided in FIG. 24. In one aspect, carbon atoms of the alkyl chain may be substituted for "O," "P," or "S" atoms, which could exhibit strong chemical bonding with B$^{2+}$ site perovskite ions, such as Pb$^{2+}$, and also provide robust molecule passivation. Functional group substituents on the alkyl chain may also make synergistic contributions for defect passivation. Aryl groups, bridged by alkyl chains connected to two amine tails, such as NH$_2$—CH$_2$—R$^3$—CH$_2$—NH$_2$ where R$^3$ is benzene, may improve the electronic properties of perovskite films for better charge transport after passivation. Connecting each —NH$_2$ group to a benzene ring through a CH$_2$ group may allow the amine tails to rotate for further enhanced passivation. Substituting the benzene ring with multiple functional groups may also allow for additional passivation. The selected bilateral amines provide a solution for achieving the trade-offs between defect passivation and conductivity of conventional additives in applications involving photovoltaic devices.

Example 2: Ink and Film Formulation

Figure 1D:
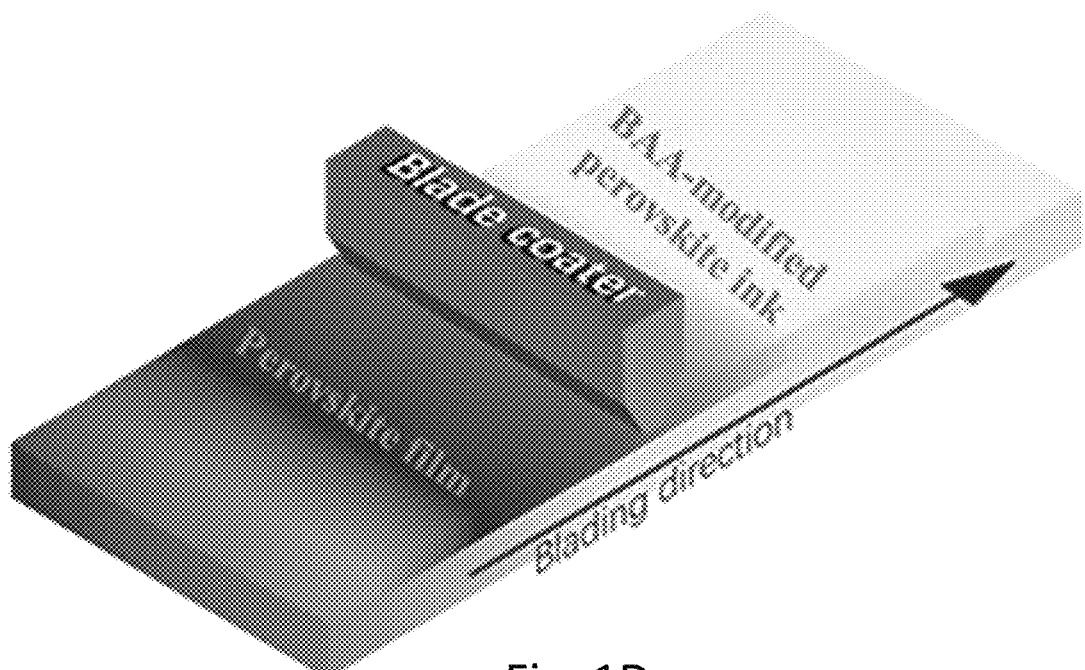
FIG. 1D shows the blading process of the perovskite film.
Figure 1E:
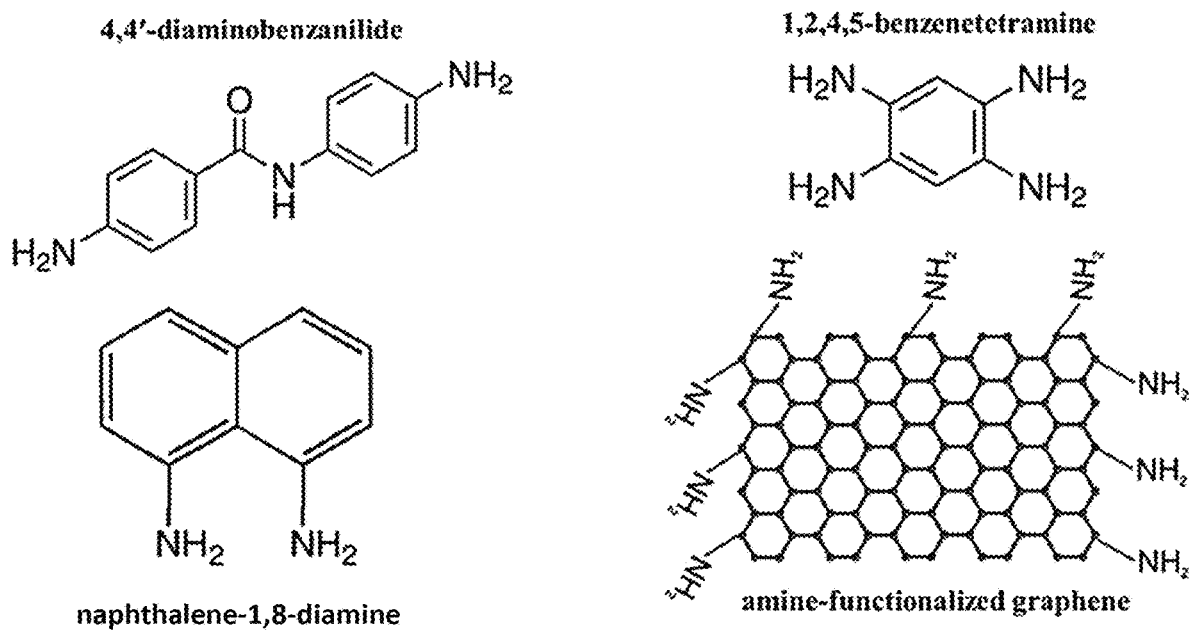
FIG. 1E shows representative benzene ring/fused benzene ring or amine-functionalized graphene-based BAA analogues.
Figure 2:
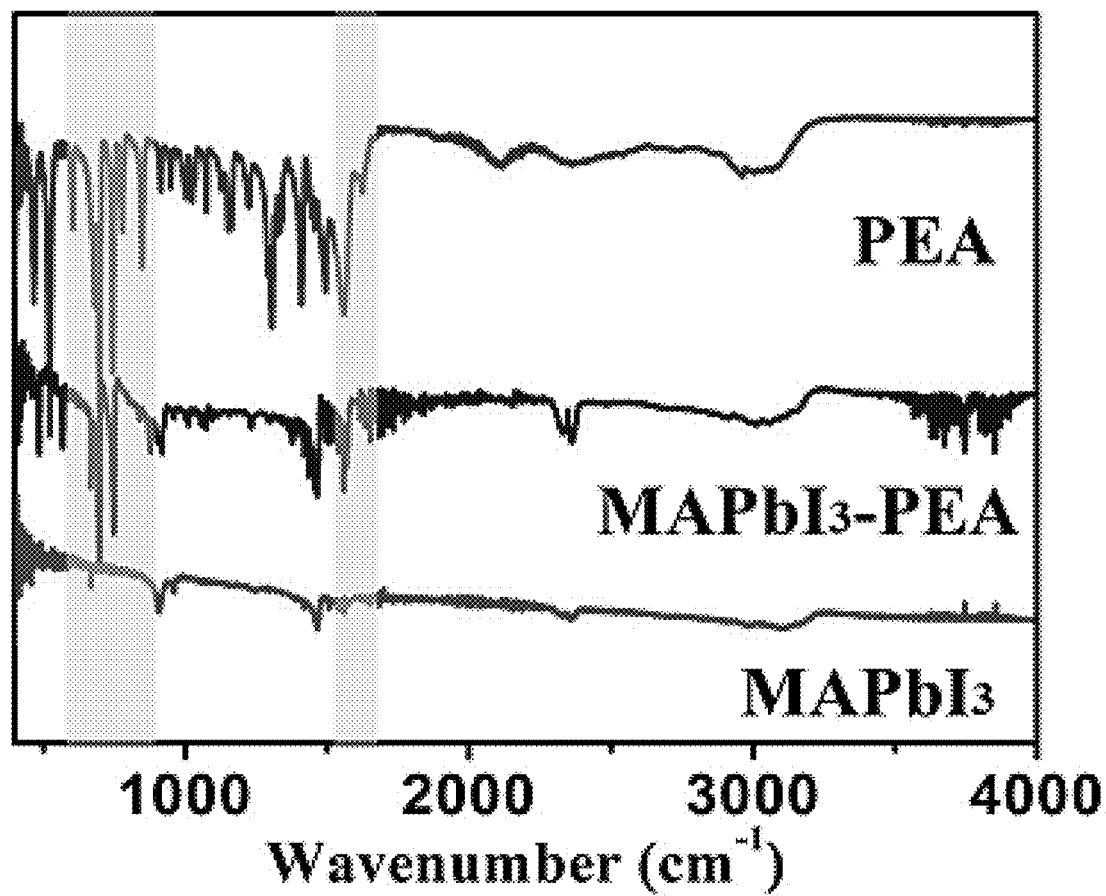
FIG. 2 shows FTIR spectra of amine-incorporated perovskite materials. The alkyl and ammonium groups in $MAPbI_3$ overlap with those in BAA (i.e. DAP). The analogous primary amine, phenethylamine (PEA), was used to resolve the signal overlap and investigate whether the amine additive could exist in perovskite films after annealing. The characteristic spectral features of PEA are highlighted (aromatic C—H bending at ~680-860 $cm^{-1}$ and aromatic C=C bending at ~1560 $cm^{-1}$). The same absorption feature is observed in $MAPbI_3$—PEA, indicating the presence of the amine additive in the resultant perovskite films.
Figure 3:
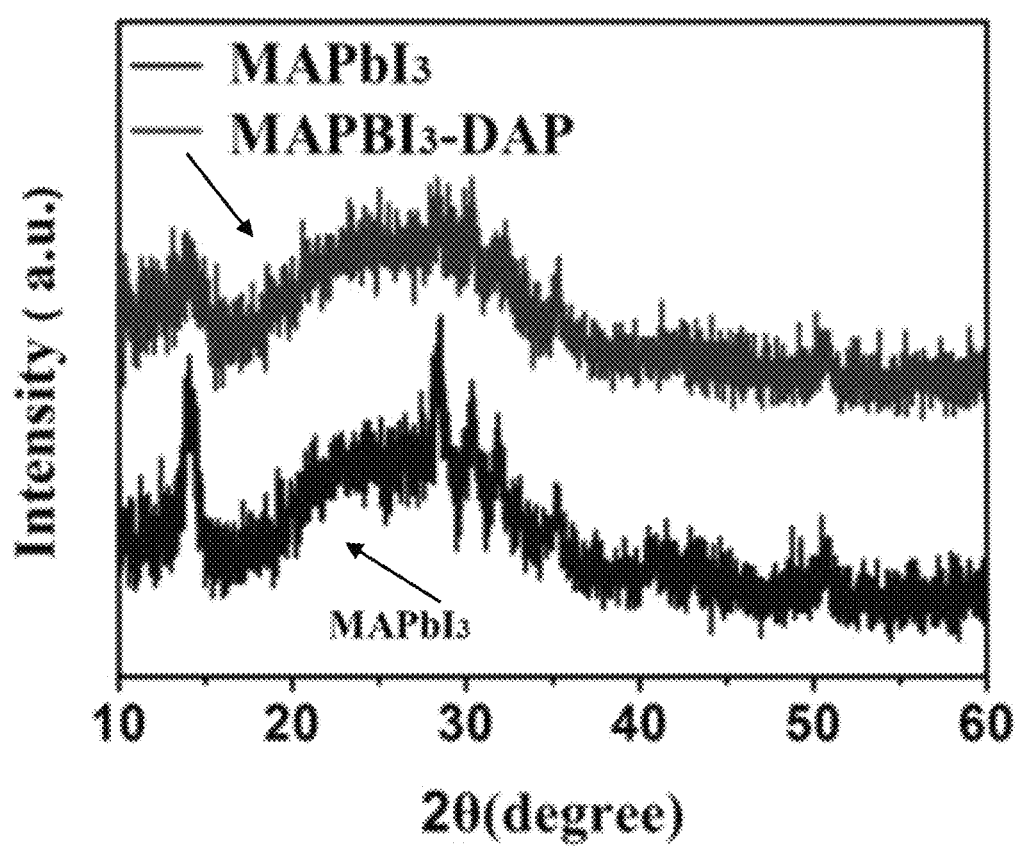
FIG. 3 shows XRD patterns of spin-coated $MAPbI_3$ and $MAPbI_3$-DAP films before annealing.
Figure 4A:
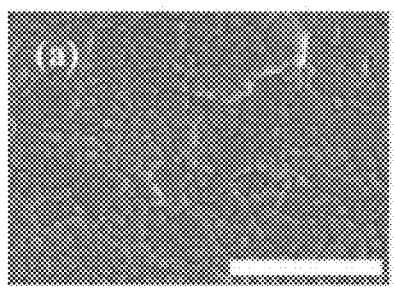
FIG. 4A shows a SEM image of a $MAPbI_3$-DAP film with a DAP concentration of 0.00625 wt %. The scale bar is 1 μm.
Figure 4B:
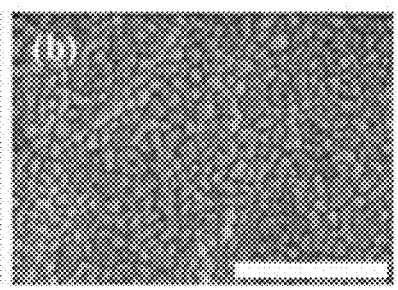
FIG. 4B shows a SEM image of a $MAPbI_3$-DAP film with a DAP concentration of 0.0125 wt %. The scale bar is 1 μm.
Figure 4C:
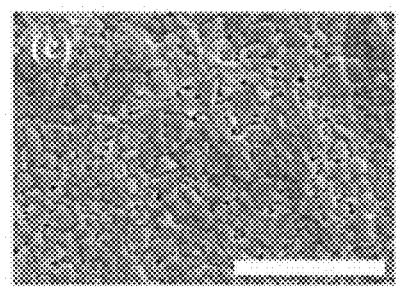
FIG. 4C shows a SEM image of a $MAPbI_3$-DAP film with a DAP concentration of 0.05 wt %. The scale bar is 1 μm.

The perovskite films were prepared by blade-coating a BAA-modified perovskite ink over a pre-heated ITO glass substrate,[7] as illustrated in FIG. 1D. The BAA molecules have low boiling points; as such, the presence of the BAA molecules following annealing of the perovskite films was investigated. DAP was used as a representative BAA additive to study its behavior with MAPbI$_3$ and influence on perovskite film formation. Fourier transform infrared (FTIR) spectra in FIG. 2 indicate that the primary amine analogue was still present within the bladed perovskite films after annealing at relatively high temperatures. Without wishing to be bound by theory, since DAP is a liquid at room temperature, it is understood that a strong interaction between DAP and the perovskite allows for the DAP to be retained in the perovskite film after annealing. Furthermore, the strong interaction of the DAP molecules with the MAPbI$_3$ precursors slows the crystallization and formation of the MAPbI$_3$ film. Before annealing, the formed MAPbI$_3$ film with only 0.025 wt % DAP additive in the ink solution retained X-ray diffraction (XRD) amorphous characteristics, while the pure MAPbI$_3$ film showed distinct peaks FIG. 3. Without wishing to be bound by theory, it is understood that DAP functions as a Lewis base due to its amino groups, with coordination bonds formed by sharing the N lone electron pair with the empty 6p orbital of $Pb^{2+}$ [25, 29, 30] This bond coordination could retard the reaction of MAI and $PbI_2$, as suggested by the reduced grain size of DAP-modified $MAPbI_3$ thin films with increasing amounts of DAP (FIG. 4A-FIG. 4C). Nevertheless, the slower crystallization enabled the formation of highly uniform and compact perovskite films, thus reducing the device leakage current.[25]

Example 3: XRD Analysis of Perovskite Films

Figure 5:
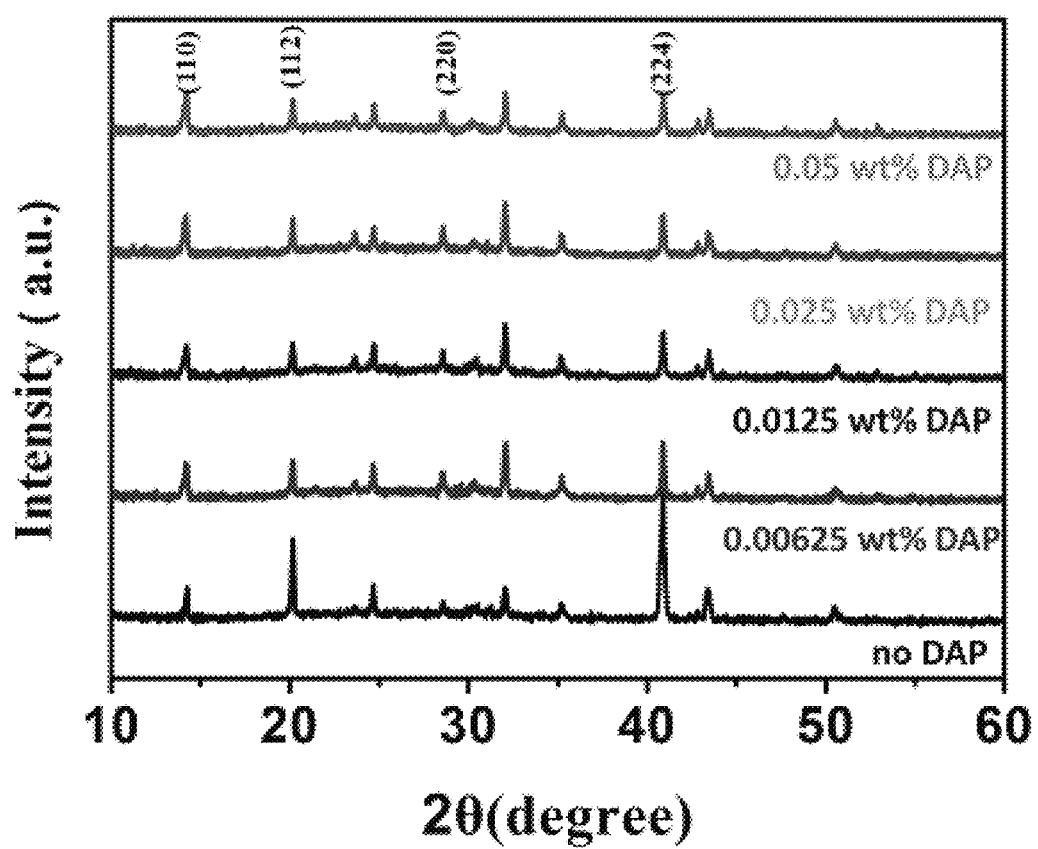
FIG. 5 shows XRD patterns of $MAPbI_3$ films with various concentrations of DAP. The intensity of the main diffraction (110) peak gradually enhanced with increasing DAP content, suggesting that the DAP additive influenced the crystal growth orientation.

To determine whether DAP molecules entered the crystal structure of $MAPbI_3$, XRD patterns of $MAPbI_3$ films after annealing with different DAP concentrations (0-0.05 wt %) in the perovskite precursor inks were analyzed. As shown in FIG. 5, all observed XRD reflections were indexed as $MAPbI_3$ characteristic peaks.[31] There is no noticeable shift of peaks towards lower angles, indicating no significant unit cell expansion in the perovskite lattice or incorporation of DAP into the $MAPbI_3$ crystal structure.[24, 32] Owing to the large molecular size of DAP, it is understood that the amine additives prefer to stay at the periphery of the perovskite grains, with —$NH_2$ terminal groups limited to interacting with under-coordinated Pb ions exposed at the surface.

Example 4: Morphology Investigation of Perovskite Films

Figure 7A:
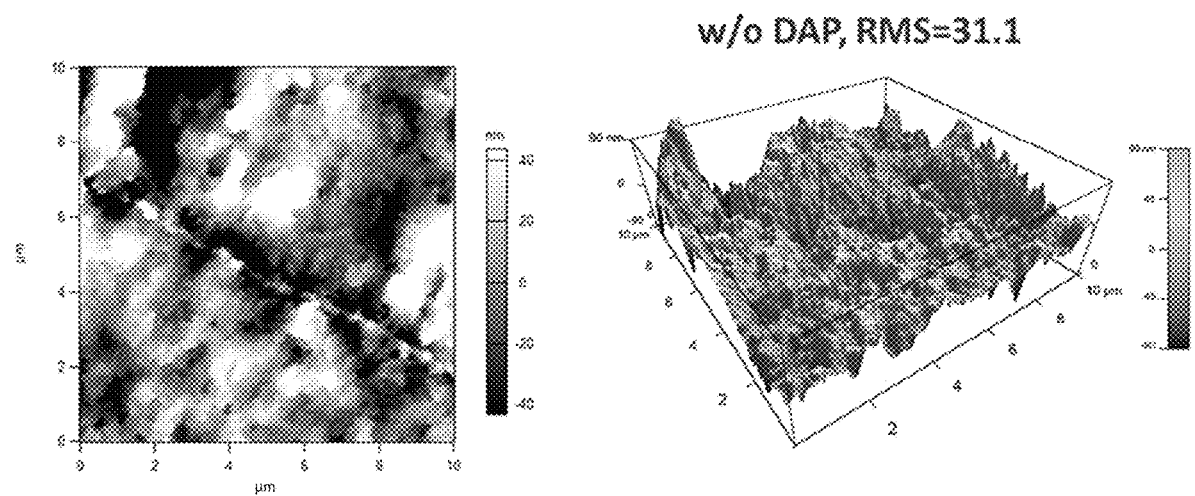
FIG. 7A shows an AFM image of the surface roughness of $MAPbI_3$.
Figure 7B:
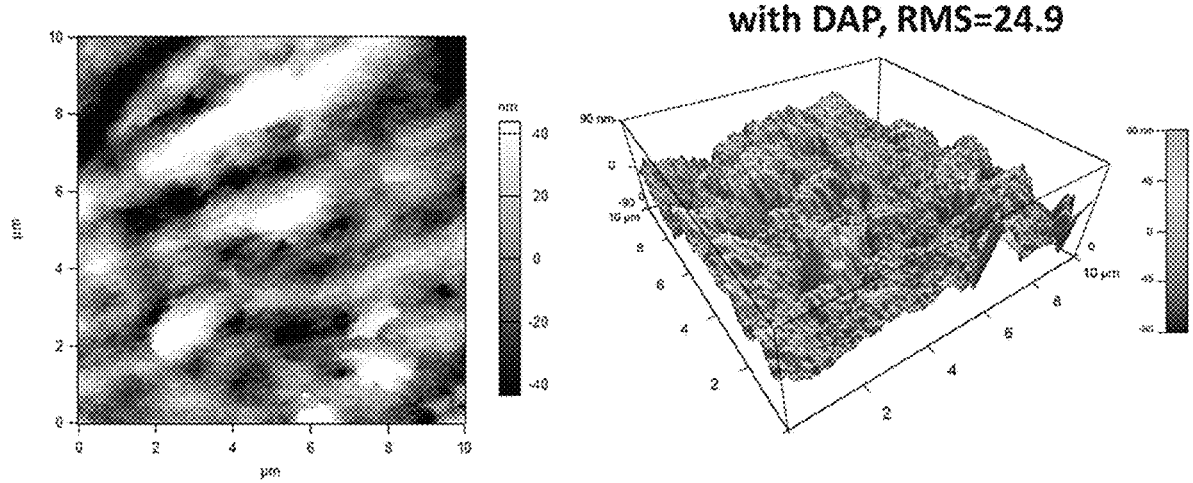
FIG. 7B shows an AFM image of the surface roughness of $MAPbI_3$-DAP (0.025 wt % DAP added).

The $MAPbI_3$-DAP film (0.025 wt % DAP) showed a more uniform and compact microstructure, with ultrafine grains and smooth surface features, compared with the control $MAPbI_3$ film (FIG. 6A-FIG. 6D). The control film had a grain size of approximately 300-500 nm and a root-mean-square (RMS) surface roughness of 31.1 nm from AFM scanning (FIG. 7A and FIG. 7B). DAP modification decreased the grain size to approximately 100-300 nm and reduced RMS surface roughness to 24.9 nm. The improved uniformity and smoothness of the bladed perovskite films was attributed to DAP modulating the crystallization of $MAPbI_3$. Without wishing to be bound by theory, it is understood that the bilateral —$NH_2$ groups strongly interact with neighbouring $MAPbI_3$ grains and link them together, forcing the crystals to grow in contact with each other more tightly, thus improving the compactness and smoothness of the bladed perovskite layer.

Figure 6A:
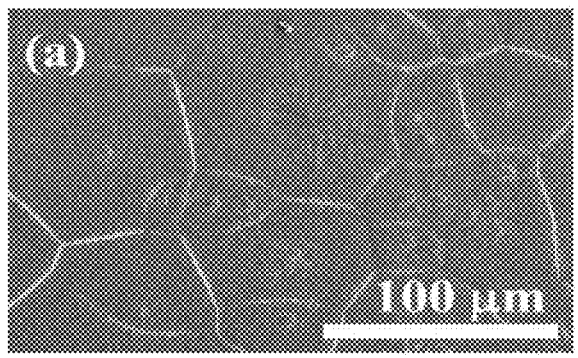
FIG. 6A shows a SEM image of $MAPbI_3$.
Figure 6B:
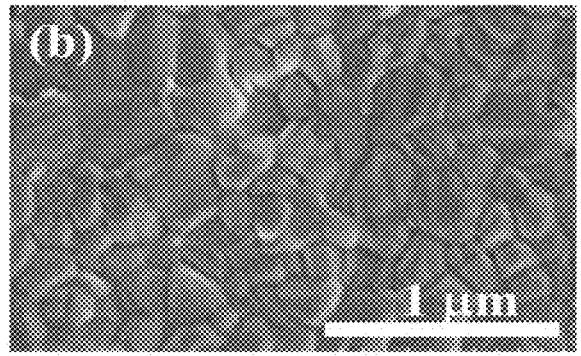
FIG. 6B shows a SEM image of $MAPbI_3$.
Figure 6C:
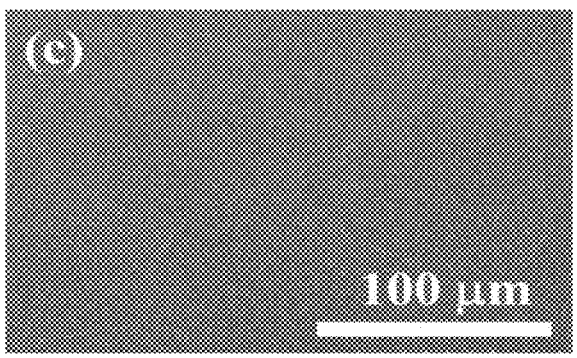
FIG. 6C shows a SEM image of $MAPbI_3$-DAP (0.025 wt % DAP added).
Figure 6D:
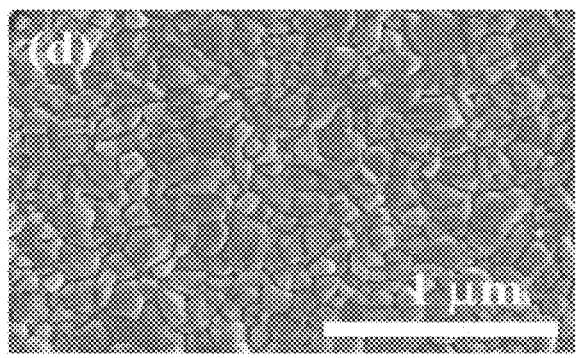
FIG. 6D shows a SEM image of $MAPbI_3$-DAP (0.025 wt % DAP added).
Figure 6E:
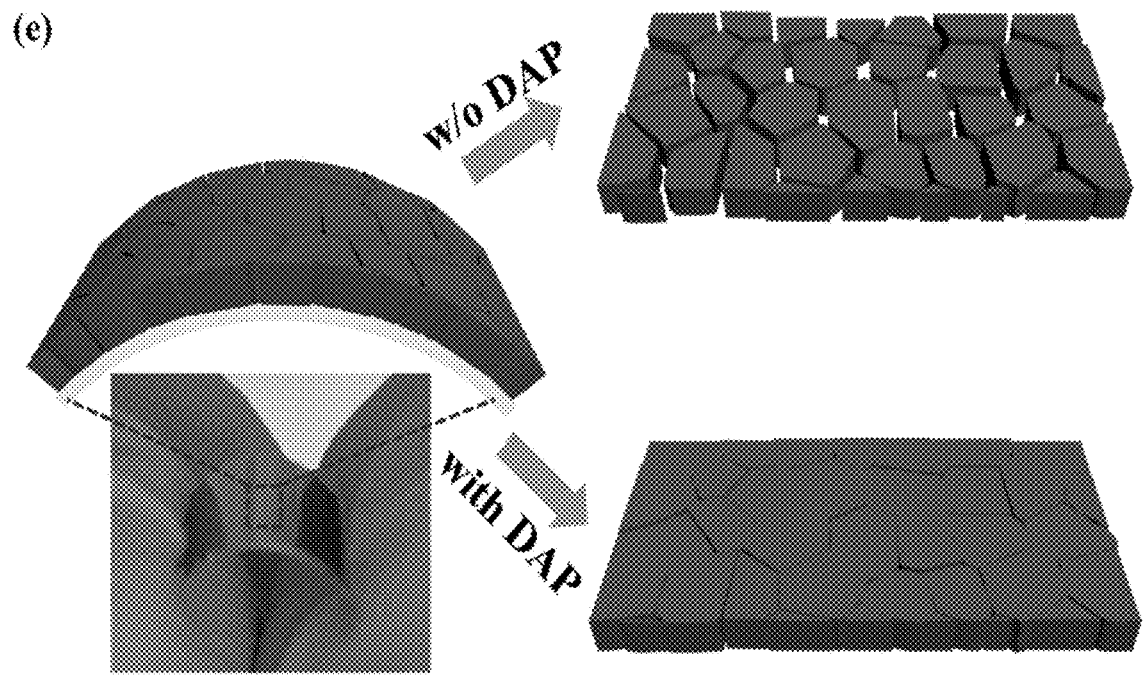
FIG. 6E shows the morphology change of the perovskite films deposited on a flexible ITO-PET substrate after the bending test.
Figures 6F, 6G:
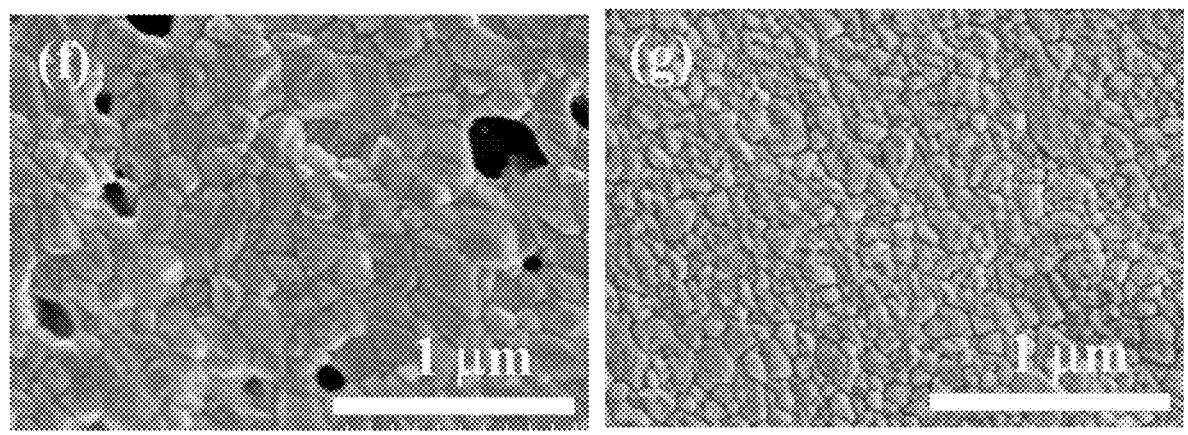
FIG. 6F shows a SEM image of a $MAPbI_3$ film after bending.
FIG. 6G shows a SEM image of a $MAPbI_3$-DAP film after bending.

To examine how DAP reinforces the grain boundaries, the perovskite films were subjected to mechanical stress and electron beam damage testing. Films were fabricated on flexible ITO/PET (indium tin oxide films on polyethyleneterephthalate) substrates, then bent into a curved shape with a radius of 1 cm for several cycles. As shown in FIG. 6E through FIG. 6G, the $MAPbI_3$-DAP film remained intact after bending, while many pinholes were generated in the control $MAPbI_3$ film. The cracks after bending generally appeared at grain boundaries under tensile strain along the in-plane direction. It is understood that the improved film bending capability was predominately a result of the bridging of neighboring grains by the DAP additives with —$NH_2$ groups at both ends, which acted as a glue between grains. In addition, the weak interaction between the perovskite and the underlying PTAA layer may cause the peeling of the perovskite grains, and result in the generation of pin-holes as shown in FIG. 6F. The —$NH_2$ functional group of DAP can participate in hydrogen bonding with the underlying PTAA layer to improve adhesion between the perovskite and HTL, thus reducing the peeling-off possibility of the perovskite film during bending. Overall, the improved passivation of grain boundaries and more compact film with fewer pinholes after bending correlates with reinforced molecular bonding between DAP, perovskite, and the underlying layers.

Figure 6H:
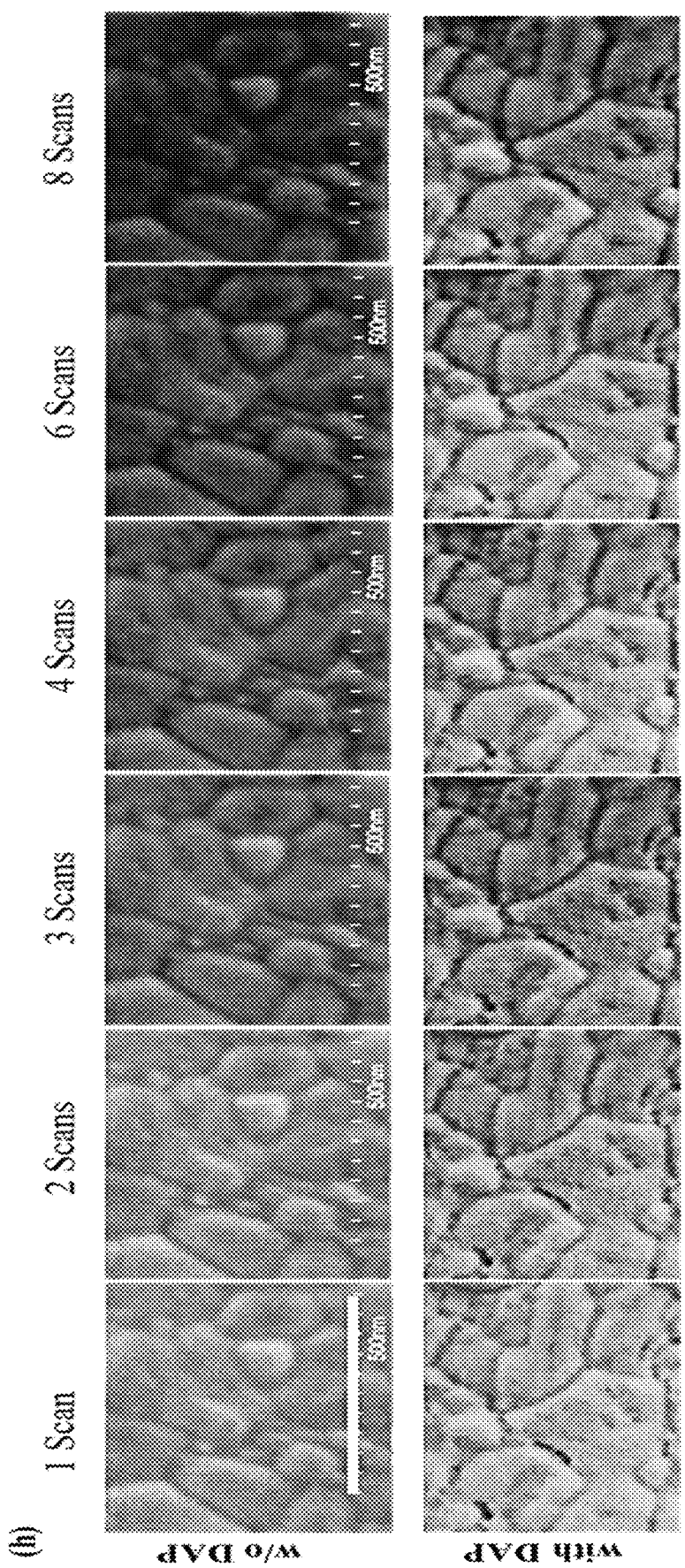
FIG. 6H shows a series of SEM images depicting the degradation of grain boundaries for $MAPbI_3$ and $MAPbI_3$-DAP films after exposure to an electron beam for several scanning cycles during SEM characterization. The scale bar for each image is 500 nm.
Figure 8:
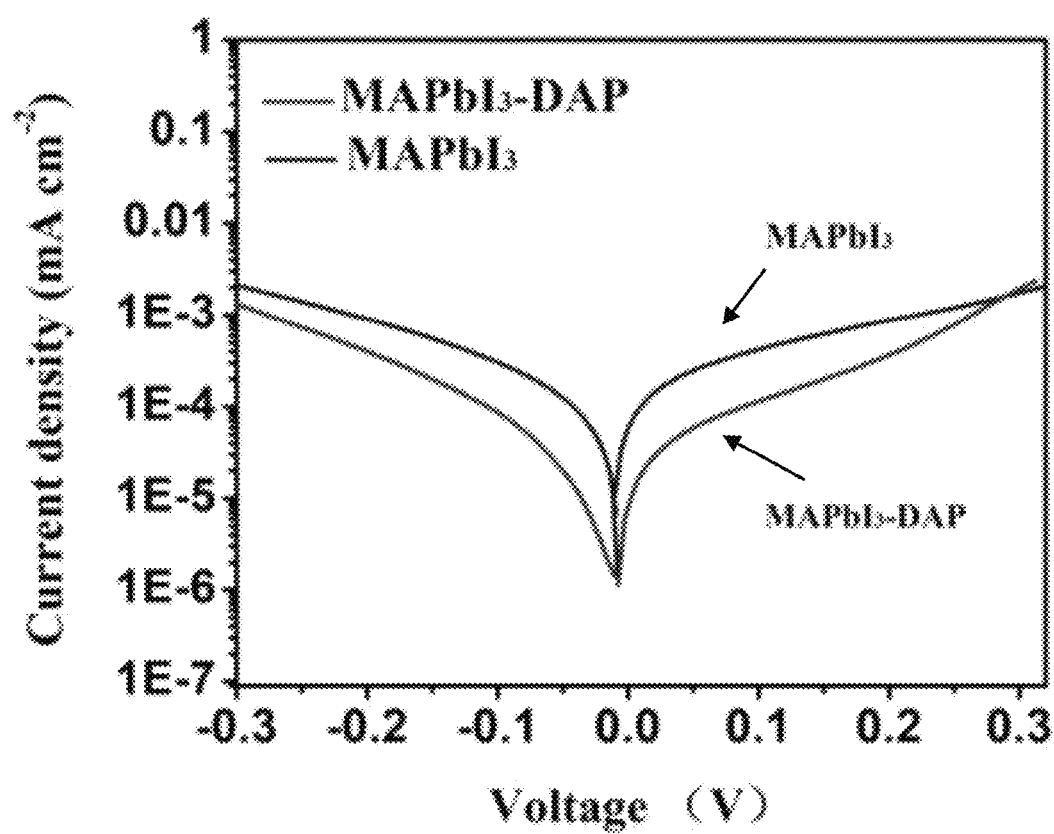
FIG. 8 shows a plot of dark current densities of PSCs with or without DAP additive.
Figure 9:
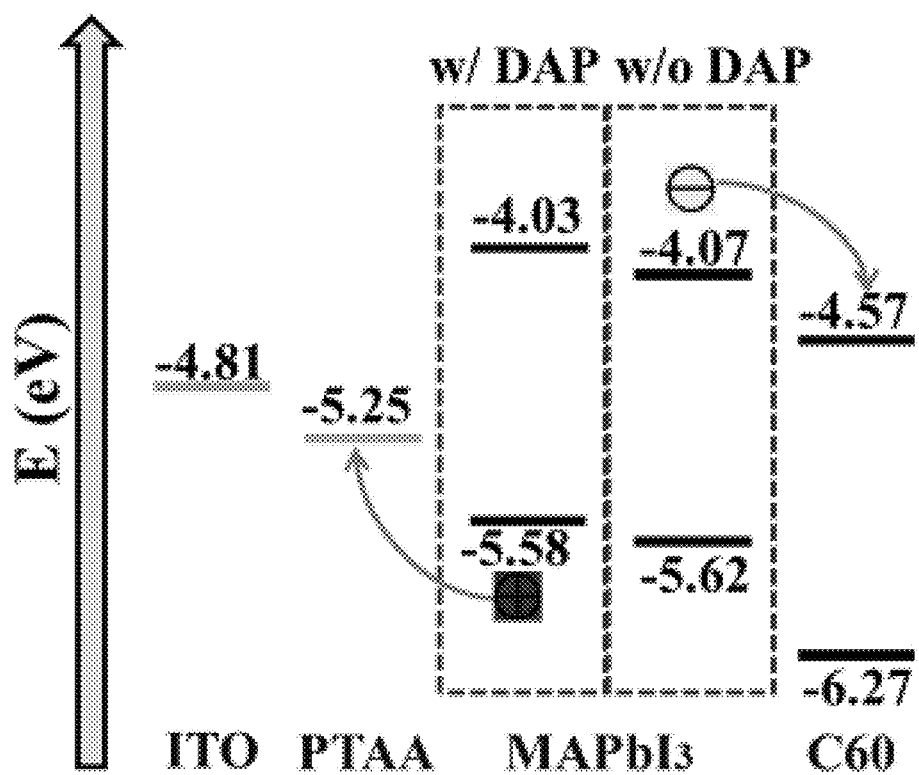
FIG. 9 shows an energy level diagram depicting hole extraction from the perovskite to PTAA, and electron extraction from perovskite to C60.

An electron beam can damage perovskite materials; cracks are often generated first at grain boundaries.[33, 34] A high energy electron beam with a voltage of 1 kV and a current of 15 pA in an SEM was used to accelerate grain boundary degradation; the settings were much higher than required for regular SEM observations. As seen in FIG. 6H, the control $MAPbI_3$ film exhibited noticeable cracks after the sixth consecutive scan (the observed area was exposed for approximately 15 s per scan), while the $MAPbI_3$-DAP film retained dense grain packing even after exposure to the high energy e-beam. These two results indicate that DAP reinforces grain boundaries, which are known to be the weakest spots in polycrystalline perovskite films. Additionally, $MAPbI_3$-DAP devices had greatly reduced dark current or leakage current densities compared to $MAPbI_3$ cells (FIG. 8), again confirming the compactness of the $MAPbI_3$-DAP films. The energy levels of $MAPbI_3$ films prepared in the absence or presence of DAP were studied by ultraviolet photoelectron spectroscopy (UPS). Overall, energy levels were negligibly changed by the incorporation of very low concentrations of DAP, i.e. 0.025 wt % (FIG. 9 and Table 1).

TABLE 1

Summarized work functions, valence band maximum (VBM), and conduction band minimum (CBM) positions for different functional layers in the PSCs.

| Layers | Work function/eV | VBM/eV | CBM/eV |
|---|---|---|---|
| ITO | −4.81 | N/A | N/A |
| PTAA | −4.55 | −5.25 | N/A |
| $MAPbI_3$ | −4.28 | −5.62 | −4.07 |
| $MAPbI_3$-DAP | −4.50 | −5.58 | −4.03 |
| C60 | −5.25 | −6.27 | −4.57 |

Example 5: Photovoltaic Performance

Figure 10A:
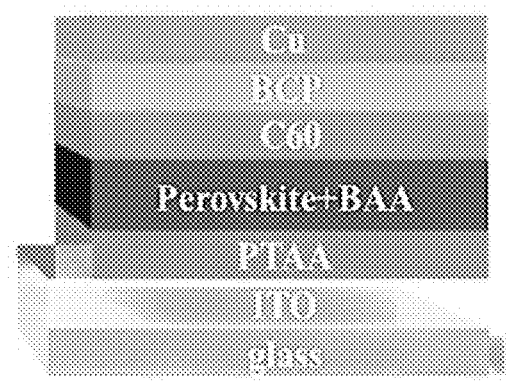
FIG. 10A shows a schematic of an inverted p-i-n device structure described herein.
Figure 11A:
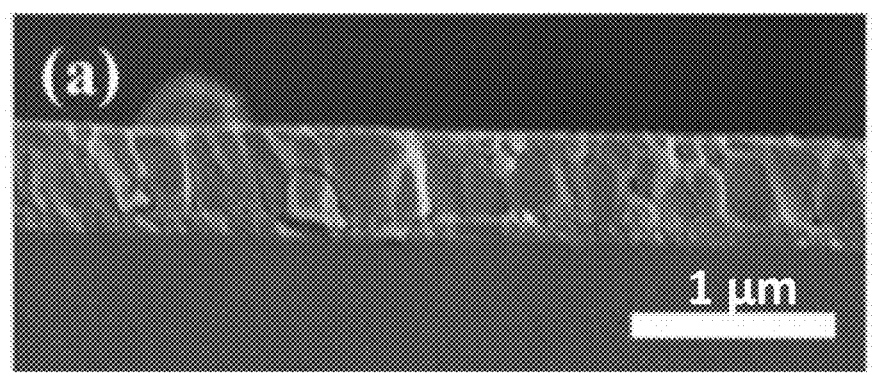
FIG. 11A shows a cross-sectional SEM image of a $MAPbI_3$ film. The scale bar is 1 μm.
Figure 11B:
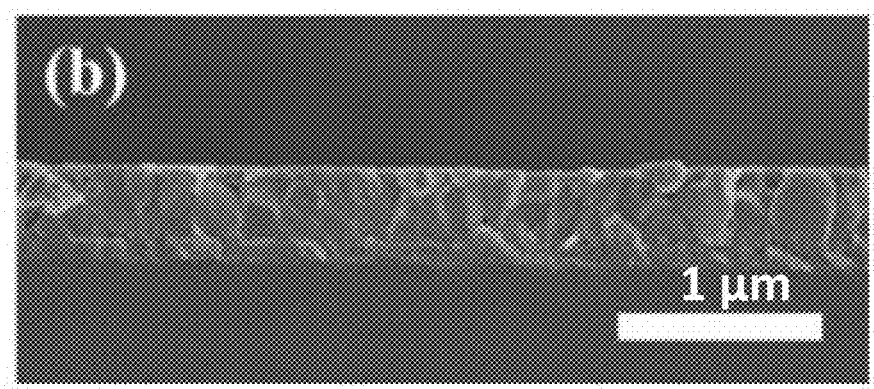
FIG. 11B shows a cross-sectional SEM image of a $MAPbI_3$-DAP film. The scale bar is 1 μm.

PSCs were fabricated as inverted p-i-n devices using perovskite films with or without DAP additives (FIG. 10A). A typical PSC was assembled with a structure of ITO/PTAA/BAA-modified perovskite/$C_{60}$/BCP/Cu, where an approximately 500 nm thick homogeneous and pinhole-free perovskite film (FIG. 11A and FIG. 11B) was sandwiched between the hole transport layer of poly(triaryl amine) (PTAA) and the electron transport layer of $C_{60}$, featuring a planar heterojunction configuration. The photovoltaic performances of PSCs based on $MAPbI_3$ films incorporating different DAP concentrations are given in Table 2. A DAP additive concentration of 0.025 wt % appeared to be most effective. Less DAP content caused insufficient passivation. However, excess DAP in the $MAPbI_3$ resulted in worse film morphology, which could be ascribed to aggregated DAP molecules impairing the perovskite crystal growth.[24]

TABLE 2

Photovoltaic parameters of PSCs using bladed $MAPbI_3$ films with different amounts of DAP additives incorporated in ink solution

| DAP concentration (wt %) | $J_{sc}$/mA $cm^{-2}$ | $V_{oc}$/V | η/% | Average η/% | FF/% |
|---|---|---|---|---|---|
| 0 | 22.0 | 1.08 | 18.4 | 16.37 ± 0.78 | 77.5 |
| 0.00625 | 22.4 | 1.12 | 20.0 | 18.56 ± 0.50 | 79.6 |
| 0.0125 | 22.5 | 1.14 | 20.6 | 19.02 ± 0.42 | 80.5 |

TABLE 2-continued

Photovoltaic parameters of PSCs using bladed MAPbI$_3$ films with different amounts of DAP additives incorporated in ink solution

| DAP concentration (wt %) | J$_{sc}$/mA cm$^{-2}$ | V$_{oc}$/V | η/% | Average η/% | FF/% |
|---|---|---|---|---|---|
| 0.025 | 22.5 | 1.18 | 21.7 | 20.53 ± 0.38 | 81.7 |
| 0.05 | 21.8 | 1.10 | 18.9 | 16.05 ± 0.88 | 78.7 |

[*] data for average PCE (η) were calculated from at least 30 devices.

Figure 10B:
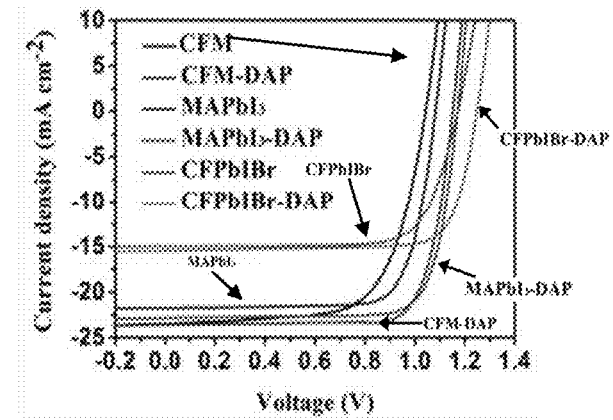
FIG. 10B shows J-V curves of PSCs based on different perovskite compositions in the absence or presence of DAP amine additive.
Figure 28A:
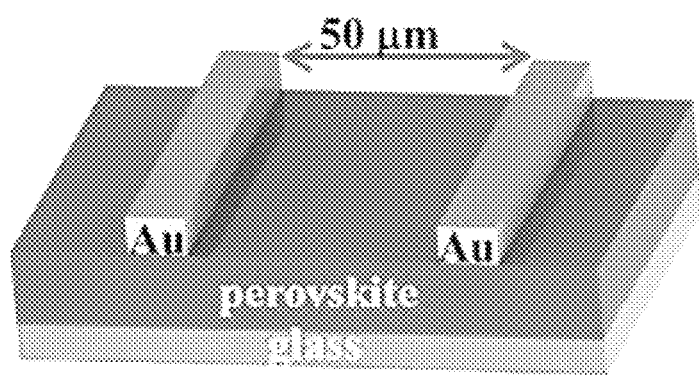
FIG. 28A shows the geometry of a lateral device fabrication. The perovskite films were 500 nm thick, with 1 mm-wide gold electrodes.
Figure 28B:
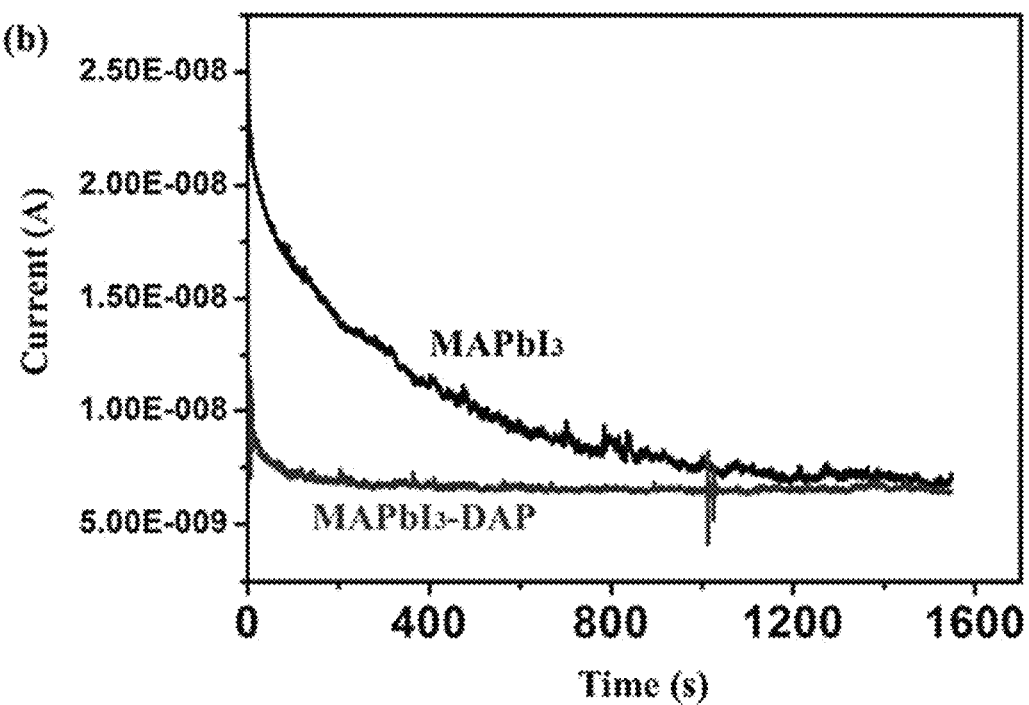
FIG. 28B shows a plot of the current response of a lateral device as a function of time for devices based on MaPbI$_3$ or MAPbI$_3$-DAP films.

The J-V curves of the PSCs with and without DAP are shown in FIG. 10B, while the extracted device parameters are summarized in Table 3. The PSCs based on the pristine MAPbI$_3$ thin film showed a typical PCE of 18.6% with a short-circuit density (J$_{sc}$) of 22.1 mA cm$^{-2}$, V$_{oc}$ of 1.10 V and fill factor (FF) of 76.4%. For the MAPbI$_3$-DAP device, the PCE increased to 21.7%, while the V$_{oc}$ and FF were significantly enhanced to 1.18 V and 81.7%, respectively. It is worthwhile noting that the ideal concentration for all three BAA additives (i.e. DAP, DAH and DAO) was about 0.025 wt %. The DAP-incorporated PSC showcased the overall best performance (a PCE of 21.7%) when compared with the DAH-based device (a PCE of 20.8%) or the DAO-based cell (a PCE of 20.3%). These differences in performance can be attributed to the moderate length of the carbon chains in DAP for good interactions with the perovskite films. During film formation, the DAP can be expelled to the film surface. Too long carbon chains may potentially impair the charge transport from the perovskite to the ETL. Hence, the carbon chain length of the BAA additive is a factor to consider when balancing the defect passivation and charge collection and thus effectively improving the PSC device performance.

passivation and ion migration suppression resulted from DAP additive incorporation (FIG. 28A and FIG. 28B).

TABLE 4

Photovoltaic parameters of PSCs based on MAPbI$_3$-DAP film measured under AM1.5G illumination in different scan directions.

| PSCS | Scan directions | J$_{sc}$/mA cm$^{-2}$ | V$_{oc}$/V | η/% | FF/% |
|---|---|---|---|---|---|
| MAPbI$_3$-DAP | reverse | 22.7 | 1.12 | 21.0 | 82.8 |
|  | forward | 22.7 | 1.12 | 20.8 | 81.4 |

Figure 13:
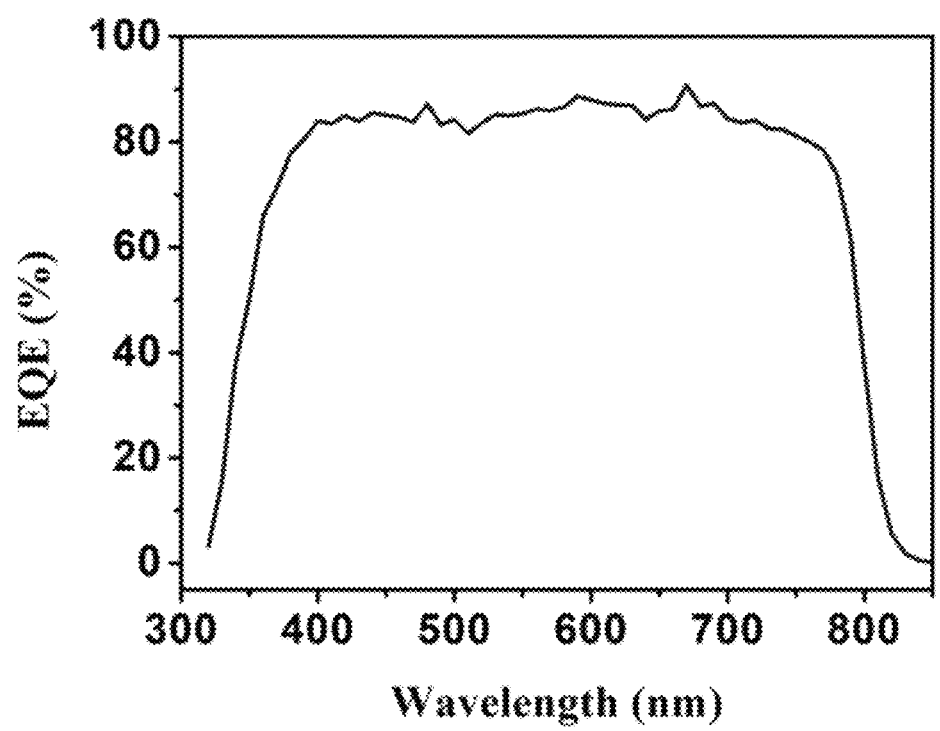
FIG. 13 shows an EQE spectrum of a PSC based on a CFM-DAP film, showing a response onset of 821 nm corresponding to an Eg of 1.51 eV.

The universality of the BAA passivation effect was examined by adding the DAP additive to perovskite inks of different compositions and bandgaps ranging from 1.51 eV to 1.82 eV (FIG. 10B and Table 3). Enhanced V$_{oc}$, FF and device performance were observed for all tested perovskite compositions containing DAP. This result highlights the effectiveness and versatility of employing the bilateral —NH$_2$ amines for defect passivation and performance enhancement. Notably, the PSCs based on Cs/FA/MA mixed cation perovskite (CFM) with an optical bandgap of 1.51 eV (determined from the external quantum efficiency (EQE) spectrum edge of 821 nm in FIG. 13) with DAP passivation had a high V$_{oc}$ of 1.16 V, corresponding with a V$_{oc}$ deficit of 0.35 V.

Figure 10C:
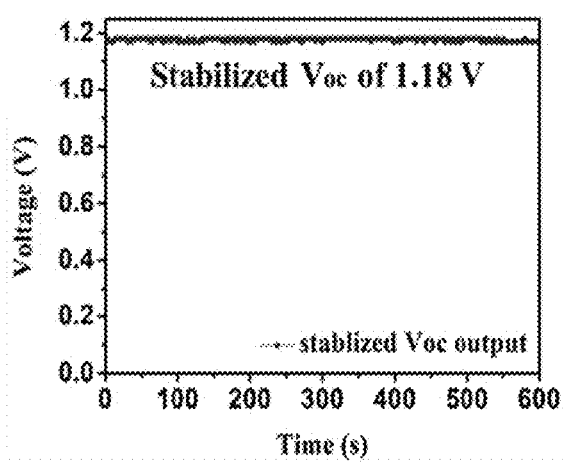
FIG. 10C shows stabilized $V_{oc}$ of $MAPbI_3$-DAP as a function of time.
Figure 14:
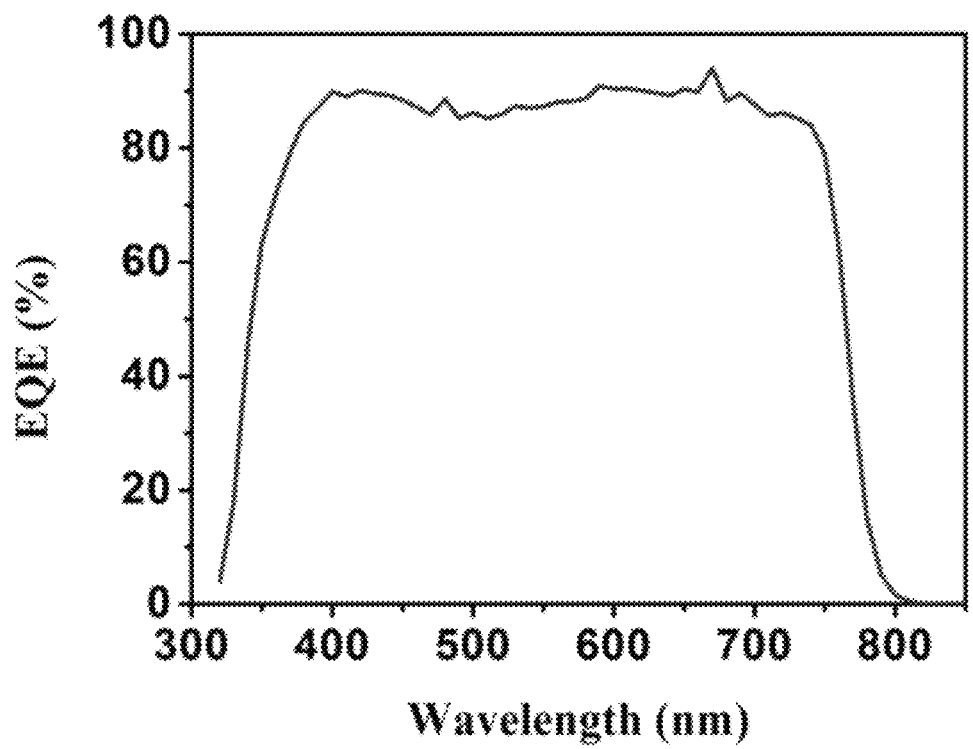
FIG. 14 shows an EQE spectrum of the champion PSC based on the $MAPbI_3$-DAP film.

MAPbI$_3$-DAP based devices demonstrated good performance. The large V$_{oc}$ of 1.18 V for MAPbI$_3$-DAP was confirmed by measuring the stabilized Vo, for 10 min (FIG. 10C). In turn, this device had a low Vo, deficit of 0.37 eV. FIG. 14 shows the EQE spectrum of the champion PSC

TABLE 3

Photovoltaic parameters of PSCs employing different perovskite layers prepared with various compositions and ink formulations under 1 sun illumination (AM 1.5 G, 100 mW cm$^{-2}$).

| PSCs | J$_{sc}$/ mA cm$^{-2}$ | V$_{oc}$/ V | η/ % | Average η/ % | FF/ % | V$_{oc}$ deficit/ V |
|---|---|---|---|---|---|---|
| CFM | 23.4 | 1.06 | 17.0 | 15.02 ± 0.78 | 68.4 | 0.45 |
| CFM-DAP | 23.4 | 1.16 | 21.5 | 20.36 ± 0.46 | 79.4 | 0.35 |
| MAPbI$_3$ | 22.0 | 1.08 | 18.3 | 16.45 ± 0.40 | 77.2 | 0.47 |
| MAPbI$_3$-DAP | 22.5 | 1.18 | 21.7 | 20.53 ± 0.38 | 81.7 | 0.37 |
| MAPbI$_3$-DAP (1.1 cm$^2$) | 22.0 | 1.14 | 20.0 | 18.24 ± 0.65 | 80.0 | N/A |
| CFPbIBr | 15.1 | 1.18 | 13.1 | 11.78 ± 0.57 | 73.3 | 0.64 |
| CFPbBr-DAP | 15.6 | 1.26 | 15.2 | 13.87 ± 0.49 | 77.5 | 0.56 |

Figure 15:
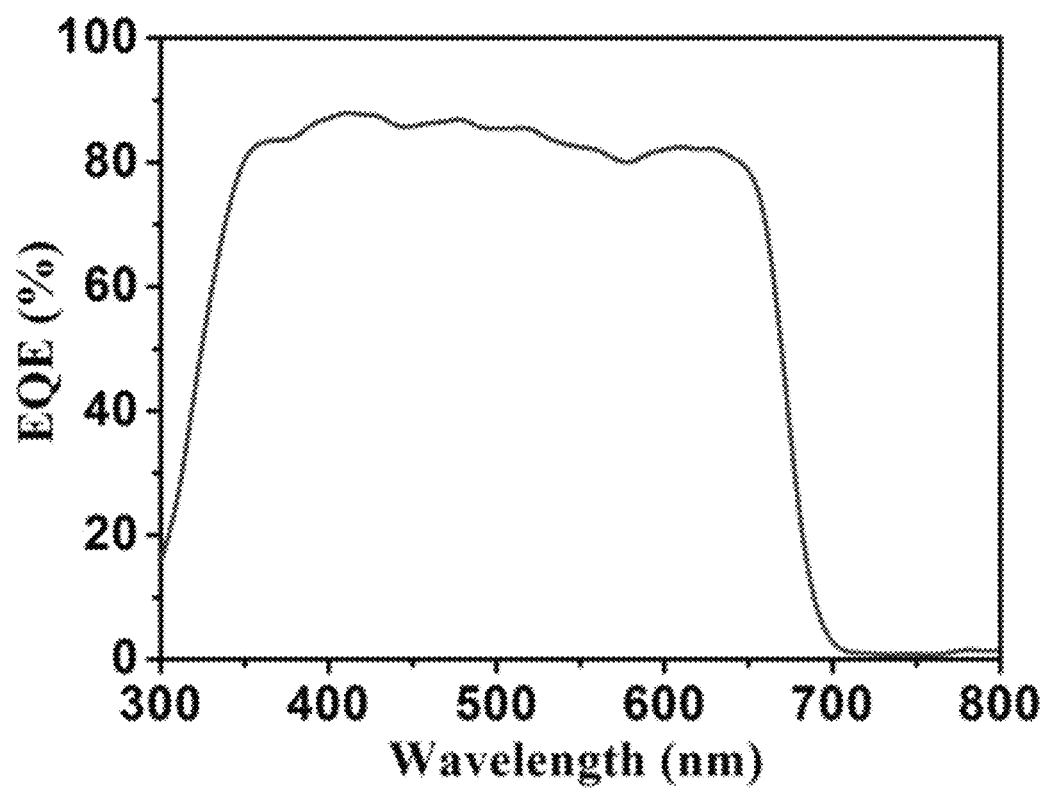
FIG. 15 shows an EQE spectrum of a PSC based on CFPbIBr-DAP film, showing a response onset of 681 nm corresponding to an Eg of 1.82 eV.

Note:
CFM has an optical bandgap of 1.51 eV; MAPbI3 has an optical bandgap of 1.55 eV; and CFPbIBr has an optical bandgap of 1.82 eV. The optical bandgap of perovskite with different compositions was determined from the external quantum efficiency (EQE) spectrum edge in FIG. 13-FIG. 15.
[*] data for average PCE (η) were calculated from at least 30 devices.
Note:
the CFM represents the Cs$_{0.05}$FA$_{0.07}$MA$_{0.25}$PbI$_3$ and the CFPbIBr represents the Cs$_{0.2}$FA$_{0.8}$Pb(I$_{0.6}$Br$_{0.4}$)$_3$.

Figure 10D:
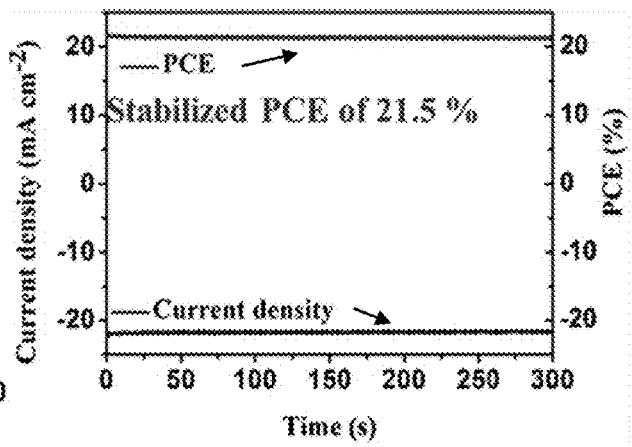
FIG. 10D shows stabilized current density and PCE at the maximum power point (0.98 V) of the champion device (0.08 $cm^2$) based on the $MAPbI_3$-DAP thin film.
Figure 10E:
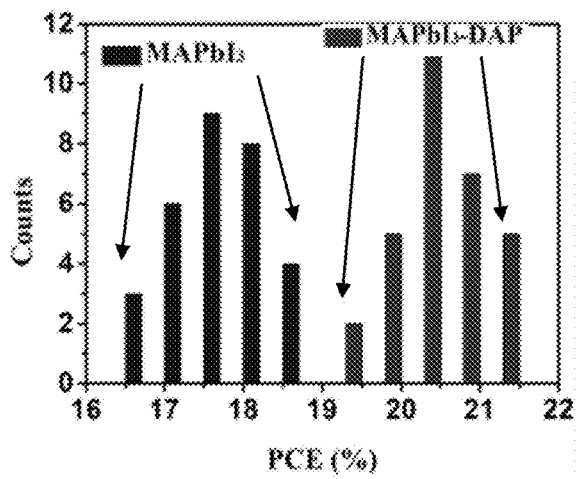
FIG. 10E shows the PCE histogram of PSCs based on $MAPbI_3$ and $MAPbI_3$-DAP films (with 0.025 wt % DAP).
Figure 10F:
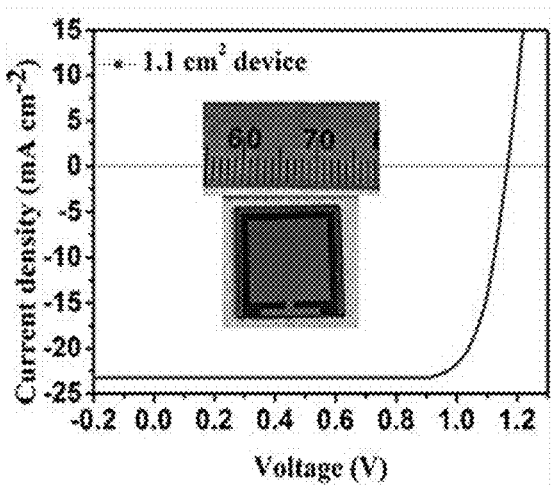
FIG. 10F shows the J-V characteristic of the champion 1.1 $cm^2$ PSC based on the $MAPbI_3$-DAP thin film (the inset shows a digital image of the actual device).
Figure 12:
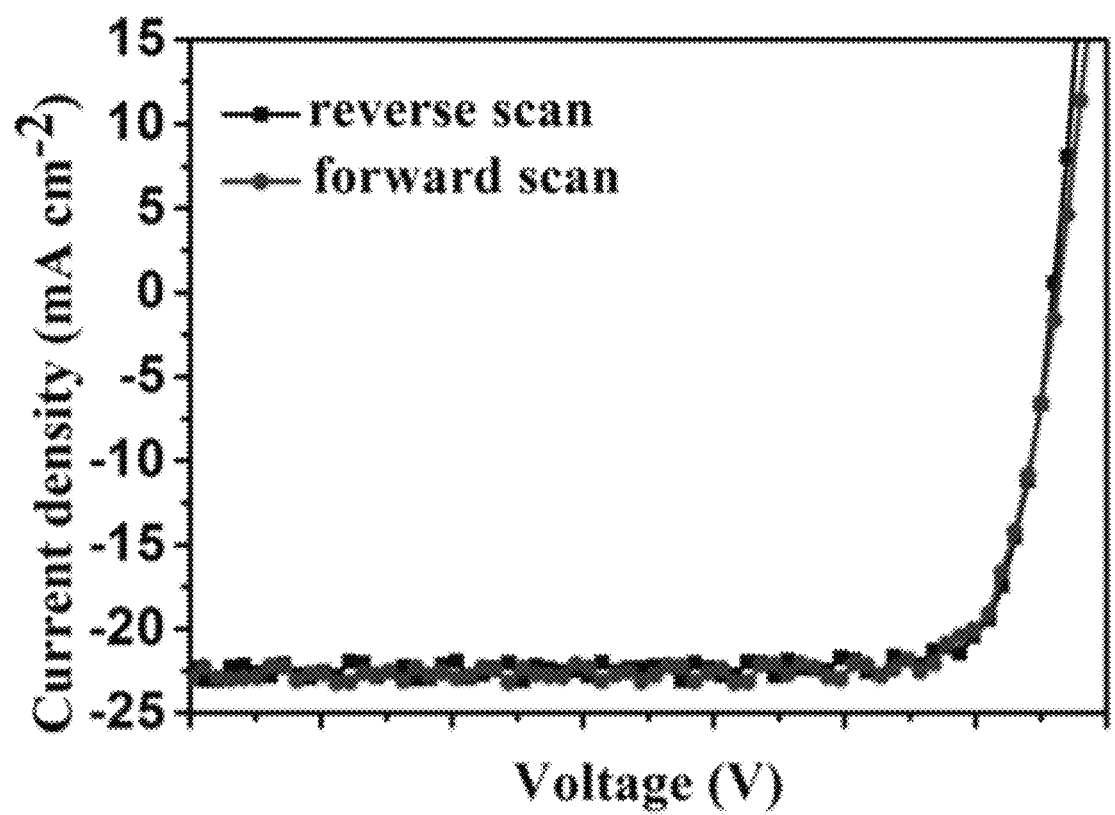
FIG. 12 shows J-V characteristics of the PSC-based on a $MAPbI_3$-DAP film measured under different scanning directions at a scan rate of 0.1 V $s^{-1}$.

For PSCs based on MAPbI$_3$-DAP thin films, a negligible photocurrent hysteresis was observed (FIG. 12 and Table 4). The suppressed photocurrent hysteresis in the MAPbI$_3$-DAP based PSC was attributed to effective passivation and/or stabilization of under-coordinated ions at the surface of the perovskite crystals through strong molecular interactions with —NH$_2$ functional groups. To confirm this, lateral structure devices were fabricated with two parallel Au finger electrodes deposited on top of glass/MAPbI$_3$ and glass/MAPbI$_3$-DAP films. When a voltage pulse (17.5 V) was applied, the current of the latter device immediately increased to the maximum, while the former device needed 1200 s for the current to stabilize, suggesting that trap based on the MAPbI$_3$-DAP thin film, in which the EQE profile exceeds 85% across a broad wavelength region from 450 to 750 nm. Additionally, the integrated s (22.0 mA cm$^{-2}$) from the spectrum is in good agreement with that derived from the J-V curve (22.5 mA cm$^{-2}$), with a discrepancy of no more than 3%. FIG. 10D depicts the stabilized photocurrent density of this champion device as measured at 0.98 V, giving a stabilized PCE of 21.5% under AM 1.5G illumination. The PCE histogram of MAPbI$_3$ and MAPbI$_3$-DAP based PSCs were constructed from data collected from a batch of 30 devices for each condition (FIG. 10E). Specifically, more than 77% of MAPbI$_3$-DAP cells had PCEs above 20.5%, while only 40% of MAPbI$_3$ devices had efficiencies over 18% under 1 sun illumination. This result not only demonstrates the effectiveness of improving the device performance, but also highlights the excellent reproducibility of this BAA passivation method. Larger area (>1 cm$^2$) PSCs using the bladed MAPbI$_3$-DAP films were also fabricated. The J-V curve of a PSC with an aperture of 1.1 cm$^2$ is shown in FIG. 10F, with a PCE of 20.0%, a J$_{sc}$ of 22.0 mA cm$^{-2}$, a V$_{oc}$ of 1.14 V and a FF of 8O%.

Example 6: Passivation Effect of DAP

Figure 16A:
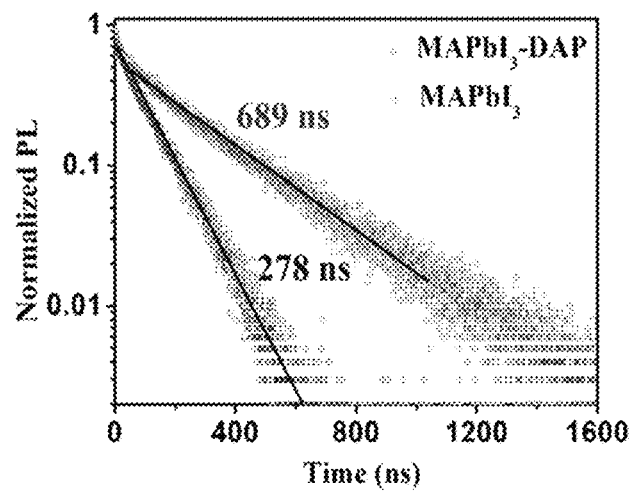
FIG. 16A shows a plot of the time-resolved photoluminescence (TRPL) lifetime of perovskite films incorporated with or without DAP amine.

Time-resolved photoluminescence (TRPL) lifetimes were measured for perovskite films with and without DAP incorporation. The MAPbI$_3$-DAP film had a PL recombination lifetime of 689 ns, almost 2.5 times longer than the control film (278 ns, FIG. 16A), at an excitation carrier concentration of 7.2×10$^{13}$ cm$^{-3}$. Steady PL intensities of different perovskite films deposited on glass substrates are shown in FIG. 17A-FIG. 17C. DAP incorporation into perovskites of all compositions both enhanced the PL intensities and slightly blue-shifted the PL peak. The PL results collectively confirm the defect passivation function induced by BAA.

Figure 16B:
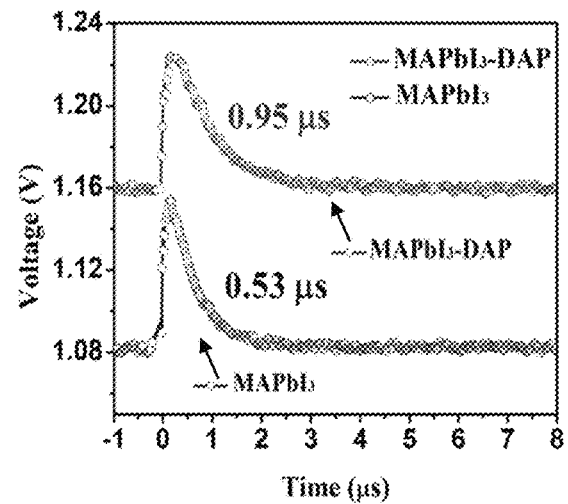
FIG. 16B shows a plot of the carrier recombination lifetime measured by TPV
Figure 16C:
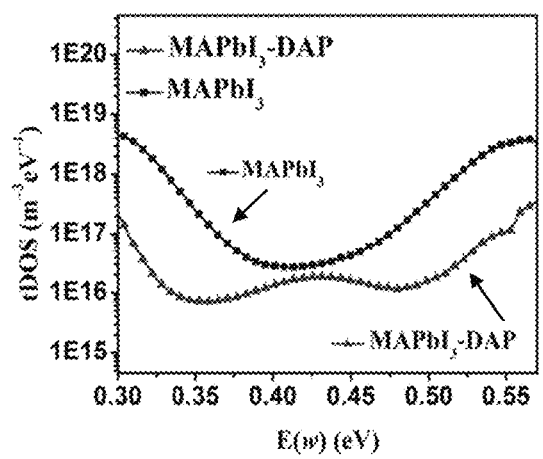
FIG. 16C shows trap density of states obtained from TAS measurement of perovskite devices with or without DAP passivation.

To investigate the carrier recombination dynamics in the operating devices, carrier recombination lifetimes of MAPbI$_3$ devices with or without DAP additive were compared using transient photovoltage (TPV) measurements. The devices were soaked under 1 sun illumination, and laser pulses were applied to perturb the open-circuited devices to trigger a small transient photovoltaic signal.[35] As seen in FIG. 16B, carrier recombination lifetime is longer in the device incorporated with DAP additive (0.95 µs) compared to the pristine MAPbI$_3$ device (0.53 µs), suggesting that DAP amine passivation suppresses charge carrier recombination. This result is in good agreement with the enhanced Vo$_c$ in the MAPbI$_3$-DAP devices. The elongated carrier lifetime of PSCs with DAP passivation can be attributed to an effective reduction of trap densities within the perovskite films. The trap density of states (tDOS) for devices was measured using thermal admittance spectroscopy (TAS). FIG. 16C showed reduced tDOS over the whole trap depth region for the MAPbI$_3$-DAP device. Specifically, the MAPbI$_3$-DAP device had 1-2 orders of magnitude lower tDOS than its pristine MAPbI$_3$ counterpart, in both the deeper trap region (0.40-0.55 eV) which is assigned to defects at the film surface, and shallower trap region (0.30-0.40 eV) which corresponded to traps at grain boundaries.[36] This again confirms that the DAP amine can effectively passivate the defects originating from under-coordinated ions at the perovskite grains surface, and further implies that the incorporation of BAA into the bulk and/or its presence at grain boundaries and surfaces during perovskite film growth and formation is helpful for the observed performance enhancement.

Figure 16D:
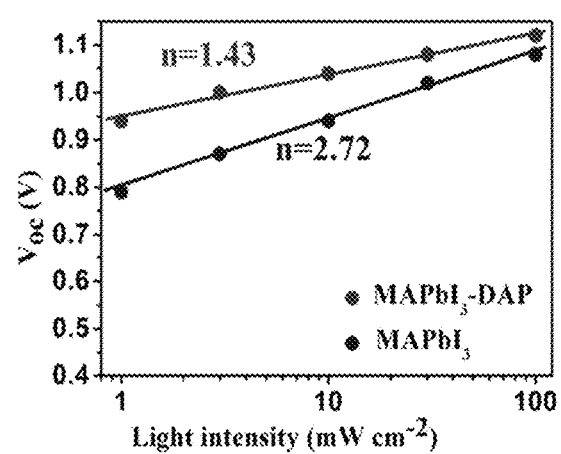
FIG. 16D shows a plot of $V_{oc}$ as a function of light intensity.

The light intensity dependent Vo$_c$ shown in FIG. 16D provides additional information on charge recombination in PSC devices. The diode ideal factor (n), which can be calculated (n=kT/q×ΔV$_{oc}$/ΔlnJ$_L$, where k, T, q and J$_L$ are Boltzmann constant, absolute temperature, elementary charge and photogenerated current density, respectively), is commonly used to describe the dependence of applied light intensity and voltage.[37] The simulated lines were fitted from the light intensities higher than 0.01 sun. It has been reported that n can vary between 1 and 3 for PSCs, depending on the trap-assisted recombination.[38, 39] The MAPbI$_3$-DAP device exhibited a higher V$_{oc}$ value than the pristine MAPbI$_3$ device under all light intensities. The MAPbI$_3$ device had an ideal factor of 2.72, suggesting a severe impact of nonradiative recombination. In contrast, DAP passivation decreased the ideal factor to 1.43, much closer to that of an ideal diode, indicating that the nonradiative recombination process was effectively suppressed, owing to the reduction of the surface defect states of perovskite film by DAP incorporation.[40]

Figure 16E:
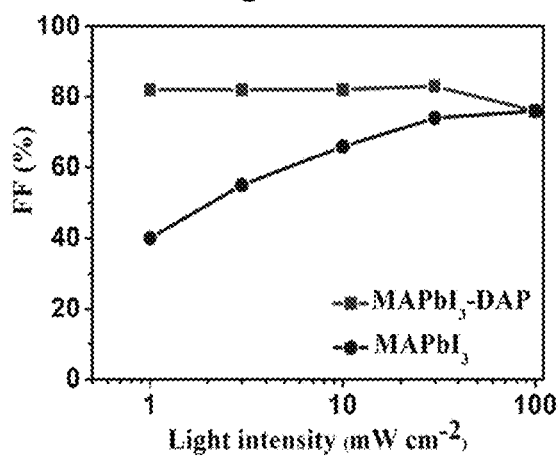
FIG. 16E shows a plot of FF dependence as a function of light intensity.
Figure 16F:
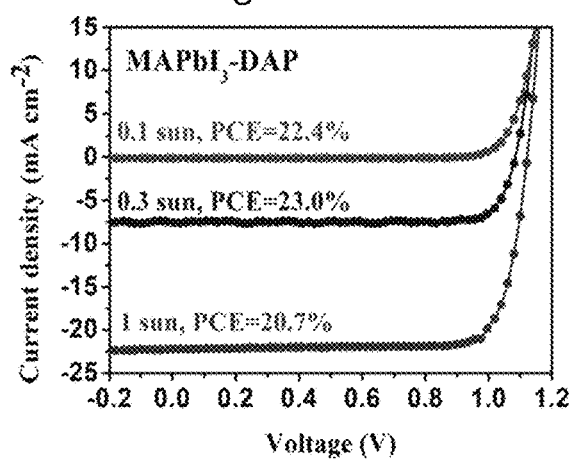
FIG. 16F shows J-V curves of PSCs based on the $MAPbI_3$-DAP film measured under illumination at different light intensities.
Figure 18:
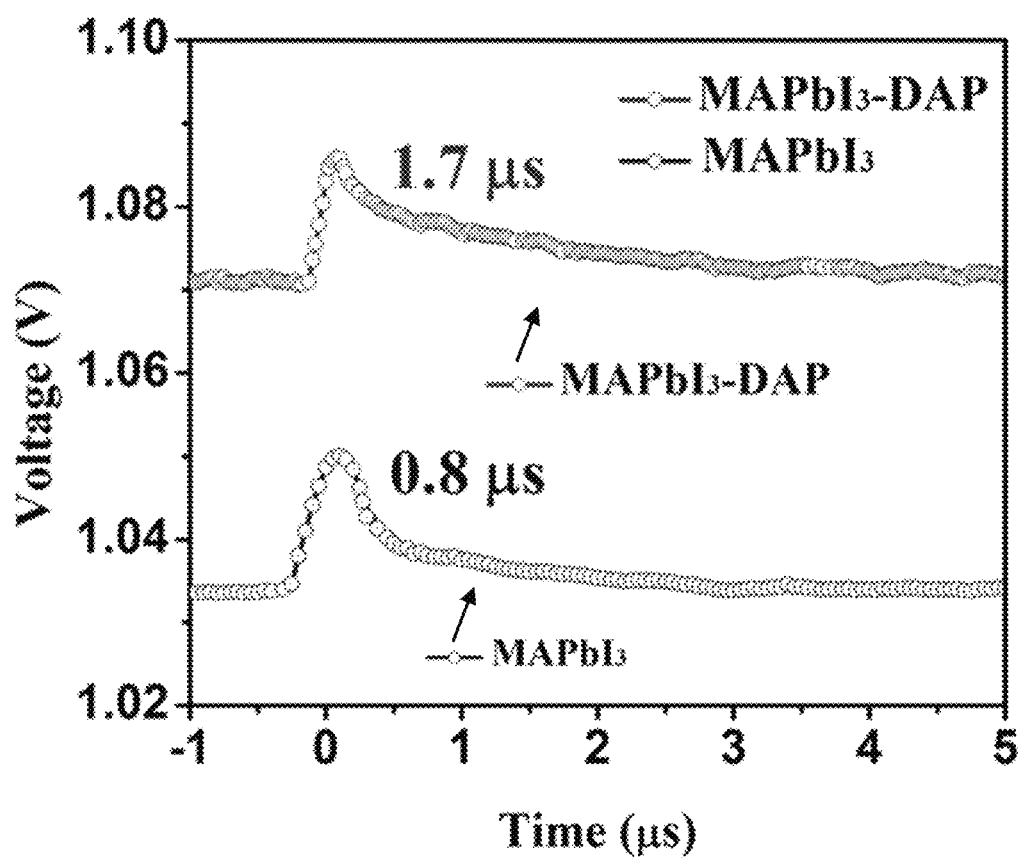
FIG. 18 shows the TPV of PSCs based on $MAPbI_3$ and $MAPbI_3$-DAP films measured under illumination at 0.3 sun.
Figure 19:
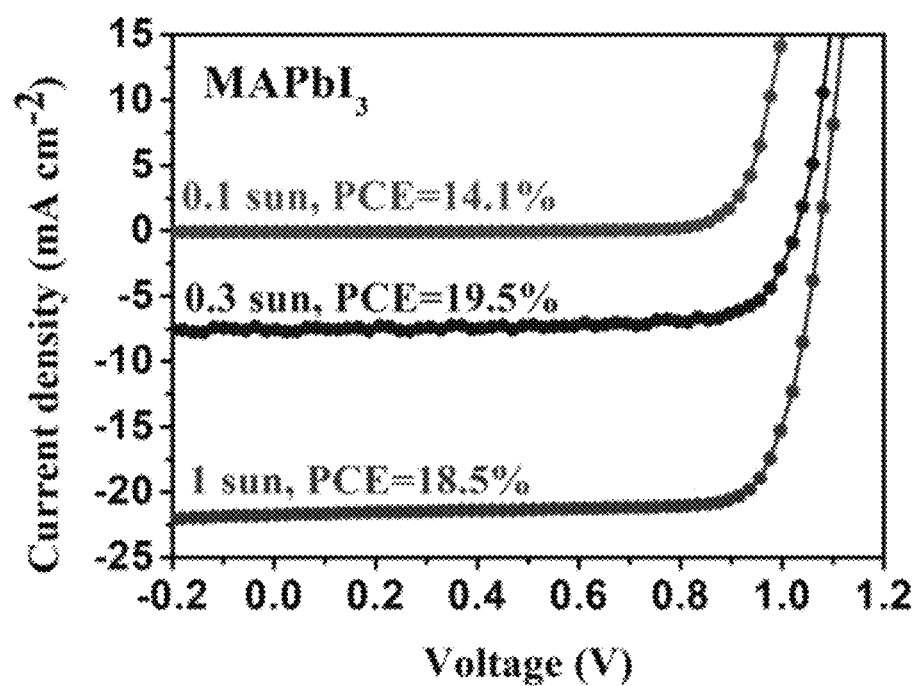
FIG. 19 shows J-V curves of $MAPbI_3$-based PSCs measured under illumination at different light intensities.
Figure 20:
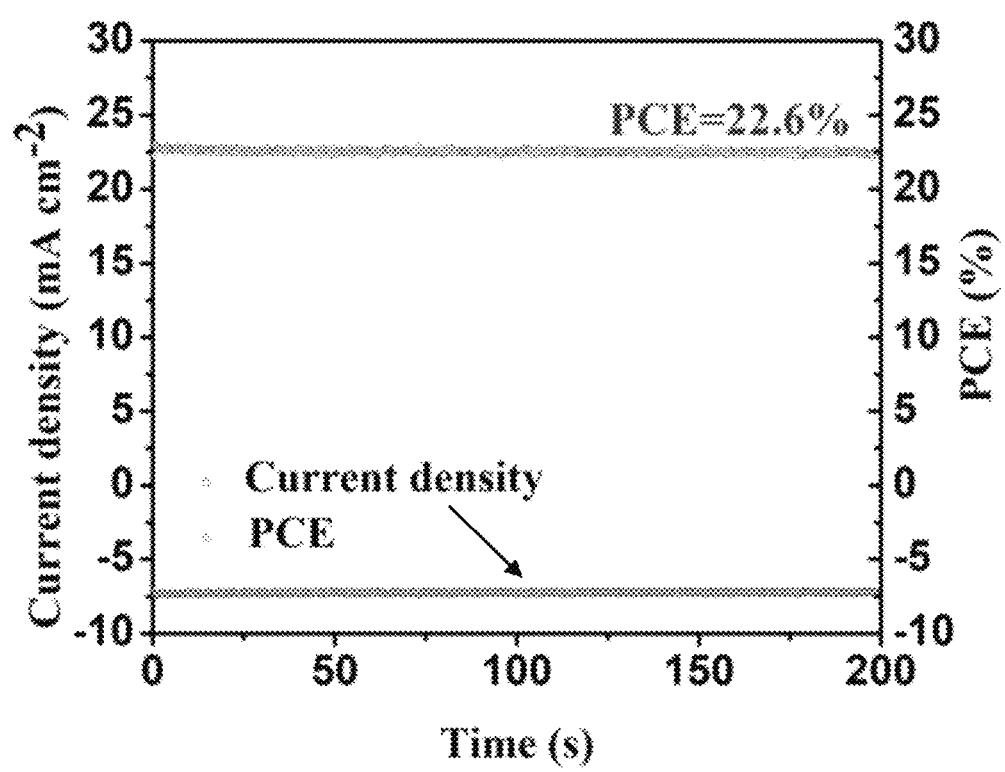
FIG. 20 shows a plot of the stabilized PCE output at the maximum power point (0.92 V) of the $MAPbI_3$-DAP device (0.08 $cm^2$) measured under 0.3 sun.

The influence of trap-assisted recombination on device performance is typically more evident for devices under weak light illumination. FIG. 16E compares the light intensity dependence of the FF for the two devices. Under weak illumination, the MAPbI$_3$ device displays a low FF, confirming that the predominant nonradiative recombination process is caused by deep-level trap states, whereas for the MAPbI$_3$-DAP device the FF remains high, indicating that DAP passivation had effectively reduced trap-assisted recombination. This effect is also evidenced by a prolonged TPV lifetime of 1.7 µs for the MAPbI$_3$-DAP device, which is more than double that of the MAPbI$_3$ counterpart under 0.3 sun illumination (0.8 µs, FIG. 18). The corollary of reduced charge recombination loss is higher V$_{oc}$ and FF, and thus high-efficiency PSCs. As the light intensity decreased to low values, i.e., much lower than 0.01% sun, a V$_{oc}$ larger than 0.9 V from the MAPbI$_3$-DAP PSC was observed. These results are promising for indoor ambient light solar cell applications. The PCEs of PSCs with or without DAP passivation were measured under illumination at different light intensities (FIG. 16F and FIG. 19). The MAPbI$_3$-DAP based PSC (0.08 cm$^2$) had a PCE of 23.0% with J$_{sc}$ of 7.63 mA cm$^{-2}$, V$_{oc}$ of 1.08 V and FF of 83.9%, and a stabilized PCE of 22.6% under 0.3 sun illumination (FIG. 20), signifying that DAP amine passivated PSCs are ideally suited for ambient light energy harvesting and conversion applications.[41, 42]

Example 7: Evaluation of Stability

Figure 21A:
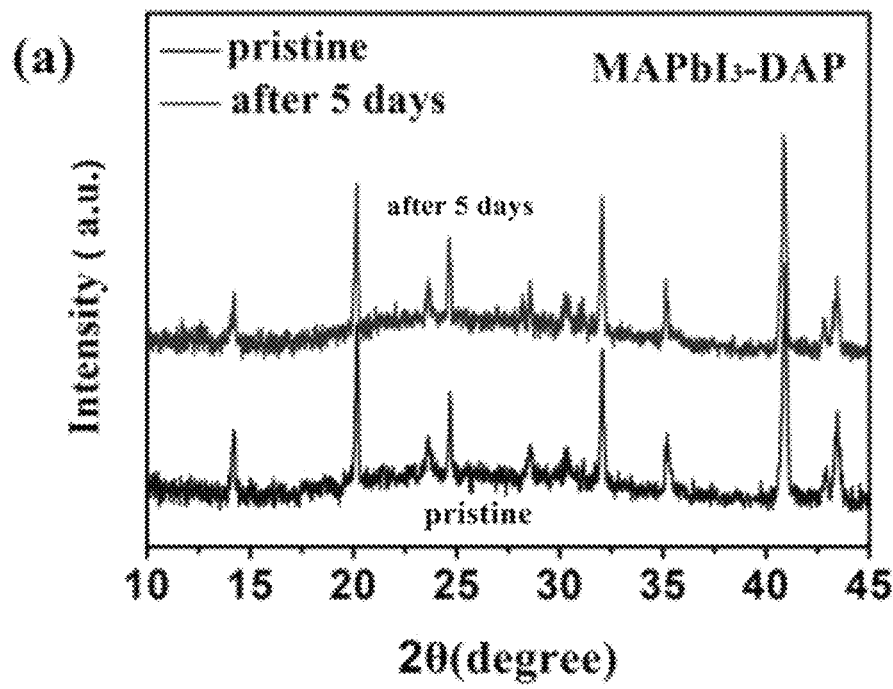
FIG. 21A shows an XRD pattern of $MAPbI_3$-DAP film after being exposed to ambient air (50±5 RH % at room temperature).
Figure 21B:
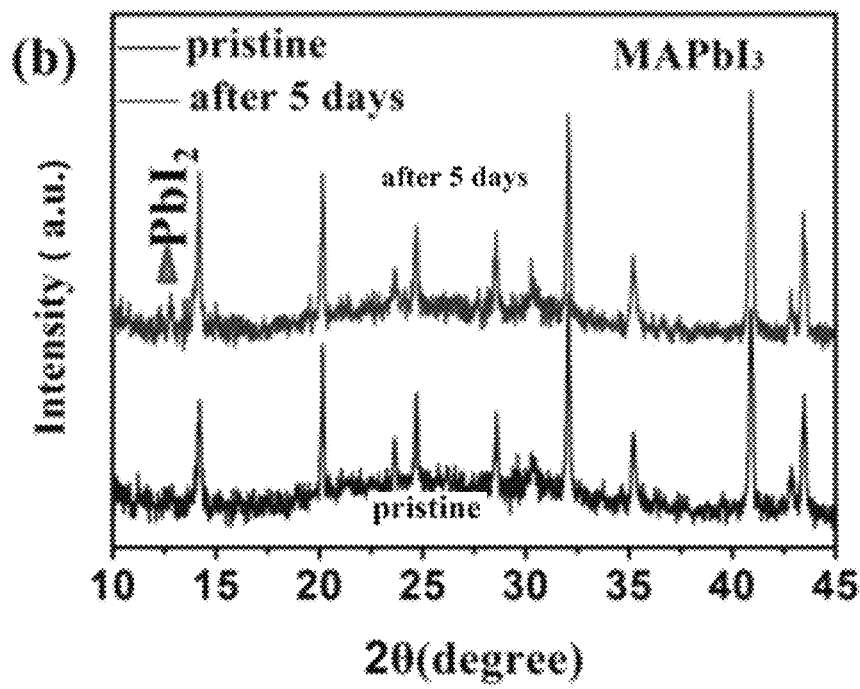
FIG. 21B shows an XRD pattern of the $MAPbI_3$ film after being exposed to ambient air (50±5 RH % at room temperature).
Figure 22A:
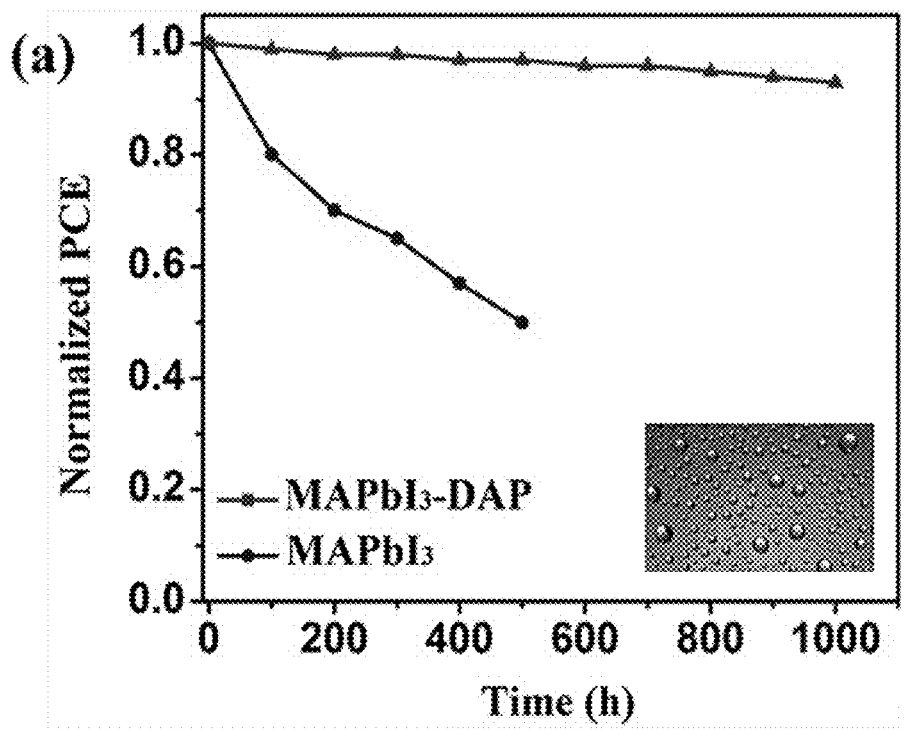
FIG. 22A shows a plot of the moisture stability of non-encapsulated PSCs based on MAPbI$_3$-DAP and MAPbI$_3$ films under ambient air (50±5 RH % at room temperature).
Figure 22B:
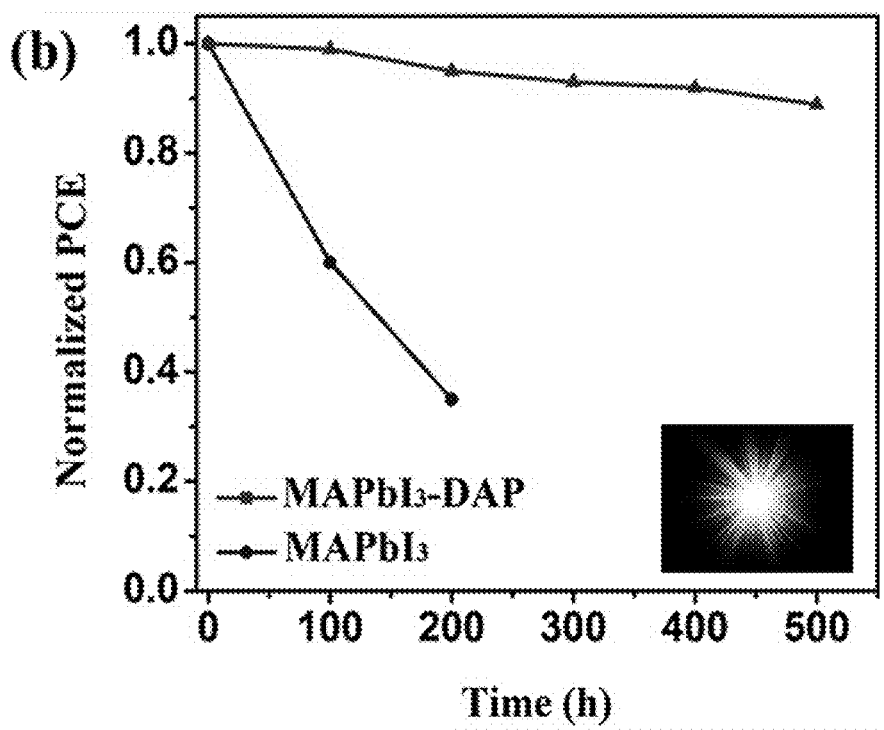
FIG. 22B shows a plot of the operational stability of encapsulated PSCs based on MAPbI$_3$-DAP and MAPbI$_3$ films under continuous 1 sun illumination.
Figure 23:
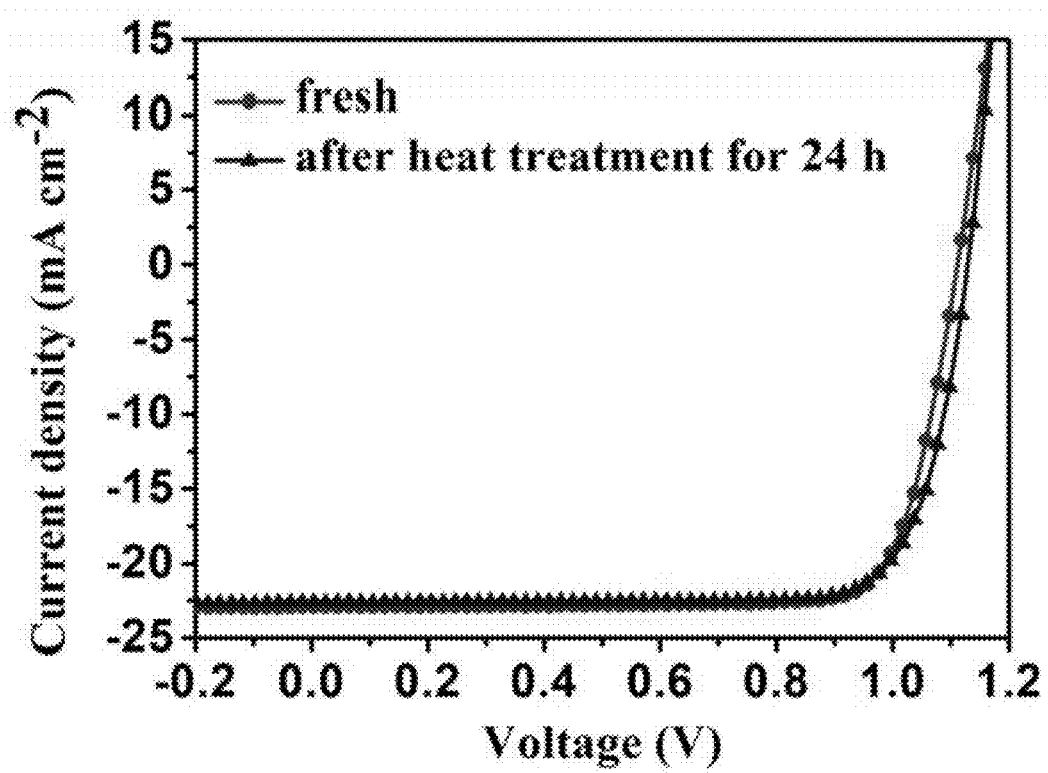
FIG. 23 shows J-V curves of the freshly-prepared MAPbI$_3$-DAP based PSC (a Jsc of 22.9 mA cm$^{-2}$, a V$_{oc}$ of 1.12 V, a FF of 0.80 and a PCE of 20.5%) and the same device after being heated at 85° C. for 24 h (a Jsc of 22.6 mA cm$^{-2}$, a V$_{oc}$ of 1.14 V, a FF of 0.79, and a PCE of 20.3%).

Metal halide perovskites are notoriously sensitive to moisture, and can degrade rapidly in a humid environment.[43] The moisture stability of the pristine MAPbI$_3$ film and the DAP-modified MAPbI$_3$ film were studied by exposing them continuously to ambient air (50±5 RH % at room temperature) for 120 hours. Under the same conditions, the MAPbI$_3$-DAP thin film maintained a highly pure MAPbI$_3$ phase without an XRD detectable PbI$_2$ phase; however, decomposition from MAPbI$_3$ to PbI$_2$ was observed for the MAPbI$_3$ thin film (FIG. 21A and FIG. 21B). The shelf lifetime of completed devices without encapsulation was also tested at ambient conditions (50±5 RH % at room temperature). As shown in FIG. 21A, the MAPbI$_3$ device degraded to 50% of its initial PCE after 500 hours, whereas the MAPbI$_3$-DAP PSC retained more than 90% of its original PCE after storage for 1000 hours. In addition, the stability of encapsulated PSCs based on MAPbI$_3$ and MAPbI$_3$-DAP thin films under realistic operating conditions was measured. DAP incorporation enhanced device stability under continuous 1 sun illumination, with the MAPbI$_3$-DAP device retaining 90% of its initial PCE after 500 hours (FIG. 21), unlike the MAPbI$_3$ device, for which the PCE decreased with prolonged illumination to only 35% of its original PCE after 200 hours (FIG. 21B). Lastly, the thermal stability of the PSCs incorporated with DAP passivation was evaluated, where the devices were heated to 85° C. inside a N$_2$-filled glovebox. As is shown in FIG. 23, there was almost no PCE reduction for the MAPbI$_3$-DAP device after being heated for 24 h. This demonstrated good thermal stability further confirms that the DAP binds quite strongly to the perovskite after heat treatment. The low melting point of DAP indicates the weak interaction of amine molecules in a liquid form.

After bond formation between DAP and perovskite, the amine itself is no longer a liquid; thus, the amine exists as a robust defect passivation agent on the perovskite films. The observed significantly enhanced moisture and operational stability of MAPbI$_3$-DAP based PSCs demonstrates the beneficial effect of DAP amine incorporation. Additionally, the self-assembly of a moisture barrier via additive-assisted perovskite film blade-coating effectively retards the decomposition of perovskites under atmospheric conditions. The improved ambient and operational stability could be attributed to synergistic functions of the DAP amine. In one aspect, the DAP may shield the surface and interior of perovskite grains from moisture. In another aspect, the DAP could passivate the under-coordinated ions at the boundaries and surfaces of perovskite grains, thus alleviating defect-induced degradation typically encountered during operational conditions.

Figure 25:
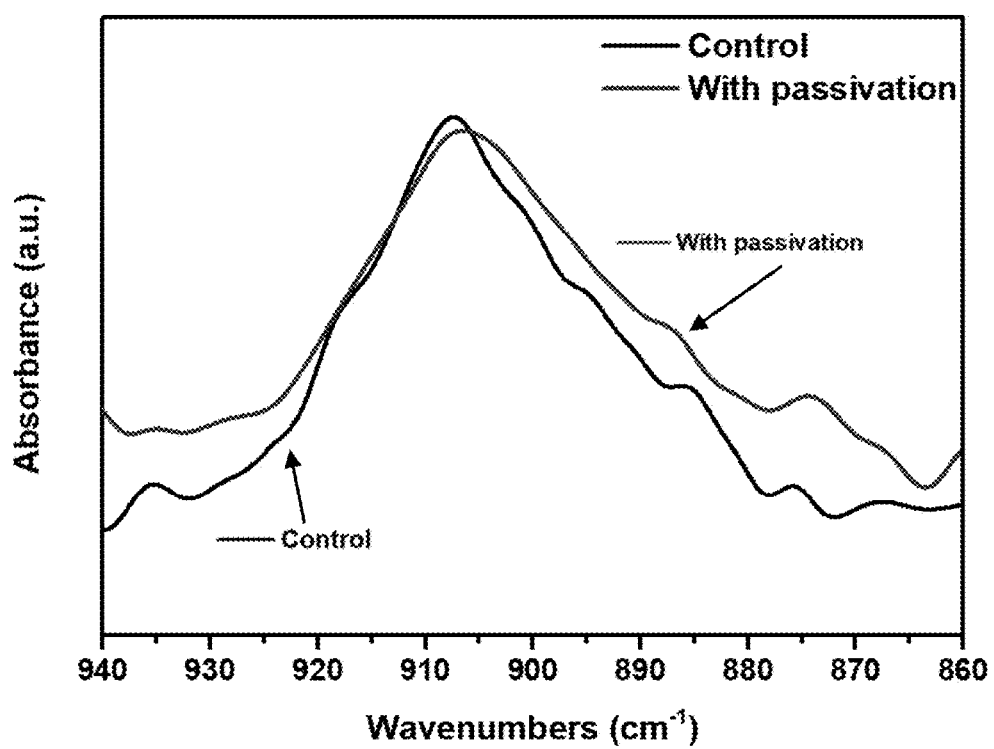
FIG. 25 shows FTIR spectra of the perovskite layers with and without the 1,11-diamino-3,6,9-trioxaundecane passivation molecule.

Example 8: 1,11-Diamino-3,6,9-trioxaundecane as a Passivation Molecule 1,11-diamino-3,6,9-trioxaundecane (which features a —NH$_2$ group at each end of the molecule) was directly introduced into perovskite (Cs$_{0.1}$MA$_{0.9}$Pb(I$_{0.9}$Br$_{0.1}$)$_3$) ink as an additive during the blade-coating process. The perovskite ink solution comprised about 0.23 wt % of 1,11-diamino-3,6,9-trioxaundecane. The interaction between the passivation molecule and the perovskite was first examined. As shown in FIG. 25, the FTIR spectrum of the additive-incorporated ink solution at 906 cm$^{-1}$ (CH$_3$—NH$_3^+$ rocking) shows a broadened signal and red-shift absorption, suggesting the formation of hydrogen bonds between oxygen atoms and MA. This response indicates the potential for hydrogen bond weakening between —NH$_2$ and organic cations after the introduction of oxygen atoms.

Figure 26A:
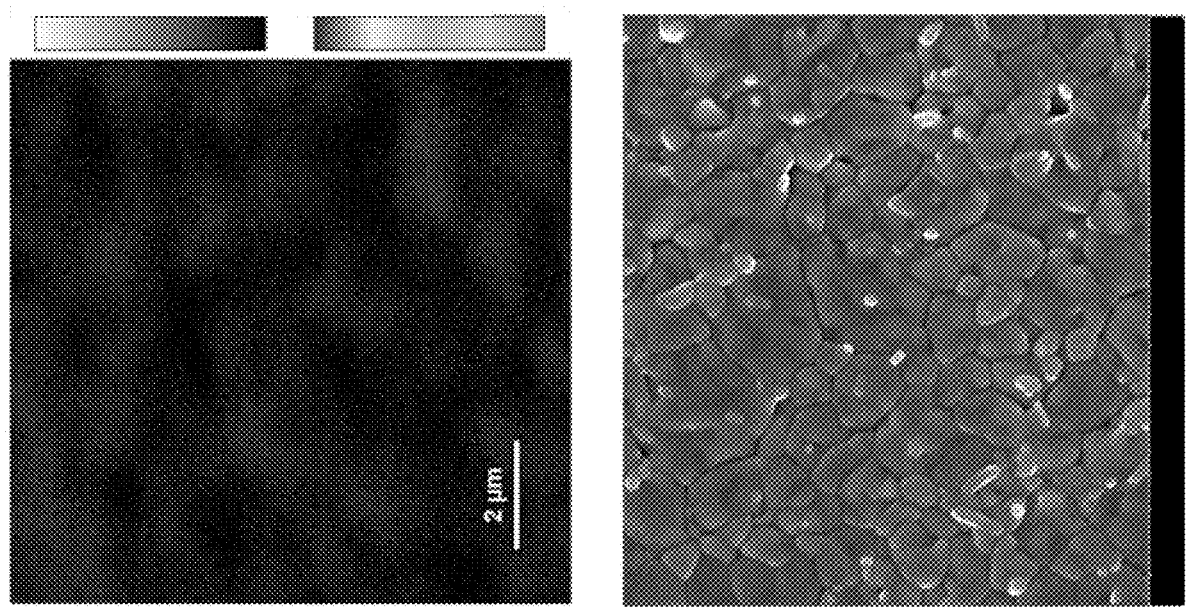
FIG. 26A shows a SEM image and overlapped PL mapping intensity/lifetime of a (Cs$_{0.1}$MA$_{0.9}$Pb(I$_{0.9}$Br$_{0.1}$)$_3$) film without any passivation molecule additive.
Figure 26B:
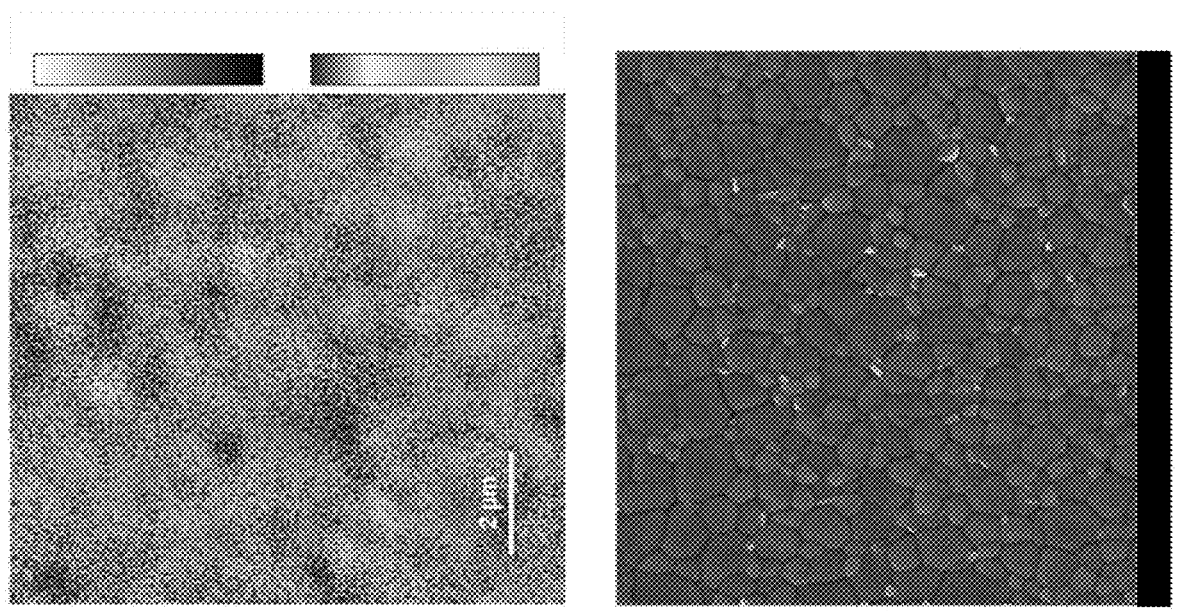
FIG. 26B shows a SEM image and overlapped intensity/lifetime PL mapping of a (Cs$_{0.1}$MA$_{0.9}$Pb(I$_{0.9}$Br$_{0.1}$)$_3$) film containing 1,11-Diamino-3,6,9-trioxaundecane passivation molecule additive.

From the SEM images shown in FIG. 26A and FIG. 26B, it can be seen that the morphology of the pristine Cs$_{0.1}$MA$_{0.9}$Pb(I$_{0.9}$Br$_{0.1}$)$_3$ perovskite film is rough. After incorporation of the passivation molecule 1,11-diamino-3,6,9-trioxaundecane, the perovskite film exhibits a more compact and uniform size distribution. Photoluminescence (PL) mapping was further used to characterize the optoelectronic properties of the perovskite films. As shown in FIG. 26B, the perovskite film with 1,11-diamino-3,6,9-trioxaundecane has both a higher PL intensity and a longer PL lifetime. These results indicate that the incorporation of 1,11-diamino-3,6,9-trioxaundecane allows for reduced non-radiative recombination as well as good passivation capacity of the perovskite film.

Figure 27:
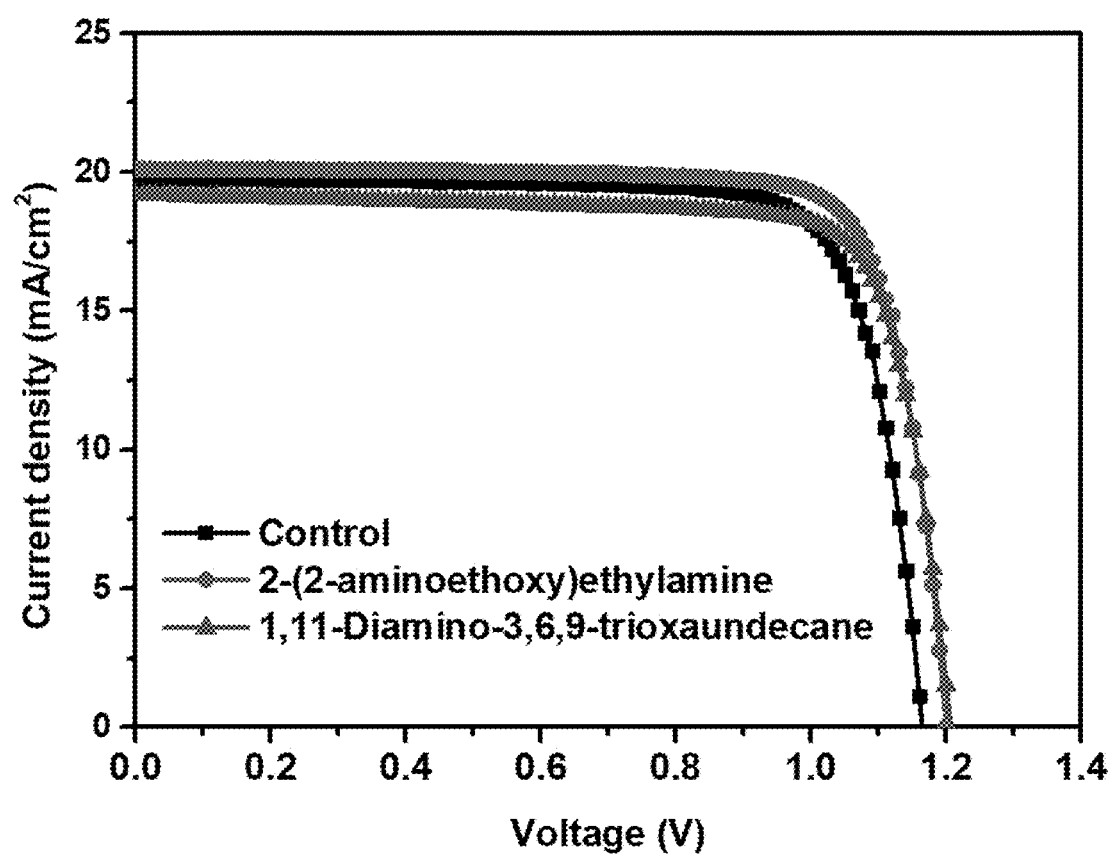
FIG. 27 shows J-V curves of a control PSC (Cs$_{0.1}$MA$_{0.9}$Pb(I$_{0.9}$Br$_{0.1}$)$_3$) without a passivation molecule additive, a PSC with 1,11-diamino-3,6,9-trioxaundecane as a passivation molecule additive, and a PSC with 2-(2-aminoethoxy)ethylamine as a passivation molecule additive.

Example 9: Photovoltaic Performance of 1,11-Diamino-3,6,9-trioxaundecane and its Comparison with 2-(2-aminoethoxy)ethylamine PSCs were fabricated with an inverted p-i-n structure using perovskite films with or without 1,11-diamino-3,6,9-trioxaundecane. The device structure was ITO/PTAA/Cs$_{0.1}$MA$_{0.9}$Pb(I$_{0.9}$Br$_{0.1}$)$_3$ with or without 1,11-diamino-3,6,9-trioxaundecane/C$_{60}$/BCP/Cu. The J-V curves of the PSCs with and without the 1,11-diamino-3,6,9-trioxaundecane passivation molecule are shown in FIG. 27. The PSCs based on the pristine Cs$_{0.1}$MA$_{0.9}$Pb(I$_{0.9}$Br$_{0.1}$)$_3$ (bandgap: 1.63 eV) showed a PCE of 18.13% with a short-circuit density (Jsc) of 19.78 mA cm$^{-2}$, a V$_{oc}$ of 1.16 V, and a fill factor (FF) of 79%. For the Cs$_{0.1}$MA$_{0.9}$Pb(I$_{0.9}$Br$_{0.1}$)$_3$ device with 1,11-Diamino-3,6,9-trioxaundecane, the V$_{oc}$ increased from 1.16 V to 1.21 V. However, the total PCE did not significantly change as a result of the reduced Jsc and FF. For comparison, the structural and charge transport properties of 2-(2-aminoethoxy)ethylamine (2-2-AM)), were evaluated (FIG. 27). The perovskite ink solution comprised about 0.12 wt % of 2-(2-aminoethoxy)ethylamine. The device structure was ITO/PTAA/Cs$_{0.1}$MA$_{0.9}$Pb(I$_{0.9}$Br$_{0.1}$)$_3$-modified with 2-(2-aminoethoxy)ethylamine/C$_{60}$/BCP/Cu. For the device with 2-(2-aminoethoxy)ethylamine (2-2-AM)), an efficiency of 19.78% with a V$_{oc}$ of 1.20 V, Jsc of 20.35 mA cm$^{-2}$, and FF of 0.81 were obtained. Without wishing to be bound by theory, it is believed that the lower PCF for the 1,11-diamino-3,6,9-trioxaundecane-containing film could be attributable to the reduced charge transport properties of the molecule's longer alkyl chain.

REFERENCES

The references listed below as well as all references cited in the specification are incorporated herein by reference to the extent that they supplement, explain, provide a background for or teach methodology, techniques and/or compositions employed herein.

All cited patents and publications referred to in this application are herein expressly incorporated by reference.

1. W. S. Yang, B.-W. Park, E. H. Jung, N. J. Jeon, Y. C. Kim, D. U. Lee, S. S. Shin, J. Seo, E. K. Kim, J. H. Noh, S. I. Seok, Iodide management in formamidinium-lead-halide-based perovskite layers for efficient solar cells. Science 356, 1376-1379 (2017).
2. M. Yang, Z. Li, M. O. Reese, O. G. Reid, D. H. Kim, S. Siol, T. R. Klein, Y. Yan, J. J. Berry, M. F. A. M. van Hest, K. Zhu, Perovskite ink with wide processing window for scalable high-efficiency solar cells. Nat. Energy 2, 17038 (2017).
3. Z. Li, T. R. Klein, D. H. Kim, M. Yang, J. J. Berry, M. F. A. M. van Hest, K. Zhu, Scalable fabrication of perovskite solar cells. Nat. Rev. Mater. 3, 18017 (2018).
4. Y. Hou, X. Du, S. Scheiner, D. P. McMeekin, Z. Wang, N. Li, M. S. Killian, H. Chen, M. Richter, I. Levchuk, N. Schrenker, E. Spiecker, T. Stubhan, N. A. Luechinger, A. Hirsch, P. Schmuki, H.-P. Steinruck, R. H. Fink, M. Halik, H. J. Snaith, C. J. Brabec, A generic interface to reduce the efficiency-stability-cost gap of perovskite solar cells. Science 358, 1192-1197 (2017).
5. S. Tang, Y. Deng, X. Zheng, Y. Bai, Y. Fang, Q. Dong, H. Wei, J. Huang, Composition engineering in doctor-blading of perovskite solar cells. Adv. Energy Mater. 7, 1700302 (2017).
6. Y. Deng, X. Zheng, Y. Bai, Q. Wang, J. Zhao, J. Huang, Surfactant-controlled ink drying enables high-speed deposition of perovskite films for efficient photovoltaic modules. Nat. Energy 3, 560-566 (2018).
7. W.-Q. Wu, Q. Wang, Y. Fang, Y. Shao, S. Tang, Y. Deng, H. Lu, Y. Liu, T. Li, Z. Yang, A. Gruverman, J. Huang, Molecular doping enabled scalable blading of efficient hole-transport-layer-free perovskite solar cells. Nat. Commun. 9, 1625 (2018).
8. F. Z. Huang, A. R. Pascoe, W.-Q. Wu, Z. L. Ku, Y. Peng, J. Zhong, R. A. Caruso, Y.-B. Cheng, Effect of the microstructure of the functional layers on the efficiency of perovskite solar cells. Adv. Mater. 29, 1601715 (2017).
9. W.-Q. Wu, D. Chen, W. A. McMaster, Y.-B. Cheng, R. A. Caruso, Solvent-mediated intragranular-coarsening of CH$_3$NH$_3$PbI$_3$ thin films toward high-performance perovskite photovoltaics. ACS Appl. Mater. Interfaces 9, 31959-31967 (2017).

10. W.-Q. Wu, D. Chen, F. Huang, Y.-B. Cheng, R. A. Caruso, Optimizing semiconductor thin films with smooth surfaces and well-interconnected networks for high-performance perovskite solar cells. J. Mater. Chem. A 4, 12463-12470 (2016).
11. X. Zheng, B. Chen, J. Dai, Y. Fang, Y. Bai, Y. Lin, H. Wei, Xiao C. Zeng, J. Huang, Defect passivation in hybrid perovskite solar cells using quaternary ammonium halide anions and cations. Nat. Energy 2, 17102 (2017).
12. H. Jiang, Z. Yan, H. Zhao, S. Yuan, Z. Yang, J. Li, B. Liu, T. Niu, J. Feng, Q. Wang, D. Wang, H. Yang, Z. Liu, S. F. Liu, Bifunctional hydroxylamine hydrochloride incorporated perovskite films for efficient and stable planar perovskite solar cells. ACS Appl. Energy Mater. 1, 900-909 (2018).
13. Y. Deng, E. Peng, Y. Shao, Z. Xiao, Q. Dong, J. Huang, Scalable fabrication of efficient organolead trihalide perovskite solar cells with doctor-bladed active layers. Energy Environ. Sci. 8, 1544-1550 (2015).
14. T. Leijtens, G. E. Eperon, N. K. Noel, S. N. Habisreutinger, A. Petrozza, H. J. Snaith, Stability of metal halide perovskite solar cells. Adv. Energy Mater. 5, 1500963 (2015).
15. T. Liu, Y. Zhou, Z. Li, L. Zhang, M.-G. Ju, D. Luo, Y. Yang, M. Yang, D. H. Kim, W. Yang, N. P. Padture, M. C. Beard, X. C. Zeng, K. Zhu, Q. Gong, R. Zhu, Stable formamidinium-based perovskite solar cells via in situ grain encapsulation. Adv. Energy Mater. 8, 1800232 (2018).
16. Y. Bai, Q. Dong, Y. Shao, Y. Deng, Q. Wang, L. Shen, D. Wang, W. Wei, J. Huang, Enhancing stability and efficiency of perovskite solar cells with crosslinkable silane-functionalized and doped fullerene. Nat. Commun. 7, 12806 (2016).
17. D. Bi, P. Gao, R. Scopelliti, E. Oveisi, J. Luo, M. Gratzel, A. Hagfeldt, M. K. Nazeeruddin, High-performance perovskite solar cells with enhanced environmental stability based on amphiphile-modified $CH_3NH_3PbI_3$. Adv. Mater. 28, 2910-2915 (2016).
18. F. Wang, W. Geng, Y. Zhou, H. H. Fang, C. J. Tong, M. A. Loi, L. M. Liu, N. Zhao, Phenylalkylamine passivation of organolead halide perovskites enabling high-efficiency and air-stable photovoltaic cells. Adv. Mater. 28, 9986-9992 (2016).
19. X. Liu, Y. F. Zhang, L. Shi, Z. H. Liu, J. L. Huang, J. S. Yun, Y. Y. Zeng, A. B. Pu, K. W. Sun, Z. Hameiri, J. A. Stride, J. Seidel, M. A. Green, X. J. Hao, Exploring inorganic binary alkaline halide to passivate defects in low-temperature-processed planar-structure hybrid perovskite solar cells. Adv. Energy Mater. 8, 1800138 (2018).
20. P. W. Liang, C. Y. Liao, C. C. Chueh, F. Zuo, S. T. Williams, X. K. Xin, J. J. Lin, A. K. Y. Jen, Additive enhanced crystallization of solution-processed perovskite for highly efficient planar-heterojunction solar cells. Adv. Mater. 26, 3748-3754 (2014).
21. Y. Z. Wu, F. X. Xie, H. Chen, X. D. Yang, H. M. Su, M. L. Cai, Z. M. Zhou, T. Noda, L. Y. Han, Thermally stable $MAPbI_3$ perovskite solar cells with efficiency of 19.19% and Area over 1 $cm^2$ achieved by additive engineering. Adv. Mater. 29, 1701073 (2017).
22. T. Zhang, M. I. Dar, G. Li, F. Xu, N. Guo, M. Grätzel, Y. Zhao, Bication lead iodide 2D perovskite component to stabilize inorganic α-$CsPbI_3$ perovskite phase for high-efficiency solar cells. Sci. Adv. 3, e1700841 (2017).
23. Z. Wang, Q. Lin, F. P. Chmiel, N. Sakai, L. M. Herz, H. J. Snaith, Efficient ambient-air-stable solar cells with 2D-3D heterostructured butylammonium-caesium-formamidinium lead halide perovskites. Nat. Energy 2, 17135 (2017).
24. J. F. Lu, L. C. Jiang, W. Li, F. Li, N. K. Pai, A. D. Scully, C. M. Tsai, U. Bach, A.
25 N. Simonov, Y. B. Cheng, L. Spiccia, Diammonium and monoammonium mixed-organic-cation perovskites for high performance solar cells with improved stability. Adv. Energy Mater. 7, 1700444 (2017).
25. L. Zuo, H. Guo, D. W. deQuilettes, S. Jariwala, N. De Marco, S. Dong, R. DeBlock, D. S. Ginger, B. Dunn, M. Wang, Y. Yang, Polymer-modified halide perovskite films for efficient and stable planar heterojunction solar cells. Sci. Adv. 3, e1700106 (2017).
26. Y. Zong, Y. Zhou, Y. Zhang, Z. Li, L. Zhang, M.-G. Ju, M. Chen, S. Pang, X. C. Zeng, N. P. Padture, Continuous grain-boundary functionalization for high-efficiency perovskite solar cells with exceptional stability. Chem 4, 1404-1415 (2018).
27. D. Bi, C. Yi, J. Luo, J.-D. Decoppet, F. Zhang, Shaik M. Zakeeruddin, X. Li, A. Hagfeldt, M. Gratzel, Polymer-templated nucleation and crystal growth of perovskite films for solar cells with efficiency greater than 21%. Nat. Energy 1, 16142 (2016).
28. J. Y. Seo, T. Matsui, J. S. Luo, J. P. Correa-Baena, F. Giordano, M. Saliba, K. Schenk, A. Ummadisingu, K. Domanski, M. Hadadian, A. Hagfeldt, S. M. Zakeeruddin, U. Steiner, M. Gratzel, A. Abate, Ionic liquid control crystal growth to enhance planar perovskite solar cells efficiency. Adv. Energy Mater. 6, 1600767 (2016).
29. T. Suksrichavalit, S. Prachayasittikul, C. Nantasenamat, C. Isarankura-Na-Ayudhya, V. Prachayasittikul, Copper complexes of pyridine derivatives with superoxide scavenging and antimicrobial activities. Eur. J. Med. Chem. 44, 3259-3265 (2009).
30. N. Curtis, Macrocyclic coordination compounds formed by condensation of metal-amine complexes with aliphatic carbonyl compounds. Coord. Chem. Rev. 3, 3-47 (1968).
31. T. Baikie, Y. Fang, J. M. Kadro, M. Schreyer, F. Wei, S. G. Mhaisalkar, M. Graetzel, T. J. White, Synthesis and crystal chemistry of the hybrid perovskite (CH3NH3) PbI3 for solid-state sensitised solar cell applications. J. Mater. Chem. A 1, 5628-5641 (2013).
32. L. N. Quan, M. Yuan, R. Comin, O. Voznyy, E. M. Beauregard, S. Hoogland, A. Buin, A. R. Kirmani, K. Zhao, A. Amassian, D. H. Kim, E. H. Sargent, Ligand-stabilized reduced-dimensionality perovskites. J. Am. Chem. Soc. 138, 2649-2655 (2016).
33. Y. Yuan, T. Li, Q. Wang, J. Xing, A. Gruverman, J. Huang, Anomalous photovoltaic effect in organic-inorganic hybrid perovskite solar cells, Sci. Adv. 3, e1602164 (2017).
34. M. U. Rothmann, W. Li, Y. Zhu, A. Liu, Z. Ku, U. Bach, J. Etheridge, Y. B. Cheng, Structural and chemical changes to $CH_3NH_3PbI_3$ induced by electron and gallium ion beams. Adv. Mater. 1800629 (2018).
35. Q. Wang, Q. F. Dong, T. Li, A. Gruverman, J. S. Huang, Thin insulating tunneling contacts for efficient and water-resistant perovskite solar cells. Adv. Mater. 28, 6734-6739 (2016).
36. Y. Shao, Z. Xiao, C. Bi, Y. Yuan, J. Huang, Origin and elimination of photocurrent hysteresis by fullerene passivation in CH3NH3PbI3 planar heterojunction solar cells. Nat. Commun. 5, 5784 (2014).
37. M. Bernechea, N. C. Miller, G. Xercavins, D. So, A. Stavrinadis, G. Konstantatos, Solution-processed solar cells based on environmentally friendly AgBiS2 nanocrystals, Nat. Photonics 10, 521 (2016).
38. T. Singh, T. Miyasaka, Stabilizing the efficiency beyond 20% with a mixed cation perovskite solar cell fabricated in ambient air under controlled humidity. Adv. Energy Mater. 8, 1700677 (2018).
39. C. B. Fei, B. Li, R. Zhang, H. Y. Fu, J. J. Tian, G. Z. Cao, Highly efficient and stable perovskite solar cells based on monolithically grained CH3NH3PbI3 Film. Adv. Energy Mater. 7, 1602017 (2017).
40. M. Stolterfoht, C. M. Wolff, Y. Amir, A. Paulke, L. Perdigon-Toro, P. Caprioglio, D. Neher, Approaching the fill factor Shockley-Queisser limit in stable, dopant-free triple cation perovskite solar cells. Energy Environ. Sci. 10, 1530-1539 (2017).
41. M. Freitag, J. Teuscher, Y. Saygili, X. Zhang, F. Giordano, P. Liska, J. Hua, S. M. Zakeeruddin, J.-E. Moser, M. Gratzel, A. Hagfeldt, Dye-sensitized solar cells for efficient power generation under ambient lighting. Nat. Photonics 11, 372 (2017).
42. Y. Cao, Y. Liu, S. M. Zakeeruddin, A. Hagfeldt, M. Gratzel, Direct contact of selective charge extraction layers enables high-efficiency molecular photovoltaics. Joule 2, 1108-1117 (2018).
43. X. Li, M. Ibrahim Dar, C. Yi, J. Luo, M. Tschumi, S. M. Zakeeruddin, M. K. Nazeeruddin, H. Han, M. Gratzel, Improved performance and stability of perovskite solar cells by crystal crosslinking with alkylphosphonic acid ω-ammonium chlorides. Nat. Chemistry 7, 703 (2015).

Efforts have been made to ensure accuracy with respect to numbers used (e.g., amounts, temperature, etc.) but some experimental errors and deviations should be accounted for.

One skilled in the art will recognize many methods and materials similar or equivalent to those described herein, which could be used in the practicing the subject matter described herein. The present disclosure is in no way limited to just the methods and materials described.

Throughout this specification and the claims, the words "comprise," "comprises," and "comprising" are used in a non-exclusive sense, except where the context requires otherwise. It is understood that embodiments described herein include "consisting of" and/or "consisting essentially of" embodiments.

Where a range of values is provided, it is understood that each intervening value, to the tenth of the unit of the lower limit, unless the context clearly dictates otherwise, between the upper and lower limit of the range and any other stated or intervening value in that stated range, is encompassed. The upper and lower limits of these small ranges which may independently be included in the smaller rangers is also encompassed, subject to any specifically excluded limit in the stated range. Where the stated range includes one or both of the limits, ranges excluding either or both of those included limits are also included.

Many modifications and other embodiments set forth herein will come to mind to one skilled in the art to which this subject matter pertains having the benefit of the teachings presented in the foregoing descriptions and the associated drawings. Therefore, it is to be understood that the subject matter is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An ink solution, comprising:
   i. a composition of Formula (I)

$$ABX_3 \tag{I}$$

wherein A is a cation selected from the group consisting of methylammonium (MA), tetramethylammonium (TMA), formamidinium (FA), cesium (Cs), rubidium (Rb), potassium (K), sodium (Na), butylammonium (BAH), phenethylammonium (PEA), phenylammonium (PHA), guanidinium (GU), and a combination thereof;
   B is at least one divalent metal; and
   X is at least one halide;
   ii. a compound of Formula (II)

$$NH_2—R_1—NH_2 \tag{II}$$

wherein $R_1$ is selected from the group consisting of linear or branched $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, and graphene, wherein one or more carbon atoms in said $C_3$-$C_{50}$ alkyl or $C_1$-$C_{20}$ alkyl is optionally substituted with O, P, S, or NH;
   wherein said $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, or graphene is optionally substituted with one or more substituents, each independently selected from the group consisting of hydroxy, halo, haloalkoxy, alkoxy, haloalkyl, hydroxyalkyl, oxo, cyano, nitro, thiol, carboxyl, sulfonyl, sulfinyl, thiocyanate, —S(O)OH, —S(O)$_2$OH, sulfonamido, —CH$_2$OP(O)(OH)$_2$, —OP(O)(OH)$_2$, —R$_2$R$_3$P(O)$_4$, and —NR$_4$R$_5$, wherein, R$_2$, R$_3$, R$_4$ and R$_5$ are each independently hydrogen or $C_1$-$C_6$ alkyl; and
   iii. a solvent,
   wherein said compound of Formula II comprises between about 0.001 wt % and about 0.30 wt % of the ink solution.

2. The ink solution of claim 1, wherein said solvent is selected from the group consisting of dimethyl sulfoxide, dimethylformamide, dichloromethane, tetrahydrofuran, γ-butyrolactone, 2-methoxyethanol, and acetonitrile.

3. The ink solution of claim 1, wherein said at least one divalent metal is selected from the group consisting of lead, tin, cadmium, germanium, zinc, nickel, platinum, palladium, mercury, titanium, silicon, and a combination thereof.

4. The ink solution of claim 1, wherein said at least one divalent metal is lead; said at least one halide is selected from the group consisting of I, Br, and a combination thereof; and A is selected from the group consisting of methylammonium, formamidinium, cesium, and a combination thereof.

5. The ink solution of claim 1, wherein the composition of Formula (I) is selected from the group consisting of cesium lead bromide (CsPbBr$_3$), methylammonium lead bromide (MAPbBr$_3$), formamidinium lead bromide (FAPbBr$_3$), methylammonium lead iodide (MAPbI$_3$), cesium formamidinium methylammonium lead iodide (Cs$_{0.05}$FA$_{0.70}$MA$_{0.25}$PbI$_3$), cesium formamidinium lead iodide bromide (Cs$_{0.2}$FA$_{0.8}$Pb(I$_{0.6}$Br$_{0.4}$)$_3$), and cesium methylammonium lead iodide bromide (Cs$_{0.1}$MA$_{0.9}$Pb(I$_{0.9}$Br$_{0.1}$)$_3$).

6. The ink solution of claim 1, wherein R$_1$ is linear $C_3$-$C_{20}$ alkyl, wherein one or more carbon atoms in said $C_3$-$C_{20}$ alkyl is optionally substituted with O.

7. The ink solution of claim 6, wherein $R_1$ is a linear alkyl selected from the group consisting of propyl, butyl, pentyl, hexyl, heptyl, octyl, nonyl, decyl, and undecanyl, wherein one or more carbon atoms in said alkyl is optionally substituted with O.

8. The ink solution of claim 1, wherein said compound of Formula II is selected from the group consisting of

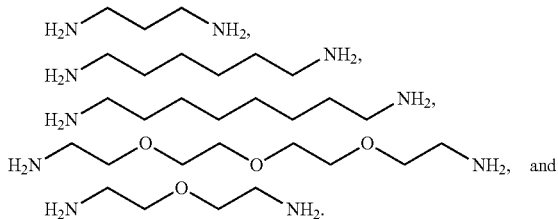

9. The ink solution of claim 1, wherein said compound of Formula II comprises about 0.025 wt % of the ink solution.

10. The ink solution of claim 1, wherein said composition of Formula I is MAPbI$_3$, said compound of Formula II is

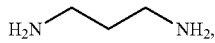

said solvent is dimethylformamide, and said compound of Formula II comprises about 0.025 wt % of said ink solution.

11. A method for producing a polycrystalline perovskite film using the ink solution of claim 1, said method comprising:
   contacting said ink solution of claim 1 using a fast coating process onto a substrate to form a film, wherein said fast coating process is selected from the group consisting of blade coating, slot die coating, shear coating, gravure coating, brush coating, syringe coating, and screen printing.

12. A polycrystalline perovskite film comprising:
   i. a composition of Formula (I)

$$ABX_3 \quad (I)$$

wherein A is a cation selected from the group consisting of methylammonium (MA), tetramethylammonium (TMA), formamidinium (FA), cesium (Cs), rubidium (Rb), potassium (K), sodium (Na), butylammonium (BAH), phenethylammonium (PEA), phenylammonium (PHA), guanidinium (GU), and a combination thereof,
   B is at least one divalent metal; and
   X is at least one halide; and
   ii. a compound of Formula (II)

$$NH_2-R_1-NH_2 \quad (II)$$

wherein $R_1$ is selected from the group consisting of linear or branched $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, and graphene, wherein one or more carbon atoms in said $C_3$-$C_{50}$ alkyl or $C_1$-$C_{20}$ alkyl is optionally substituted with O, P, S, or NH; wherein said $C_3$-$C_{50}$ alkyl, $C_6$-$C_{12}$ aryl, $C_1$-$C_{20}$ alkyl-$C_6$-$C_{12}$ aryl-$C_1$-$C_{20}$ alkyl, $C_6$-$C_{12}$ aryl-$C_1$-$C_{10}$ alkyl-$C_6$-$C_{12}$ aryl, or graphene is optionally substituted with one or more substituents, each independently selected from the group consisting of hydroxy, halo, haloalkoxy, alkoxy, haloalkyl, hydroxyalkyl, oxo, cyano, nitro, thiol, carboxyl, sulfonyl, sulfinyl, thiocyanate, —S(O)OH, —S(O)$_2$OH, sulfonamido, —CH$_2$OP(O)(OH)$_2$, —OP(O)(OH)$_2$, —R$_2$R$_3$P(O)$_4$, and —NR$_4$R$_5$, wherein $R_2$, $R_3$, $R_4$ and $R_5$ are each independently hydrogen or $C_1$-$C_6$ alkyl;
   wherein said compound of Formula II comprises between about 0.01 wt % and about 5 wt % of said film.

13. The polycrystalline perovskite film of claim 12, wherein said at least one divalent metal is selected from the group consisting of lead, tin, cadmium, germanium, zinc, nickel, platinum, palladium, mercury, titanium, silicon, and a combination thereof.

14. The polycrystalline perovskite film of claim 12, wherein: said at least one divalent metal is lead; and said at least one halide is selected from the group consisting of I, Br, and a combination thereof.

15. The polycrystalline perovskite film of claim 12, wherein said composition of Formula I is selected from the group consisting of cesium lead iodide (CsPbI$_3$), methylammonium lead iodide (MAPbI$_3$), cesium lead bromide (CsPbBr$_3$), methylammonium lead bromide (MAPbBr$_3$), formamidinium lead bromide (FAPbBr$_3$), cesium formamidinium methylammonium lead iodide (Cs$_{0.05}$FA$_{0.70}$MA$_{0.25}$PbI$_3$), cesium formamidinium lead iodide bromide (Cs$_{0.2}$FA$_{0.8}$Pb(I$_{0.6}$Br$_{0.4}$)$_3$), cesium methylammonium lead iodide bromide (Cs$_{0.1}$MA$_{0.9}$Pb(I$_{0.9}$Br$_{0.1}$)$_3$), and formamidinium lead iodide FAPbI$_3$.

16. The polycrystalline perovskite film of claim 12, wherein $R_1$ is a linear alkyl selected from the group consisting of propyl, butyl, pentyl, hexyl, heptyl, octyl, nonyl, decyl, and undecanyl, wherein one or more carbon atoms in said alkyl is optionally substituted with O.

17. The polycrystalline perovskite film of claim 12, wherein said compound of Formula II is selected from the group consisting of

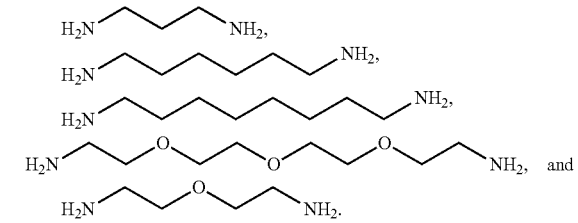

18. The polycrystalline perovskite film of claim 12, wherein said composition of Formula I is selected from the group consisting of MAPbI$_3$, Cs$_{0.05}$FA$_{0.70}$MA$_{0.25}$PbI$_3$, Cs$_{0.2}$FA$_{0.8}$Pb(I$_{0.6}$Br$_{0.4}$)$_3$, and Cs$_{0.1}$MA$_{0.9}$Pb(I$_{0.9}$Br$_{0.1}$)$_3$, and said compound of Formula II selected from the group consisting of

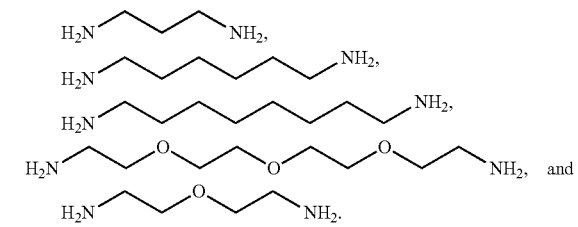

19. The polycrystalline perovskite film of claim 12, wherein said compound of Formula II comprises between about 0.1 wt % and about 0.9 wt % of said film.

20. The polycrystalline perovskite film of claim 12, wherein said film is smooth is:
    smooth;
    uniform and compact; or,
    pinhole-free.

21. The polycrystalline perovskite film of claim 12, wherein said film is moisture-resistant.

22. The polycrystalline perovskite film of claim 12, wherein said film is stable.

23. A solar cell, solar panel, light emitting diode, photodetector, x-ray detector, field effect transistor, memristor, or synapse comprising the polycrystalline perovskite film of claim 12.

24. A solar cell, comprising:
    a conductive substrate;
    a first transport layer disposed on said conductive substrate;
    the polycrystalline perovskite film of claim 12 disposed on said first transport layer;
    a second transport layer disposed on said film; and
    a conductive electrode disposed on said second transport layer.

25. The solar cell of claim 24, wherein said solar cell exhibits a Power Conversion Efficiency (PCE) of at least 20%.

26. The solar cell of claim 24, wherein said solar cell exhibits an extended recombination lifetime.

27. The solar cell of claim 24, wherein said solar cell is thermally stable.

* * * * *

UNITED STATES PATENT AND TRADEMARK OFFICE
CERTIFICATE OF CORRECTION

PATENT NO. : 11,920,042 B2
APPLICATION NO. : 17/422842
DATED : March 5, 2024
INVENTOR(S) : Jinsong Huang et al.

It is certified that error appears in the above-identified patent and that said Letters Patent is hereby corrected as shown below:

In the Claims

In Column 47, Line 50, Claim 12, delete "thereof," and insert -- thereof; --, therefor.

In Column 49, Line 5, Claim 20, delete "film is smooth is:" and insert -- film is: --, therefor.

Signed and Sealed this
Fifteenth Day of October, 2024

Katherine Kelly Vidal
*Director of the United States Patent and Trademark Office*